US012796015B2

(12) United States Patent
Weber

(10) Patent No.: US 12,796,015 B2
(45) Date of Patent: Nov. 10, 2026

(54) SEMICONDUCTOR DEVICE AND METHOD FOR PRODUCING THEREOF

(71) Applicant: Infineon Technologies Austria AG, Villach (AT)

(72) Inventor: Hans Weber, Villach (AT)

(73) Assignee: Infineon Technologies Austria AG, Villach (AT)

( * ) Notice: Subject to any disclaimer, the term of this patent is extended or adjusted under 35 U.S.C. 154(b) by 895 days.

(21) Appl. No.: 18/100,176

(22) Filed: Jan. 23, 2023

(65) Prior Publication Data

US 2023/0238427 A1 Jul. 27, 2023

(30) Foreign Application Priority Data

Jan. 26, 2022 (EP) .................................... 22153545

(51) Int. Cl.

| | |
|---|---|
| ***H01L 29/06*** | (2006.01) |
| ***H10D 12/01*** | (2025.01) |
| ***H10D 30/01*** | (2025.01) |
| ***H10D 30/66*** | (2025.01) |
| ***H10D 62/10*** | (2025.01) |

(Continued)

(52) U.S. Cl.

CPC ......... *H10D 62/111* (2025.01); *H10D 12/031* (2025.01); *H10D 30/0297* (2025.01); *H10D 30/668* (2025.01); *H10D 62/8325* (2025.01); *H10P 30/22* (2026.01)

(58) Field of Classification Search

CPC ............... H10D 62/111; H10D 12/031; H10D 30/0297; H10D 30/668; H10D 62/8325; H10D 30/665; H10D 30/831; H10D 62/157; H10D 62/126; H10D 62/393; H10D 64/256; H10D 64/513; H10D 62/112; H10D 62/127; H10D 62/343; H10D 84/0151; H10D 84/038; H10P 30/22; H10P 50/00; H10P 30/2042; H10P 30/222; H10W 10/021; H10W 10/20

See application file for complete search history.

(56) References Cited

U.S. PATENT DOCUMENTS

2003/0132450 A1 7/2003 Minato et al.
2016/0163789 A1 * 6/2016 Hsieh .................. H10D 62/111 257/330

(Continued)

*Primary Examiner* — Cuong B Nguyen
(74) *Attorney, Agent, or Firm* — Murphy, Bilak & Homiller, PLLC

(57) ABSTRACT

A method for forming a semiconductor device includes: forming a trench structure with trenches in an inner region and an edge region of a SiC semiconductor body such that the trench structure extends from a first surface of the semiconductor body through a second semiconductor layer into a first semiconductor layer and such that the trench structure, in the second semiconductor layer, forms mesa regions; and forming at least one transistor cell at least partially in each of the mesa regions in the inner region. Forming each transistor cell includes forming at least one compensation region. Forming the compensation region includes implanting dopant atoms of a second doping type via sidewalls of the trenches into the mesa regions in the inner region. Forming the compensation region in each mesa region in the inner region includes at least partially covering the edge region with an implantation mask.

20 Claims, 34 Drawing Sheets

(51) Int. Cl.

| | |
|---|---|
| ***H10D 62/832*** | (2025.01) |
| ***H10P 30/22*** | (2026.01) |

(56) References Cited

U.S. PATENT DOCUMENTS

| | | | | |
|---|---|---|---|---|
| 2020/0176559 | A1 | 6/2020 | Weber | |
| 2020/0194547 | A1 | 6/2020 | Weber et al. | |
| 2021/0111245 | A1 | 4/2021 | Kosugi et al. | |
| 2022/0254919 | A1* | 8/2022 | Matsunaga .......... | H10D 12/031 |

* cited by examiner

SEMICONDUCTOR DEVICE AND METHOD FOR PRODUCING THEREOF

TECHNICAL FIELD

This disclosure relates in general to a semiconductor device, in particular a semiconductor device that is based on a silicon carbide (SiC) semiconductor body.

BACKGROUND

Because of offering low switching losses at high voltage blocking capabilities semiconductor devices, such as transistor devices, made of Silicon Carbide (SiC) are becoming more and more popular in power electronics applications, such as power conversion and drive applications.

A SiC semiconductor body, however, is prone to bipolar degradation. Bipolar degradation may occur when a recombination of electrons and holes takes place at crystal defects in the semiconductor body of the device. Crystal defects may include basal plane dislocations or stacking faults, for example. The energy associated with the recombination of electrons and holes may cause the crystal defects to further expand in the semiconductor body, so that a large defect region may occur. A large defect region, however, may degrade the device properties, such as increase the on-resistance and increase the leakage current in the transistor device.

Major polytypes of SiC are 4H-SiC, 6H-SiC, and 3C-SiC, wherein SiC of the 4H or 6H polytype is mainly used in the production of semiconductor devices. SiC of the 4H or 6H polytype is thermodynamically metastable. Crystal defects that may occur based on the recombination of electrons and holes include, for example, a local transformation of 4H-SiC or 6H-SiC into 3C-SiC.

SUMMARY

There is therefore a need to prevent, or at least reduce bipolar degradation in a SiC based transistor device. Furthermore, there is a need to provide a SiC based transistor device with a high Avalanche robustness.

One example relates to a method. The method includes forming a trench structure with a plurality of trenches in an inner region and an edge region of a SiC semiconductor body such that the trench structure extends from a first surface of the semiconductor body through a second semiconductor layer into a first semiconductor layer and such that the trench structure, in the second semiconductor layer, forms a plurality of mesa regions. The method further includes forming at least one transistor cell at least partially in each of the mesa regions in the inner region, wherein forming each transistor cell includes forming at least one compensation region, wherein forming the at least one compensation region includes implanting dopant atoms of a second doping type via sidewalls of the trenches into the mesa regions in the inner region, and wherein forming the at least one compensation region in each of the mesa regions in the inner region includes at least partially covering the edge region with an implantation mask.

Another example relates to a semiconductor device. The semiconductor device includes a SiC semiconductor body having a first semiconductor layer, a second semiconductor layer formed on top of the first semiconductor layer, an inner region, and an edge region surrounding the inner region. The semiconductor device further includes a trench structure extending from a first surface of the semiconductor body through the second semiconductor layer into the first semiconductor layer, being arranged in the inner region and the edge region, and forming, in the second semiconductor layer, a plurality of mesa regions. In the mesa regions, the semiconductor device includes a plurality of drift regions having an effective doping concentration of a first doping type and a plurality of compensation regions having an effective doping concentration of a second doping type complementary to the first doping type. An area specific dopant dose of first type dopant atoms in sections of the drift and compensation regions located in the edge region is lower than an area specific dopant dose of first type dopant atoms in sections of the drift and compensation regions located in the inner region, and an area specific dopant dose of second type dopant atoms in sections of the drift and compensation regions located in the edge region is lower than an area specific dopant dose of second type dopant atoms in sections of the drift and compensation regions located in the inner region.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
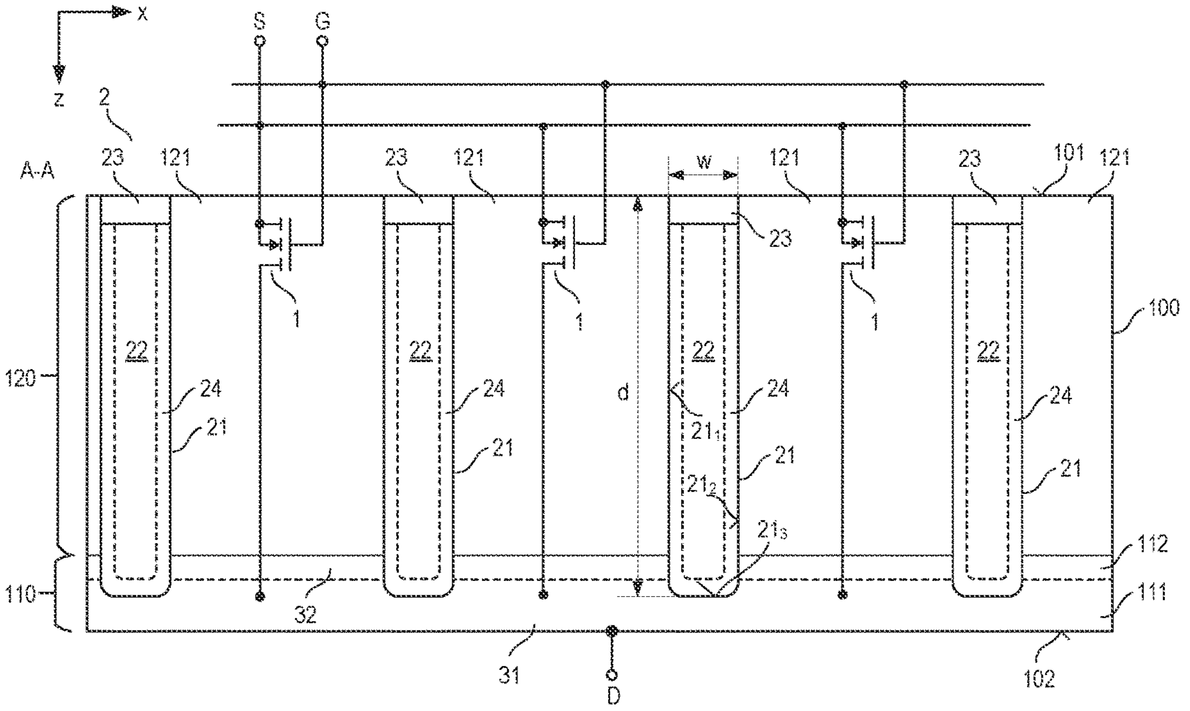
FIG. 1 schematically illustrates a vertical cross sectional view of one example of a semiconductor device that includes a trench structure extending through a second semiconductor layer into a first a semiconductor layer and a plurality of transistor cells integrated in the first semiconductor layer.

FIG. 1 schematically illustrates one example of a semiconductor device, in particular, a transistor device. The transistor device includes a SiC semiconductor body 100. According to one example, the semiconductor body 100 is a 4H-SiC or 6H-SiC semiconductor body 100. The semiconductor body 100 includes a first semiconductor layer 110 and a second semiconductor layer 120 formed on top of the first semiconductor layer 110. The semiconductor body 100 includes a first surface 101 formed by the second semiconductor layer 120 and a second surface 102 formed by the first semiconductor layer 110. FIG. 1 shows a cross sectional view of the semiconductor body 100 in a section plane perpendicular to the first and second surfaces 101, 102. This section plane is also referred to as vertical section plane in the following.

The semiconductor device further includes a trench structure 2 that extends from the first surface 101 of the semiconductor body 100 through the second semiconductor layer 120 into the first semiconductor layer 110 and subdivides the second semiconductor layer 120 into a plurality of mesa regions 121 or forms a plurality of mesa regions 121. The trench structure 2 "subdividing the second semiconductor layer 120 into the plurality of mesa regions 121" includes that the trench structure 2 is arranged between neighboring ones of the plurality of mesa regions 121. The trench structure 2 not necessarily entirely separates the mesa regions 121 from one another. This is explained herein further below.

Referring to FIG. 1, the transistor device further includes a drain region 31 arranged in the first semiconductor 110, and a plurality of transistor cells 1. Each of the transistor cells 1 is coupled between the drain region 31 and a source node S of the transistor device, wherein the source node S is only schematically illustrated in FIG. 1. At least one of the plurality of transistor cells 1 is at least partially integrated in each of the mesa regions 121. That is, one or more transistor cells 1 may be integrated at least partially in each of the mesa regions 121. In FIG. 1, the one or more transistor cells that are at least partially integrated in each mesa region 121 are represented by the circuit symbol of a transistor. The circuit symbols illustrated in FIG. 1 each represent an n-type enhancement MOSFET. This, however, is only an example and is only for the purpose of illustration. Basically, transistor cells of any type of transistor device may be (at least partially) integrated in the mesa regions 121.

According to one example, the first semiconductor layer 110, in addition to the drain region 31 includes a buffer region 32, wherein the buffer region 32 is arranged between the drain region 31 and the second semiconductor layer 120. According to one example, the drain region 31 is formed by a semiconductor substrate 111 and the buffer region 32 is formed by an epitaxial layer 112 grown on top of the substrate 111. According to one example, a doping concentration of the substrate 111 and, therefore, the drain region 31 is between 1E18 $cm^{-3}$ and 1E20 $cm^{-3}$. According to one example, the doping concentration of the buffer region 32 is lower than the doping concentration of the drain region 31. According to one example, the doping concentration of the buffer region 32 is between 1E18 $cm^{-3}$ and 8E18 $cm^{-3}$.

According to one example, the second semiconductor layer 120 is an epitaxial layer that is either grown on the substrate 111 (when the buffer region 32 is omitted) or is grown on the epitaxial layer 112 forming the buffer region 32. According to one example, the second semiconductor layer 120 has a basic doping that is formed during the epitaxial growth process. According to one example, a basic doping concentration of the second semiconductor layer 120 is lower than the doping concentration of the drain region 31 and the optional buffer region 32. According to one example, the basic doping concentration is selected from between 1E15 $cm^{-3}$ and 8E17 $cm^{-3}$.

The semiconductor body 100 has a vertical direction z, which is a direction in which the first surface 101 and the second surface 102 are spaced apart from each other. According to one example, a thickness of the second semiconductor layer 120, which is the dimension of the second semiconductor layer 120 in the vertical direction z, is between 3 micrometers and 60 micrometers. Referring to the above, the trench structure 2 extends through the second semiconductor layer into the first semiconductor layer 110. According to one example, a vertical dimension of a section of the trench structure that is arranged in the first semiconductor layer 110 is between 500 nanometers and 8 micrometers. "The vertical dimension of the trench structure in the first semiconductor layer 110" is given by a distance between a lower end of the trench structure 2 and an interface between the first semiconductor layer 110 and the second semiconductor layer 120. The "lower end of the trench structure 2" is an end of the trench structure that faces the second surface 102.

The trench structure 2 includes several trenches 21. Each of these trenches 21 is arranged between two neighboring mesa regions 121, and each of the mesa regions 121 is defined by at least two of the trenches 21. Each trench 21 has a depth d, a width w, and a length 1. The depth d is the dimension of the respective trench 21 in the vertical direction z. The width w and the length are dimensions of the respective trench 21 in lateral directions, wherein the width w is smaller than the length. According to one example, the length is at least 10 times, at least 100 times, or at least 1000 times the width w. Furthermore, the width w is the distance between opposite trench sidewalls $21_1$, $21_2$ of each trench 21. In the example shown in FIG. 21, the trenches 21 are drawn to have vertical sidewalls, so that the distance between the sidewalls $21_1$, $21_2$ is essentially the same at each vertical position of trench 21. This, however, is only an example. According to another example, the trenches 21 have beveled sidewalls such that the distance between the sidewalls $21_1$, $21_2$ either decreases or increases towards a trench bottom $21_3$, wherein the trench bottom terminates the respective trench in the vertical direction z. In the following, the width w of the trenches 21 denotes the average distance between the first and second sidewalls $21_1$, $21_2$.

According to one example, the trenches are formed such that an aspect ratio, which is a ratio between the depth d and the width w is selected from between 25:1 and 5:1, in particular between 10:1 and 5:1. According to one example, the trenches are formed such that the width w is between 500 nanometers and 3 micrometers.

In the example shown in FIG. 1, the width of the trenches 21 shown in in this figure is the dimension of the trenches 21 in a first lateral direction x of the semiconductor body 100. The length of each trench 21 is the dimension in a second lateral direction y perpendicular to the first lateral direction x.

According to one example, each of the trenches 21 is closed by a plug 23, so that a cavity 22 is formed in each of the trenches 21 between the respective bottom $21_3$ and the plug 23. According to one example, the plug 23 includes an electrically insulating material, such as a dielectric. According to one example, the plug 23 includes an oxide and/or a nitride. Examples of the oxide include silicon oxide or hafnium oxide. The nitride is silicon nitride, for example.

Referring to FIG. 1, optionally, a dielectric layer 24 (illustrated in dashed lines in FIG. 1) is arranged between the cavity 22 and the semiconductor body 100. According to one example, the dielectric layer includes the same type of material as at least parts of the plug 23. Details on the plug 23 are explained herein further below.

In the transistor device according to FIG. 1 the trench structure 2, which subdivides the second semiconductor layer 120 into a plurality of mesa regions 121 helps to reduce bipolar degradation. Bipolar degradation is associated with a propagation of crystal defects, such as basal plane dislocations or stacking faults, in the crystal of the semiconductor body 100. The trench structure 2 reduces the expansion of such crystal defects as it prevents crystal defects that are generated in one of the mesa regions 121 to propagate into other ones of the mesa regions 121.

According to one example, the trenches 21 are vacuum trenches. That is, a pressure in the cavity 22 is significantly lower than atmospheric pressure. Atmospheric pressure is about 1 bar (≈1013 hPa). According to one example, the pressure in the cavity 22 is less than 1%, less than 0.1%, or even less than 0.01% of atmospheric pressure. Vacuum trenches in accordance with Paschen's law offer a high voltage blocking capability. That is, a vacuum trench may withstand high voltages between different locations along the trench.

Figure 2:
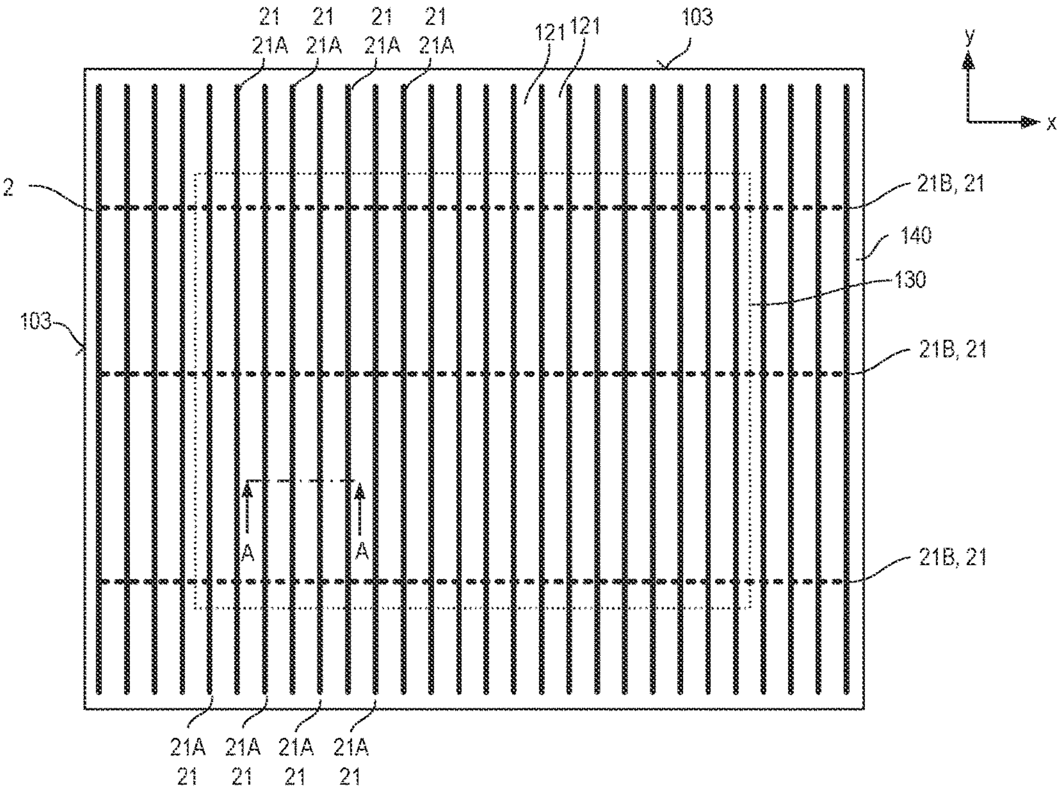
FIG. 2 illustrates a top of the semiconductor device according to one example.

In the horizontal plane of the semiconductor body 100, which is a plane that includes the first and second lateral directions x, y and is parallel to the first and second surfaces 101, 102, the trench structure may be implemented as illustrated in FIG. 2 which shows a top view of the semiconductor body 100. For the ease of illustration, only the trench structure 2 is shown in FIG. 2, wherein trenches of the trench structure 2 are represented by bold lines.

Referring to FIG. 2, the trench structure 2 includes a plurality of trenches 21 that are essentially parallel. The trenches 21 are spaced apart from each other in the first lateral direction x; longitudinal directions of the trenches correspond to the second lateral direction y. According to one example, the trenches 21 are formed such that a (shortest) distance between neighboring trenches is between 1 micrometer and 50 micrometers, in particular between 1 micrometer and 30 micrometers. Trenches 21 that are spaced apart from each other in the first lateral direction x are also referred to as first trenches 23A in the following.

Referring to FIG. 2, the semiconductor body 100 includes an inner region 130, which is a region in which the transistor cells 1 are integrated. In addition to the inner region 130, the semiconductor body 100 includes an edge region 140, wherein the edge region 140 is arranged between the inner region 130 and an edge surface 103 of the semiconductor body 100. The edge surface 103 terminates the semiconductor body 100 in the first and second lateral directions y, x, and the edge region 140 surrounds the inner region 130 in the horizontal plane.

Figure 3:
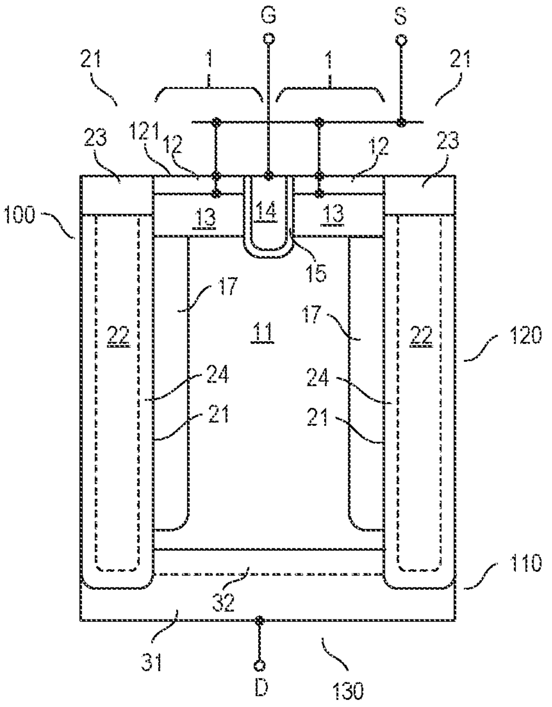
FIGS. 3-6, 7A-7C, 8A-8D, 9A-9C, 10-13, 14A-14C and 15 illustrate different examples of superjunction transistor cells.

Referring to FIG. 3, the parallel first trenches 23A may extend entirely across the inner region 130 and into the edge region 140. The trenches 21 may terminate spaced apart from the edge surface 103, so that longitudinal ends of the trenches 21 are spaced apart from the edge surface. In this example, the trench structure 2 with the trenches 21 does not entirely separate the mesa regions 121 from one another.

Optionally, the trench structure may additionally include several trenches 23B (illustrated in dashed lines) that longitudinally extend in the first lateral direction x. These trenches, which are referred to as second trenches 23B in the following, cross the first trenches 23A, so that at least some mesa regions 121 are formed that are entirely surrounded by trench sections, sections of two parallel first trenches and sections of two parallel second trenches. Providing the second trenches 23B results in smaller mesa regions, as compared to a scenario in which the trench structure 2 only includes first trenches 21. Smaller mesa regions help to further reduce the risk of bipolar degradation. According to one example, a (shortest) distance between neighboring second trenches is significantly larger than a (shortest) distance between neighboring first trenches. According to one example the distance between neighboring second trenches 23B is at least 10 times the distance between neighboring first trenches 23A.

According to one example, the trench structure 2 mainly includes first trenches 23A. "Mainly", as used herein, includes that (a) the trench structure 2 only includes first trenches 23A; or (b) includes second trenches 23B in addition to the first trenches 23A, wherein the number of second trenches 23B is significantly less than the number of first trenches 23A. The number of second trenches 23B is less than 10% of the number of first trenches 23A, for example.

In the following, unless explicitly stated otherwise, trenches 21 of the trench structure are first trenches 23A, that is parallel trenches that are spaced apart in the first lateral direction x and longitudinally extend in the second lateral direction y.

In the example shown in FIG. 2, the optional second trenches 23B are perpendicular to the first trenches 23A.

This, however, is only an example. According to another example, angles between the first and second trenches 23A, 23B are between 45° and 90°.

Different examples of the at least one transistor cell integrated in each mesa region 121 in the inner region 130 of the semiconductor body are explained below with reference to FIGS. 3-6, 7A-7C, 8A-8D, 9A-9C, 10-13, 14A-14C, and 15.

Specifics of the edge region surrounding the inner region 130 are explained herein further below.

Each of FIGS. 3-6, 7A-7B, 8A-8B, 9A-9B, 10-13, and 14B-14C illustrates a vertical cross sectional view of a section of the semiconductor body 100 in the inner region 130, wherein the illustrated section includes one mesa region 121, a section of the first semiconductor layer 110 with the drain region 31 below the mesa region 121, and two trenches adjoining the mesa region 121 in the first lateral direction x. FIGS. 7C, 8C-8D, 9C, 14A, and 15 show horizontal cross sectional views of a respective section of the semiconductor body.

Throughout the transistor device, the transistor cells 1 may be implemented in the same way. That is, each of the transistor cells 1 may be implemented in accordance with only one of the examples illustrated in FIGS. 3-6, 7A-7C, 8A-8D, 9A-9C, 10-13, 14A-14C, and 15. This, however, is only an example. It is also possible, to implement the transistor device with different transistor cells. That is, the transistor device may include transistor cells that are implemented in accordance with two or more of the examples illustrated in FIGS. 3-6, 7A-7C, 8A-8D, 9A-9C, 10-13, 14A-14C, and 15.

Figure 11:
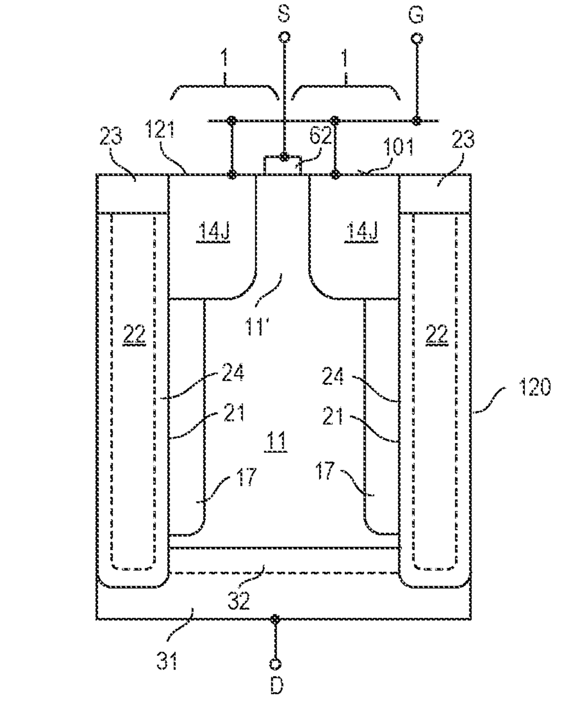
Figure 12:
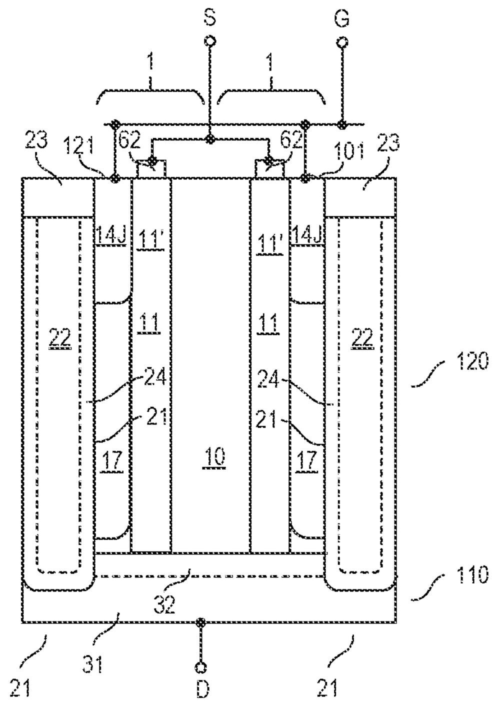
Figure 13:
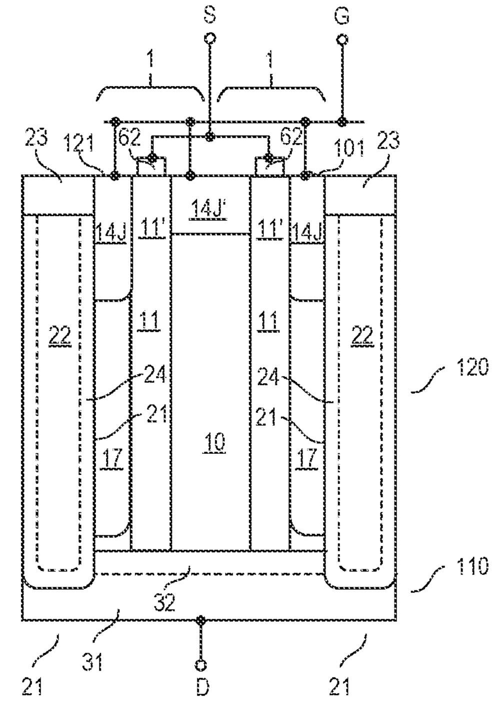

The transistor cells may be implanted as transistor cells with an insulated gate electrode, which are also referred to as MOSFET cells in the following, or as JFET (Junction Field-Effect Transistor) cells. JFET cells are illustrated in FIGS. 11-13. MOSFET cells are illustrated in FIGS. 3-6, 7A-7C, 8A-8D, 9A-9C, 10, 14A-14C, and 15

Basically, a MOSFET cell 1, as illustrated in FIGS. 3-6, 7A-7C, 8A-8D, 9A-9C, 10, 14A-14C, and 15 includes a source region 12, a body region 13 adjoining the source region 12, and a drift region 11. The drift region 11 is arranged between the body region 13 and the drain region 31 and may either adjoin the drain region 31 (when the optional buffer region 32 is omitted), or the buffer region 32. Furthermore, the drift region 11 may adjoin the body region or may be coupled to the body region through a further semiconductor region such as, for example, a current spreading region (see, for example, 19 in FIG. 7A).

Furthermore, a MOSFET cell 1 includes a gate electrode 14 that is arranged adjacent to the body region 13 and is dielectrically insulated from the semiconductor body 100 by a gate dielectric 15. The gate electrode 14 is connected to a gate node G, which is only schematically illustrated in the figures. The gate electrode 14 (in a conventional way) serves to control a conducting channel in the body region 13 between the source region 12 and the drift region 11 along the gate dielectric 15, wherein the channel is controlled by a voltage (gate-source voltage) applied between the gate node G and the source node S when the transistor device is in operation.

JFET cells are different from MOSFET cells by not including gate electrodes 14, gate dielectrics 15, and source and body regions 12, 13. Instead, JFET cells each include a doped gate region 14J, which may also be referred to as JFET region. The doped gate region 14J has a doping type complementary to the doping type of the drift region 11 and adjoins the drift region 11. Thus, a pn-junction is formed between the gate region 14J and the drift region 11. JFET cells are controlled by applying a suitable voltage between the gate region 14J and the drift region 11, wherein the drift region 11 is connected to the source node S.

In each case, the transistor device can be implemented as a superjunction transistor device. In this case, each of the transistor cells 1 further includes at least one compensation region 17 of a doping type complementary to the doping type of the drift region 11. The at least compensation region 17 of each transistor cell adjoins the drift region 11 of the transistor cell and is connected to the source node S.

The transistor cells 1 of the transistor device are connected in parallel. This is achieved by connecting the gate electrodes 14 or gate regions 14J of the plurality of transistor cells 1 to the gate node G and by connecting the source and body regions 12, 13 of the plurality of transistor cells 1 to the source node S. Furthermore, each of the transistor cells has its drift region 11 connected to the drain region 31, wherein the drain region is connected to the drain node D. Connections between the source and body regions 12, 13 and the source node S, and connections between the gate electrodes 14 and the gate node G are only schematically illustrated in FIGS. 3-6, 7A-7C, 8, 8A-8D, 9A-9C, and 11-13. These connections may be implemented in a conventional way using any kind of metallization layers and/or polysilicon layers.

According to one example, the source and body regions 12, 13 are connected to the source node S via trench contacts. Each of these trench contacts includes an electrically conductive material that is located in a trench, wherein the trench extends through the source region 12 into the body region 13, so that the conductive material adjoins both the source region 12 and the body region 13. Furthermore, each of the trench contacts is electrically connected to the source node S.

According to one example, the drift region 11, the source region 12, the drain region 31, and the optional buffer region 32 are doped regions of a first doping type (conductivity type), and the body region 13 and the compensation region 17 are doped regions of a second doping type (conductivity type) complementary to the first doping type. The transistor device can be implemented as an n-type device or as a p-type device. In an n-type device, the first doping type (the doping type of the drain region 31, the optional buffer region 32, the drift region 11, and the source region 12) is an n-type and the second doping (the doping type of the body region 13 and the compensation region 17) is a p-type. In a p-type device, the first doping type is a p-type and the second doping type is an n-type. Aluminum (Al) atoms may be used as p-type dopant atoms, and nitrogen (N) or phosphorous (P) atoms may be used as n-type dopant atoms, for example.

Furthermore, a transistor device that includes MOSFET cells can be implemented as an enhancement device (normally-off device) or as a depletion device (normally-on device). In an enhancement device, the body region 13 adjoins the gate dielectric 15, as illustrated in the respective figures. A depletion device, in addition to the body region 13, includes a channel region of the first doping type (the same doping type as the source region 12 and the drift region 11), wherein the channel region is arranged between the gate dielectric 15 and the body region 13 and extends from the source region 12 to the drift region 11. Such channel region, however, is not illustrated in the figures.

According to one example, the doping concentration of the source region 12 is selected from between 1E18 $cm^{-3}$ and 1E21 $cm^{-3}$; the doping concentration of the body region 13, for an enhancement device, is selected from between 1E17 $cm^{-3}$ and 1E18 $cm^{-3}$ and, for a depletion device, is selected from between 1E10 $cm^{-3}$ and 1E16 $cm^{-3}$; and the doping concentration of the drift region 11 is selected from between 1E15 $cm^{-3}$ and 8E17 $cm^{3}$.

The transistor device can be operated in a forward biased mode or a reverse biased mode. In the forward biased mode, a voltage is applied between the drain node D and the source node S such that a pn junction between the drift region 11 and the body region 13 is reverse biased. An n-type transistor device, for example, is operated in the forward biased mode, when a positive voltage is applied between the drain node D and the source node S. In this operating mode, the transistor device conducts dependent on the gate source voltage, wherein the transistor device conducts when the gate source voltage is such that a conducting channel is generated along the gate dielectric 15 between the source region 12 and the drift region 11. Equivalently, the transistor device blocks, when the voltage applied between the drain node D and the source node S forward biases the transistor device and the conducting channel along the gate dielectric 15 is interrupted.

In the reverse biased mode, a polarity of the voltage between the drain node D and the source node S is such that the pn-junction between the body region 13 and the drift region 11 is forward biased. In this operating mode, the transistor device conducts independent of the gate-source voltage. Furthermore, in the reverse biased mode, the transistor device is in a bipolar mode, which is an operating mode in which electrons and holes occur in the drift region 11. In this operating mode, the body region 13 injects one of electrons and holes into the drift region 11, and the drain region 31 injects the other ones of electrons and holes into the drift region 11.

In the forward biased mode, when the transistor device is in an off-state, that is, when the conducting channel along the gate dielectric 15 is interrupted, a space charge region (depletion region) expands in the drift region 11 beginning at the pn-j unction between the drift region 11 and the body region 13. The higher the voltage that is applied between the drain node D and the source node S, the farther this depletion region expands towards the drain region 31.

According to one example, the trenches 21 shown in FIGS. 3-6, 7A-7B, 8A-8B, 9A-9B, 10-13, and 14B-14C are first trenches and the source regions 12 and body regions 13 are elongated regions that run parallel to the trenches 21. The source and body regions 12, 13 may be interrupted by optional second trenches crossing the first trenches. In the latter case, the source regions 12 (a) may be implemented as elongated regions that extend along the first trenches and are interrupted by the second trenches, or (b) may be implemented as ring-shaped regions (in the horizontal plane) that each have first sections extending along first trenches and second sections extending along second trenches.

In the example shown in FIG. 3, two transistor cells 1 are integrated in one mesa region 121. In this example, the drift regions 11 of the transistor cells 1 are formed by one contiguous semiconductor region. According to one example, the drift region 11 is a semiconductor region having the basic doping concentration of the mesa region 121. Furthermore, in the example shown in FIG. 3, the gate electrodes 14 of the two transistor cells 1 are formed by one electrode, and the gate dielectrics 15 of the two transistor cells 1 are formed by one dielectric layer adjoining the common gate electrode 14. The gate electrode 14 may include a metal or doped polysilicon, for example.

In the example shown in FIG. 3, the gate dielectric 14 is arranged in a trench that extends from the first surface 101 into the semiconductor body. This, however, is only an example. According to another example the gate electrode 14 is implemented as a planar gate electrode that is arranged on top of the first surface 101. In this example, the drift region 11 includes a drift region section that extends to the first surface 101. Transistor cells with a planar gate electrode are commonly known, so that no further explanation is required in this regard.

Referring to the above, in the forward biased mode, when the transistor device is in an off-state, that is, when the conducting channel along the gate dielectric 15 is interrupted, a space charge region (depletion region) expands in the drift region 11 beginning at the pn-j unction between the drift region 11 and the body region 13. The higher the voltage that is applied between the drain node D and the source node S, the farther this depletion region expands towards the drain region 31. The expanding depletion region is associated with an electric field.

Figure 4:
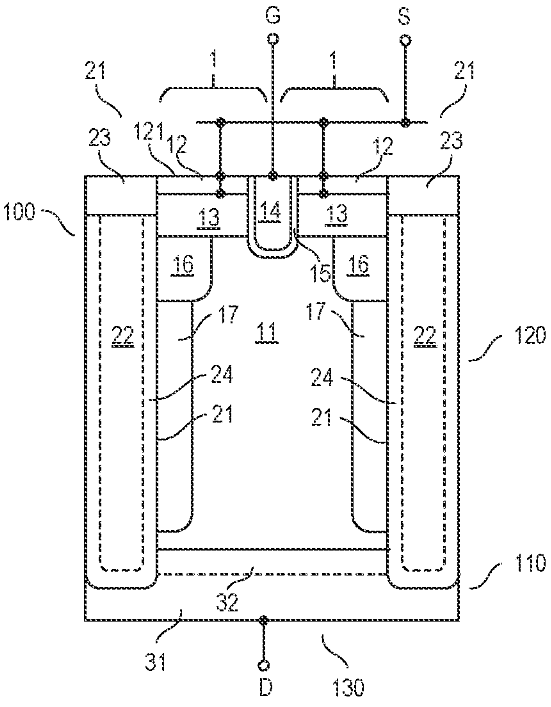

Referring to FIG. 4, in order to protect the gate dielectric 15 against high dielectric fields, the transistor device may include semiconductor regions 16 of a doping type complementary to the doping type of the drift region 11 and connected to the source node S. The doped semiconductor regions 16 are spaced apart from each other in the first lateral direction x and form a JFET (junction field-effect transistor) with a section of the drift region 11 arranged between the two semiconductor regions 16. The semiconductor regions 16 are also referred to as JFET regions in the following.

When the transistor device is forward biased and in the off-state, the depletion region also expands beginning at the pn-junctions between the JFET regions 16 and the drift region 11. A doping concentration of the JFET regions 16 and the distance between the JFET regions 16 in the first lateral direction x are adapted to one another such that the drift region section arranged between the JFET regions 16 is completely depleted when the drain-source voltage reaches a predefined voltage level. The predefined voltage level is lower than a voltage level that may create electric fields that are suitable to damage the gate dielectric 15. In this way, the JFET regions 16 protect the gate dielectric 15 against high electric fields.

FIGS. 3 and 4 show examples in which one gate electrode 14 is arranged in each mesa region 121, so that two transistors cells 1 have a common gate electrode 15. This, however, is only an example. According to another example, two or more gate electrodes 14 may be arranged in each mesa region 121 in order to reduce, in the on-state, the resistance between the source region 12 and the drift region 11.

Figure 5:
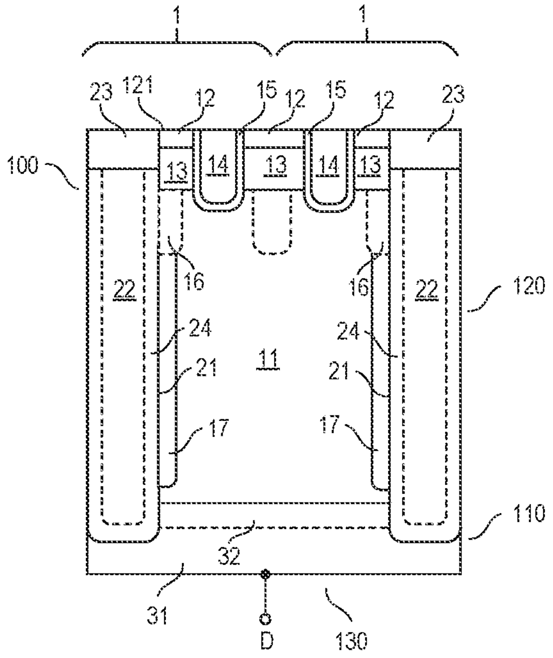

FIG. 5 shows an example in which two trench gate electrodes 14 are arranged in the mesa region 121, wherein the gate electrodes 14 are separated from the semiconductor body 100 by respective gate dielectrics. Each of the gate electrodes 14 extends through the source region 12 and the body region 13 into the drift region 11, so that, in the on-state, a conducting channel can be formed along each sidewall of each gate electrode 14.

Figure 6:
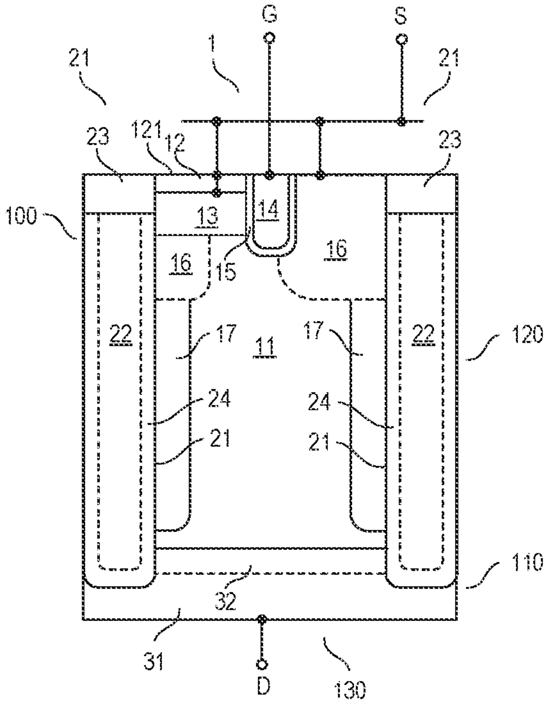

FIG. 6 illustrates a modification of the example shown in FIG. 4. In the example shown in FIG. 6, only one transistor cell is integrated in the mesa region 121. For this, the body region 13 and the source region 12 adjoin only one sidewall of the gate trench. The "gate trench" is the trench in which the gate electrode 14 and the gate dielectric 15 are located. In this example, one of the optional JFET regions 16 may adjoin the gate trench opposite to the side where the source region 12 and the body region 13 are arranged.

In the examples illustrated herein, the gate trenches are drawn to have vertical sidewalls. This, however, is only an example. According to another example (not illustrated) sidewalls of the gate trenches are beveled. In this example, the opposite sidewalls of the gate trench may correspond to different crystal planes of the SiC semiconductor body. In a SiC semiconductor body, there are crystal planes in which charge carriers, such as electrons in an n-type device, have a higher mobility than in other crystal planes. This higher charge carrier mobility may result in a lower channel resistance when the channel region that is formed along the gate dielectric 15 is located in such crystal plane offering a higher charge carrier mobility. Such crystal planes include a-planes or m-planes, for example. According to one example, in an arrangement of the type shown in FIG. 6, an interface between the body region 13 and the gate dielectric 15 is in a crystal plane offering a high carrier mobility, such as an a-plane or m-plane.

Referring to the above, the transistor cells illustrated in the drawings are superjunction transistor cells 1 that each include a compensation region 17. In each of these transistor cells, the compensation region 17 is connected to the source node S. For connecting the compensation regions 17 to the source node S, the compensation regions 17 may adjoin the body regions 13 or the optional JFET regions 16. The JFET regions 16 may adjoin the body regions 13, in order to be connected to the source node S, or may be connected to the source node S in any suitable other way.

The compensation regions 17 extend in the vertical direction z. According to one example, a dimension of the compensation regions 17 in the vertical direction z, is at least 50%, at least 70%, or at least 90% of the thickness of the second semiconductor layer 120. The compensation regions 17 may be implemented such that they are spaced apart from the drain region 31 or the optional buffer region 32 in the vertical direction z, or such that they adjoin the drain region 31 or the optional buffer region 32. Dimensions of the compensation regions 17 in the first lateral direction x are between 100 nanometers and 1 micrometer, in particular from between 100 nanometers and 300 nanometers, for example.

In the example shown in FIG. 6, the superjunction transistor cell 1 includes two compensation regions 17, wherein each of these compensation regions 17 extends along one of the two trenches 21, 22 and is connected to the source node S.

Figure 7A:
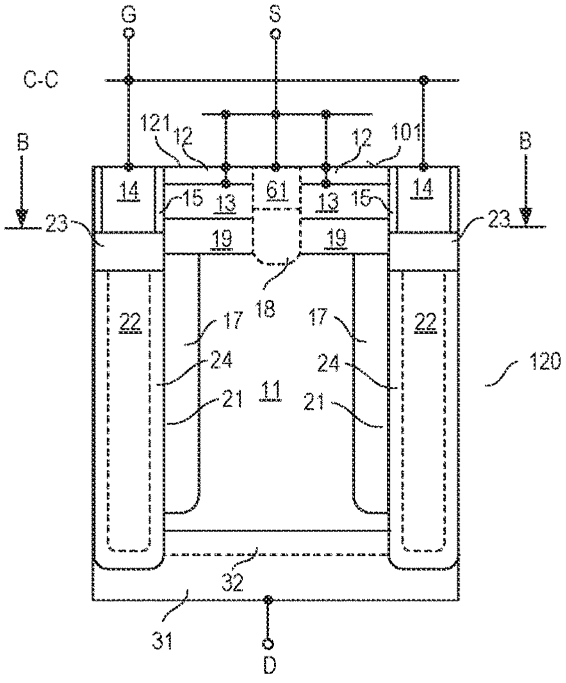
Figure 7B:
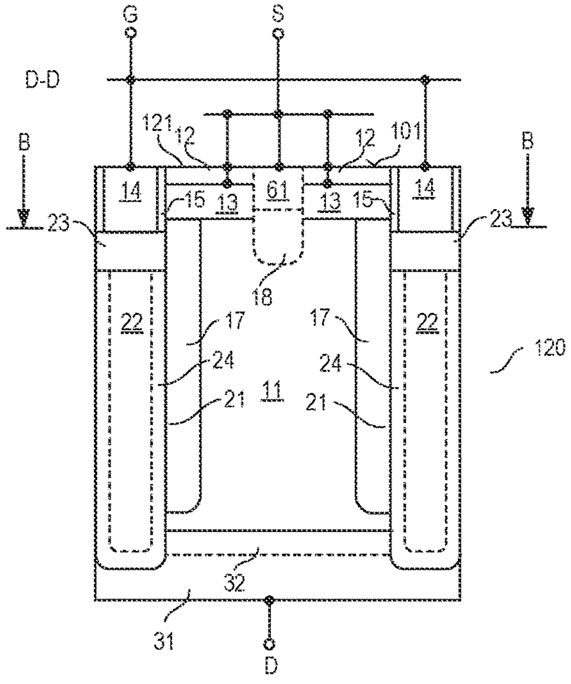
Figure 7C:
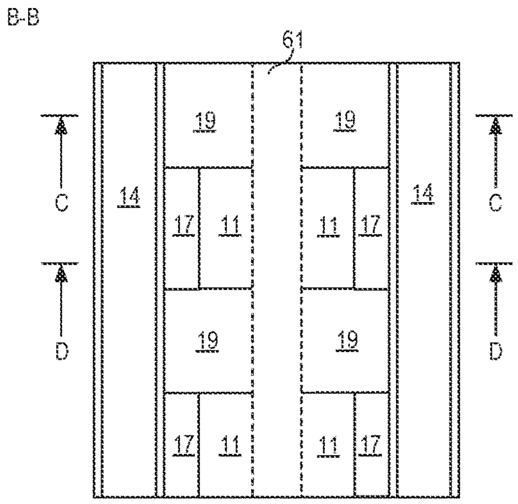

According to another example illustrated in FIGS. 7A-7C, the gate electrodes 14 of the superjunction transistor cells are arranged in the trenches 21 of the trench structure 2. FIGS. 7A and 7B show horizontal cross sectional views in different vertical section planes C-C, D-D, and FIG. 7C shows a horizontal cross sectional view in a horizontal section plane B-B. Referring to FIGS. 7A and 7B, the gate electrodes 14 are arranged above the plug 23 that closes the cavity 22. The source and body regions 12, 13 of the transistor cells 1 are formed in the mesa region 121 one above the other, wherein both the source region 12 and the body region 13 extend, in the first lateral direction x, to the trench 21 that includes the respective gate electrode 14 and gate dielectric 15. In this example, JFET regions that protect the gate dielectric 15 may be omitted, which may help to reduce the on-resistance of the transistor device. The "on-resistance" is the electrical resistance of the transistor device between the drain node D and the source node S in an on-state, that is, when a conducting channel is generated along the gate dielectrics 15 in the body region 13. Providing the JFET regions 16 locally reduces the cross sectional area of the drift region 11 and, therefore, increases the on-resistance. Thus, omitting the JFET regions 16 may help to reduce the on-resistance.

However, omitting JFET regions in the device according to FIGS. 7A-7C is only an example. It is also possible to provide JFET regions that are laterally spaced apart from the gate dielectric 14 and connected to the source node S. According to one example, each JFET region (not shown in FIGS. 7A-7C) adjoins a respective body region 13.

In the example shown in FIGS. 7A-7C, arranging the gate electrodes 14 in the trenches 21 of the trench structure 2, wherein the trenches 21 extend from the first surface 101 into the first semiconductor layer 110, helps to prevent high electric field at the gate dielectric 15. High electric fields occur, in particular, when the gate dielectric 15 has a curved structure. Curvatures of the gate dielectric 15 are avoided in the example shown in FIGS. 7A-7C. Furthermore, bottoms of the trenches 21 are located in the first semiconductor layer 110. During operation of the transistor device, an electrical potential of the first semiconductor layer 110 essentially equals drain potential, so that electric fields along the trench bottoms are avoided.

Referring to FIGS. 7A and 7C, each transistor cell 1 includes a doped region 19 of the first doping type, which is referred to as current spreading region in the following. The current spreading region 19, in the first lateral direction x extends from the gate dielectric 15 to the drift region 11, so that in the on-state a current can flow from the source region 12 along the gate dielectric 15 in the body region 13 and the current spreading region 19 to the drift region 11. Referring to FIG. 7C, which shows a horizontal sectional view in section plane B-B that cuts through the current spreading layer 19, the current spreading layer 19 includes several sections that are spaced apart from each other in the second lateral direction y. In those sections of the section layer 121 where the current spreading layer 19 is omitted, the compensation regions 17 extend to the body region 13 (as illustrated in FIG. 7B), so that the compensation regions 17, via the body regions 13, are connected to the source node S.

Optionally, in the example illustrated in FIGS. 7A-7C, the transistor device further includes a doped region 18 of the second doping type, wherein this semiconductor region 18 is connected to the source node S and extends through the source region 12 and the body region 13 into the drift region 11. According to one example, this semiconductor region 18, which is also referred to as breakthrough region in the following, is located in the middle between the two trenches 21. This breakthrough region 18 defines the position at which a breakdown occurs when the drain-source voltage reaches a critical voltage level. The critical voltage level is a voltage level at which the electric field reaches a critical value. The "critical value" is a value at which an avalanche breakdown occurs. The breakthrough region 18 defines the position at which such breakdown occurs when the drain-source voltage reaches the critical voltage level. By arranging the breakthrough region 18 in the middle between the trenches 21 the position at which the breakdown occurs is spaced apart from the gate dielectrics 15 so that the gate dielectrics 15 are protected against the injection of hot charge carriers, for example. Hot charge carriers injected into the gate dielectrics may degrade the gate dielectrics and/or change the threshold voltage of the transistor device.

According to one example (not shown in FIG. 7A but shown in FIG. 8A, for example), the breakthrough region 18 extends from the first surface 101 through the source and body regions 12, 13 into the drift region 11. According to another example (shown in FIGS. 7A and 7B), the breakthrough region 18 adjoins a trench contact (contact plug) 61 that extends from the first surface 101 through the source region 12 and the body region 13 and is electrically connected to the source node S. In this example, the source region 12 and the contact region 13 are connected to the source node S via the trench contact 61. The trench contact includes an electrically conductive material such as, for example, a metal and/or a silicide. The breakthrough region 18 adjoins the trench electrode 61 and extends into the drift region 11. Forming the breakthrough region 18 may include forming a trench that is configured to accommodate the trench electrode 61; implanting dopant atoms via a bottom of the trench into the body region 13 and the drift region 11 to form the breakthrough region 18; and forming the trench electrode 61 in the trench. Forming the breakthrough region 18 may further include an annealing process to activate the implanted dopant atoms. This annealing process may be the same annealing process that activates dopant atoms in any of the other active regions such as, for example, source, body or compensation regions 12, 13, 17.

Figure 8A:
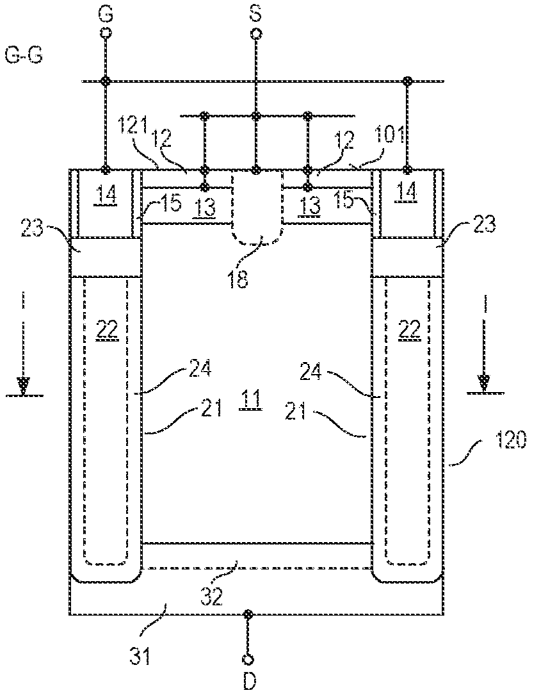
Figure 8B:
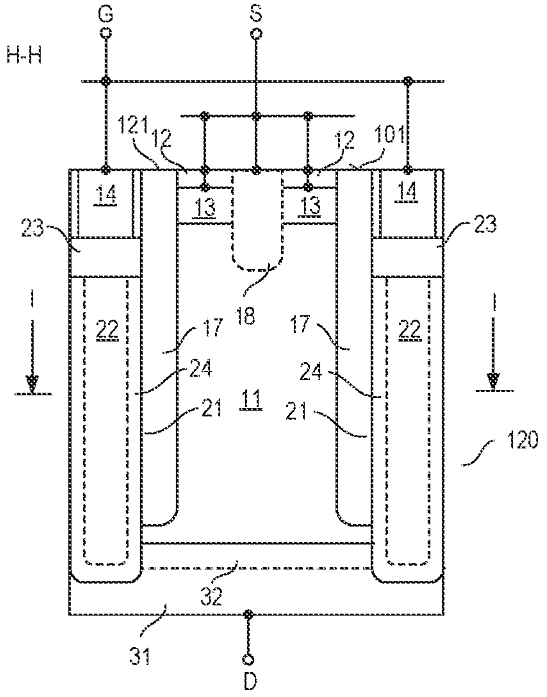
Figure 8C:
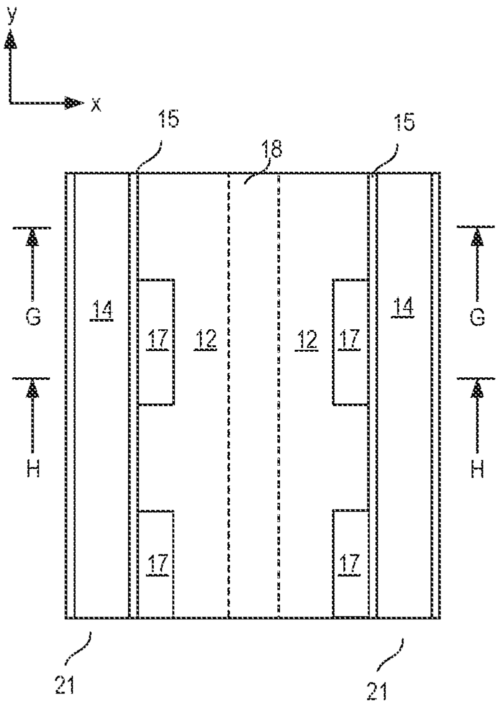
Figure 8D:
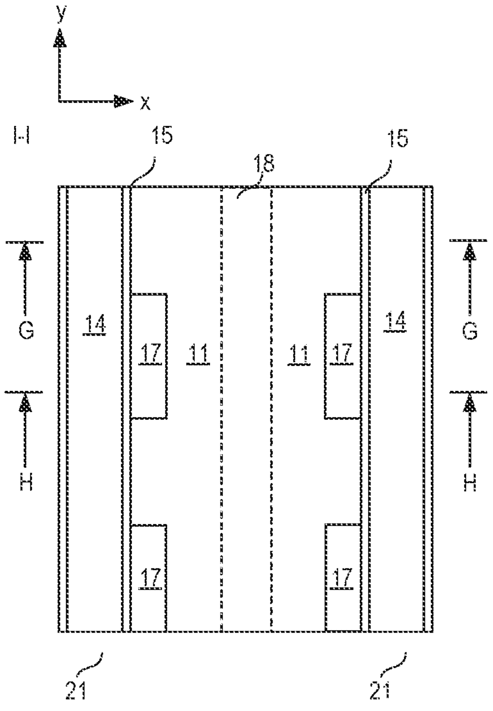

FIGS. 8A-8D illustrate a further example of a superjunction transistor device that includes gate electrodes 14 and gate dielectrics 15 above respective cavities 22. FIG. 8A shows a vertical cross sectional view of one section of the transistor device in a first vertical section plane G-G, FIG. 8B shows a vertical cross sectional view of one section of the transistor device in a second vertical section plane H-H, FIG. 8C shows a top view, and FIG. 8D shows a horizontal cross sectional view in a section plane I-I extending through the drift region 11.

In connection with FIGS. 8A-8D "compensation region 17" denotes any region that includes dopant atoms of the second doping type introduced into the semiconductor body 100 in a sidewall implantation process. Thus, a compensation region 17 as used in connection with FIGS. 8A-8D may include further dopant atoms, such as dopant atoms resulting from implantation processes for forming the source and body regions 12, 13. Furthermore, a compensation region 17 as used in connection with FIGS. 8A-8D may already have been annealed or may be annealed at a later stage.

Referring to FIGS. 8A-8D, each transistor cell includes several compensation regions 17 that are spaced apart from each other along a respective trench. That is, the compensation regions 17 are spaced apart from each other in the second lateral direction y, wherein the compensation regions 17 may extend along the gate dielectrics 15 to the first surface 101 of the semiconductor body. In sections between neighboring compensation regions 17, source and body regions 12, 13 adjoin the respective gate dielectric 15. The compensation regions 17 adjoin the body regions 13, so that the compensation regions 17 are connected to the source node S via the body regions 13.

As explained herein further below, the compensation regions 17 can be formed by implanting dopant atoms into the mesa regions 121 via sidewalls of the trenches 21. When implementing several compensation regions 17 laterally spaced apart from each other as illustrated in FIGS. 8A-8D, there are sections of the semiconductor body 100 along the gate dielectrics 15 that do not include compensation regions 17. In these sections, the doping concentrations of the source and body regions 12, 13 are adjusted only by implantation processes for forming the source and body regions 12, 14 and are not affected by the process of forming the compensation regions 17. Thus, the threshold voltage and the channel resistance, which are both dependent on the doping concentration of the body regions 13, are not affected by the process of forming the compensation regions 17.

In the examples explained above, the drift regions 11 of the transistor cells 1 are formed by sections of the mesa regions 121 that have the basic doping of the second semiconductor layer 120. According to one example, the second semiconductor layer 120 is an epitaxial layer and the basic doping may result from in-situ doping the second semiconductor layer 120 during the epitaxial growth process. According to another example, the second semiconductor 120 layer is part of a substrate having the basic doping. In this example, the first semiconductor layer 110 may be formed by implanting first type dopant atoms (via the second surface 102) into the substrate.

However, implementing the drift region 11 such that the doping concentration of the drift region 11 corresponds to the basic doping concentration of the second semiconductor layer 120 is only an example. According to another example, illustrated in FIGS. 9A-9C the drift regions 11 are doped regions that have a dimension in the first lateral direction that is significantly lower than a width of the mesa region 121, that is, significantly lower than the (shortest) distance between the trenches 21. Drift regions 11 of this type may be produced in the same way as the compensation regions 17, that is, by implanting dopant atoms (of the first doping type) via the first and second sidewalls of the trenches 21 into the mesa regions 121, wherein implantation energies and implantation angles in the process of forming the compensation regions 17 and the process of forming the drift regions 11 are adapted to one another such that the compensation regions 17 and the drift regions 11 are arranged next to each other in the first lateral direction x.

Figure 9A:
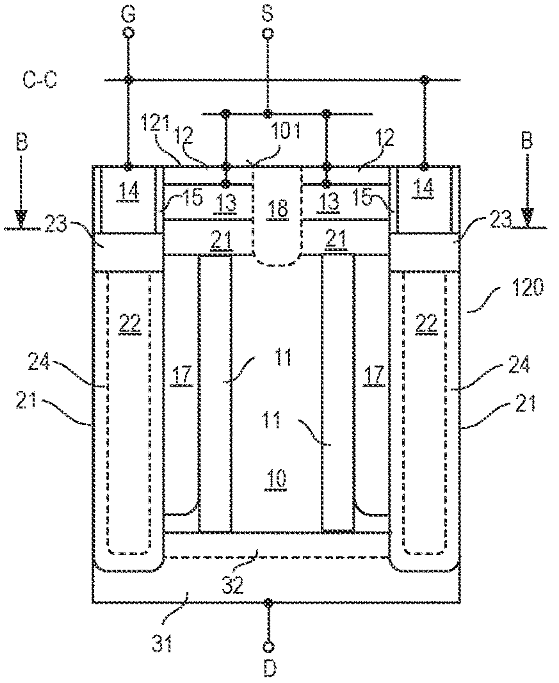
Figure 9B:
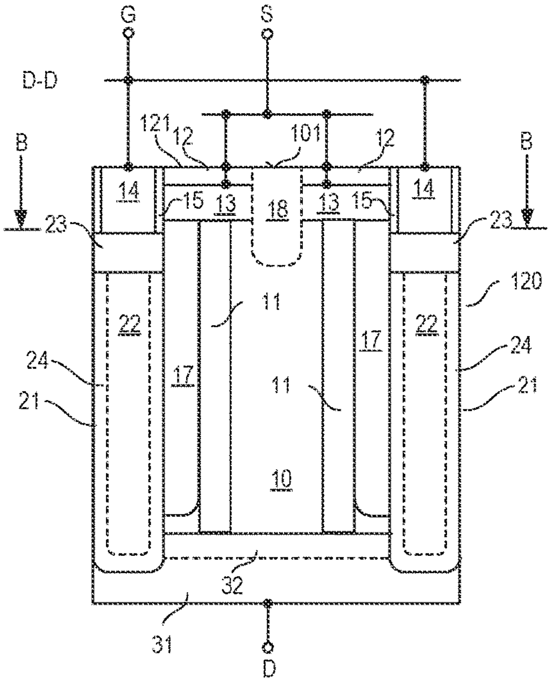
Figure 9C:
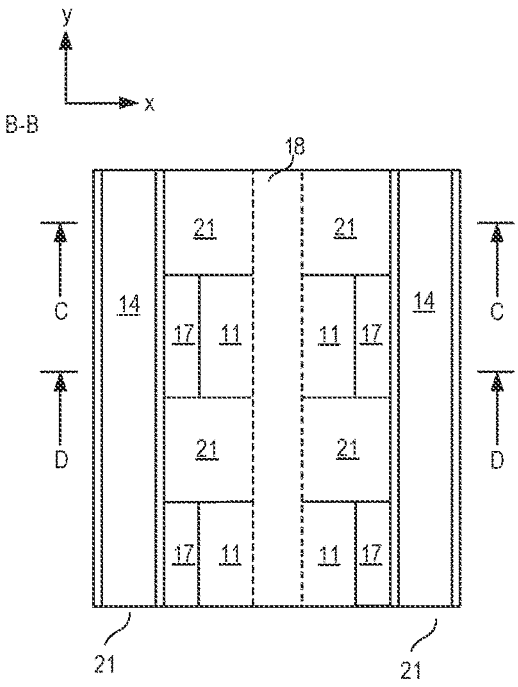

The example shown in FIGS. 9A-9C is based on the example shown in FIGS. 7A-7C. Thus, the drift regions 11 extend from the current spreading regions 19 to the drain region 31 or the optional buffer region 32. The current spreading regions 19 are spaced apart from each other in the second lateral direction y. In sections between two neighboring current spreading regions 19, the compensation regions 17 adjoin the respective body region 13.

In the example shown in FIGS. 9A-9C, the compensation regions 17 are arranged between the drift regions 11 and the trenches 21. This, however, is only an example. Another example is illustrated in FIG. 10.

Figure 10:
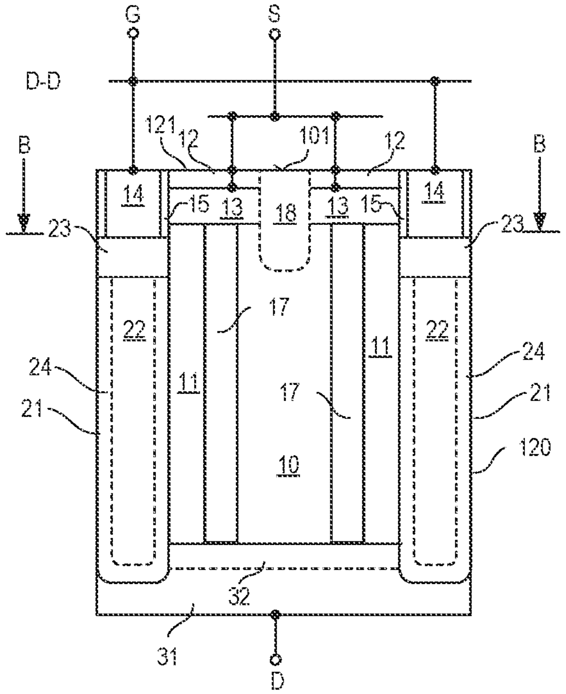

The example illustrated in FIG. 10 is based on the example illustrated in FIGS. 9A-9C and is different from the example shown in FIGS. 9A-9C in that the drift regions 11 are arranged between the compensation regions 17 and the trenches 21. In this example, the current spreading regions 19 can be omitted.

In the examples according to FIGS. 9A-9C and 10, the second semiconductor layer 120 may be formed such that its basic doping concentration is lower than a desired doping concentration of the drift region 11. According to one example, the second semiconductor layer 120 is an intrinsic layer. In the examples according to FIGS. 9A-9C and 10, dopant doses included in the compensation regions 17 and the drift regions 11 can precisely be adjusted by suitably adjusting the implantation doses in the process of forming the drift and compensation regions 11, 17. Referring to FIGS. 9A-9B, drift regions of two transistor cells 1 formed in the same mesa region 121 may be spaced apart from each other, so that a region 10 between the two drift regions may have the basic doping concentration of the second semiconductor layer 120. This basic doping concentration may be very low, as low as intrinsic. According to one example, "intrinsic" includes that there is no intentional doping, so that the doping concentration is lower than 1E15 $cm^{-3}$ or even lower than 1E14 $cm^3$.

In the examples explained with reference to FIGS. 3-6, 7A-7C, 8A-8D, 9A-9C, and 10 each of the transistor cells 1 includes a gate electrode 14 (wherein the gate electrodes of two or more transistor cells may be formed by one electrode) that is dielectrically insulated from the source and body regions 12, 13 by a gate dielectric. As explained above, transistor cells 1 of this type are MOSFET cells and the resulting transistor device is a MOSFET. However, implementing the transistor device as a MOSFET is only an example. According to another example, the transistor device is a JFET.

One example of a superjunction JFET is illustrated in FIG. 11. More specifically, FIG. 11 illustrates a vertical cross sectional view of two transistor cells of a superjunction JFET. These transistor cells 1 are based on the transistor cells 1 according to FIG. 4 and are different from the transistor cells according to FIG. 4 in that the gate electrode 14, the gate dielectric 15, and the source and body regions 12, 13 are omitted and in that the JFET cells include doped gate regions 14J of a doping type complementary to the doping type of the drift region 11. Furthermore, the drift region 11 includes a section 11', which extends between the JFET regions 16 towards the first surface 101 and is connected to a contact electrode 62. This section 11' of the drift region 11 may be referred to as channel region. The contact electrode 62 that is connected to the channel region includes an electrically conductive material such as a metal, a metal alloy, or a silicide and is connected to the source node S.

According to one example, doping concentrations of the gate regions 14J are higher than doping concentrations of the compensation regions 17. A doping concentration of the gate regions 14J, a doping concentration of the drift region 11, and a (shortest) distance between the gate regions 14J across the channel region are adapted to one another such that the channel region 11' is completely depleted of charge carriers (the channel region 11' is pinched oft), when a voltage with a predefined voltage level is applied between the gate node G and the source node S that reverse biases the pn-junctions between the gate regions 14J and the drift region 11. According to one example, the doping concentration of the gate regions 14J is such that the gate regions 14J cannot be completely depleted of charge carriers. That is, the doping concentration of the gate regions 14J is too high for the gate regions 14J to be completely depleted.

The doping concentration of the compensation regions 17, however, is such that the compensation regions 17 can completely be depleted when the drain-source voltage (the voltage between the drain node D and the source node S) increases and the transistor device is in the off-state (the channel region 11' is pinched oft).

In the example shown in FIG. 11, the drift region 11 is formed by sections of the mesa region 121 that have the basic doping of the second semiconductor layer 120. According to one example, the channel region 11' has the same doping concentration as the remainder of the drift region 11. As outlined above, the doping concentration of the channel region 11' affects the pinch-off voltage, which is the voltage to be applied between the gate node G and the source node S in order to pinch off the channel region 11'. Thus, by suitably selecting the doping concentration of the channel region 11' (and the doping concentration of the gate region 14J), the pinch-off voltage can be adjusted.

FIG. 12 shows a JFET according to another example. In this JFET, similar to the MOSFET according to FIGS. 9A-9C, both compensation regions 17 and drift regions 11 are implanted regions. That is, compensation regions 17 and drift regions 11 have been formed by implanting respective dopant atoms via the first and second sidewalls of the trenches 21 into the mesa regions 121. Implantation energies and implantation angles in the process of forming the compensation regions 17 and the process of forming the drift regions 11 are adapted to one another such that the compensation regions 17 and the drift regions 11 are arranged next to each other in the first lateral direction x.

Just for the purpose of illustration, in the example shown in FIG. 12, each compensation region 17 is arranged between a respective trench 21 and a respective drift region 11. As illustrated, a width of the mesa region 121 in the first lateral direction x may be selected such that each mesa region 121 includes two drift regions 11 that are spaced apart from each other, so that a region 10 having the basic doping of the second semiconductor layer 120 is arranged between the two drift regions 11. The two drift regions include a first drift region 11 formed by implanting first type dopant atoms into the mesa region 121 via the first sidewall of a first trench, and a second drift region 11 formed by implanting first type dopant atoms into the mesa region 121 via the second sidewall of a second trench, wherein both the first trench and the second trench adjoin the mesa region 121.

According to another example (not shown), a width of the mesa region 121 is such that implanting the first type dopant atoms into the mesa region 121 via first and second sidewalls of trenches adjoining the mesa region 121 results in one drift region 11 in the middle of the mesa region 121.

Referring to FIG. 12, the gate region 14J of each transistor cell 1 adjoins the compensation region 17 in the vertical direction z and is arranged between a respective trench 21 and a respective drift region 11. In the example shown in FIG. 12, in which each drift region 11 is arranged between a compensation region 17 or gate region 14J and the region 10 having the basic doping, each gate region 14J is configured to deplete an adjoin channel region 11', wherein the channel region 11' is a section of the drift region 11 that adjoins the gate region 14J. The channel region 11 may have the same doping concentration as the remainder of the drift region 11, or may have a higher doping concentration than the remainder of the drift region 11.

FIG. 13 illustrates a modification of the JFET shown in FIG. 12. In the example shown in FIG. 13, a further gate region 14J' connected to the gate node G is arranged between the two drift regions 11, so that each channel region 11' is arranged between the further gate region 14J' and the respective gate region 14J.

In the JFETs according to FIGS. 12 and 13, not only the compensation regions 17 and the drift regions 11, but also the gate regions 14J adjoining the trenches 21 may be formed by implanting dopant atoms via the trench sidewalls into the mesa region 121.

In the examples shown in FIGS. 12 and 13, the compensation regions 17 adjoin the trenches 21 and are arranged between at least one drift region 11 and the trenches 21. This, however, is only an example. According to another example (not shown), which is similar to the example shown in FIG. 10, the drift regions 11 may be arranged between the trenches 21 and at least one gate region 14J.

In each of the examples shown in FIGS. 11-13, the compensation region 17 of each transistor cell 10 is connected to the gate node G via the respective gate region 14J. Alternatively, the compensation region 17 of each transistor cell 10 is connected to the gate node G via a respective connection electrode (not shown) that is arranged in the trench next to the compensation region 17.

Figure 14A:
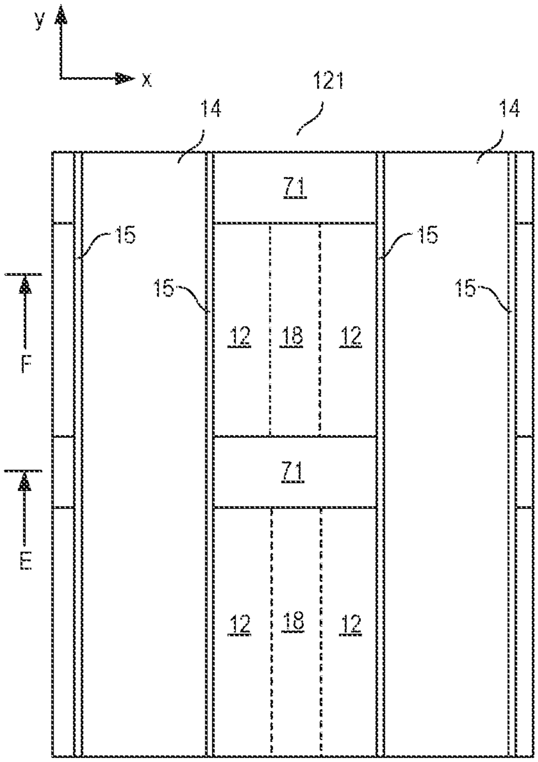
Figure 14B:
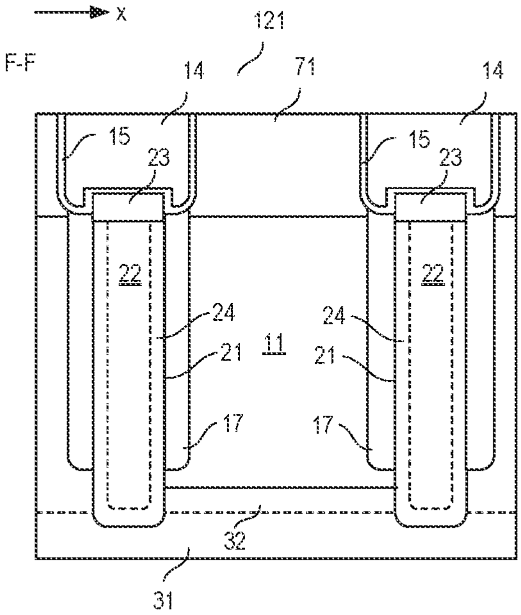
Figure 14C:
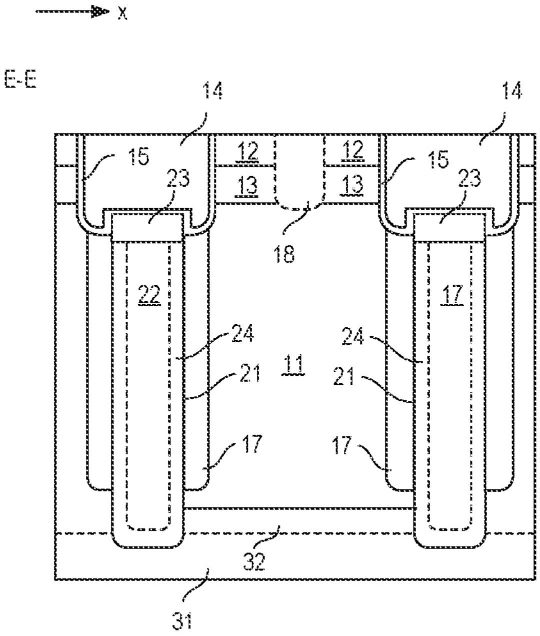

FIGS. 14A-14C illustrate another example of superjunction transistor cells in which gate electrodes 14 are arranged above the cavities 22 and the plugs 23 in the trenches 21 of the trench structure 2. FIG. 14A shows a top view and FIGS. 14B and 14C show vertical cross sectional views in different vertical section planes of a section of the transistor device that includes several transistor cells. The example shown in FIGS. 14A-14C is based on the example shown in FIGS. 7A-7C and is different from the example shown in FIGS. 14A-14C in that sections of the trenches that include the gate electrodes 14 and gate dielectrics 15 are wider than those trench sections that include the cavities 22. More specifically, the trench sections that include the gate electrodes 14 and gate dielectrics 15 extend beyond the compensation regions 17 in the first lateral direction x, so that the compensation regions 17 are spaced apart from the body regions 13 connected to the source node S.

For connecting the compensation regions 17 to the source node S, the transistor device may include contact regions 71 of the second doping type. FIG. 14B shows a vertical cross sectional view in a region that includes a contact region 71, and FIG. 14C shows a vertical cross sectional view in a region that includes source and body regions 12, 13. The contact regions 71 are connected to the source node S (not shown in FIGS. 14A-14C) and, in the vertical direction extend from the first surface 101 to the compensation regions 17. Referring to FIG. 14A, several contact regions 71 may be arranged spaced apart from each other in the longitudinal direction of the trenches 21, wherein source regions 12 and body regions 13 (out of view in FIG. 14A) are arranged between neighboring contact regions 71. Thus, one compensation region 17 may be contacted by two or more contact regions 71.

Referring to FIG. 14A, one contact region 71, may extend across the mesa region 121 from one gate trench to another gate trench. This, however, is only an example. According to another example, illustrated in FIG. 15, each of the contact regions 71 may adjoin one gate trench and may be spaced apart from the neighboring gate trench.

Figure 15:
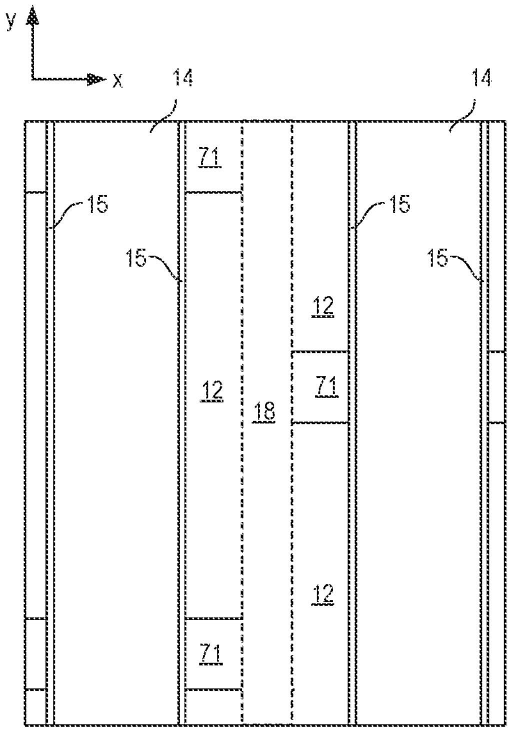

The contact regions 71 may be formed by a masked implantation process in the same way the source and body regions 12, 13 and the optional breakthrough regions 18 are formed. According to one example the contact regions 71 are formed by the same implantation process(es) that form(s) the breakthrough regions 18. Referring to FIGS. 14A and 15 each of the contact regions 71 may adjoin one or more breakthrough regions 18.

FIGS. 16A-16G illustrate one example of a method for forming the trench structure 2. More specifically, FIGS. 16A-16G illustrate one example of a method for forming trenches 21 that each include a cavity 22 and a plug 23 closing the cavity 22, wherein each of FIGS. 16A-16G shows a vertical cross sectional view of one section of the semiconductor body 100 in which two of these trenches 21 are formed.

Figure 16A:
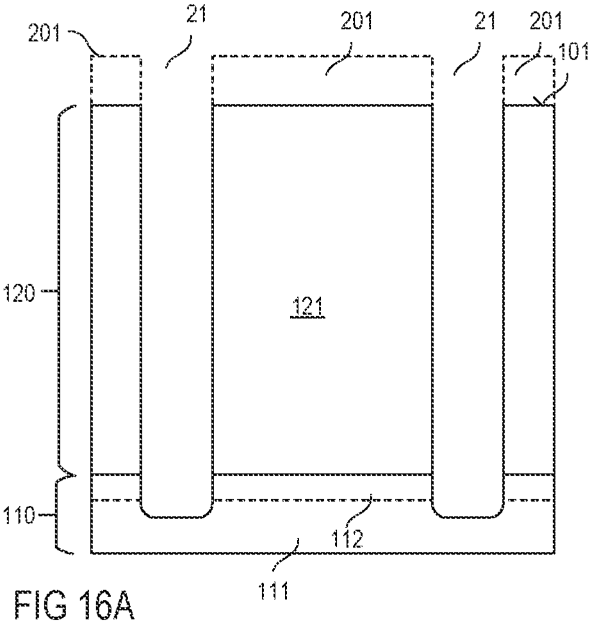
FIGS. 16A-16G illustrate one example of a method for forming the trench structure.

Referring to FIG. 16A the method includes forming the trenches 21 in the semiconductor body 100 such that the trenches 21 extend from the first surface 101 through the second semiconductor layer 120 into the first semiconductor layer 110. Referring to the above, the first semiconductor layer 110 may include a first sublayer 111 forming the drain region 31 of the finished transistor device and an optional second sublayer 112 forming the buffer region 32 of the finished transistor device. The first semiconductor layer 110 may include a doped semiconductor substrate that forms the first sublayer 111. The optional second sublayer 112 is an epitaxial layer grown on the substrate, for example. According to one example, the second sublayer 112 is in-situ doped during the epitaxial growth process. According to one example, the second semiconductor layer 120 is an epitaxial layer that is either grown on the substrate forming the drain region 31 or on the epitaxial layer forming the buffer region 32. According to one example, the second semiconductor layer 120 is in-situ doped during the epitaxial growth process to provide a basic doping of the second semiconductor layer 120 and, therefore the mesa regions 121. According to another example, the second semiconductor layer 110 is part of a substrate and the first layer 110 (optionally with the first and second sublayers 111, 1112) is formed by implanting dopant atoms into the substrate.

Forming the trenches 21 may include an etching process. According to one example, the etching process includes forming an etch mask 201 (illustrated in dashed lines in FIG. 16A) on top of the first surface 101, wherein the etch mask 201 includes openings in which the first surface 101 of the semiconductor body 100 is not covered. The method further includes etching the semiconductor body 100 in those sections in which the etch mask 201 does not cover the first surface 101. According to one example, the etching process is an anisotropic etching process. A duration of the etching process is adjusted such that the etching process ends when the trenches 21 have been etched down into the first semiconductor layer 110. Referring to the above, the thickness of the second semiconductor layer 120 is between 3 micrometers and 60 micrometers, for example. The aspect ratio of the trenches 21 is between 5:1 and 25:1, for example.

Figure 16B:
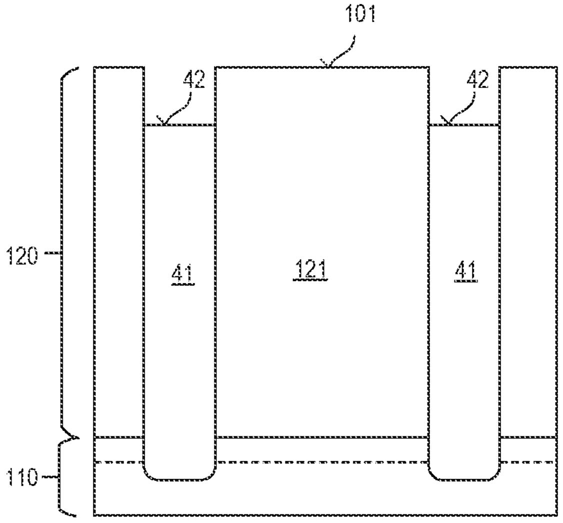

Referring to FIG. 16B, the method further includes partially filling the trenches 21 with a sacrificial plug 41. According to one example, the sacrificial plug 41 includes a sacrificial material that can be etched selectively relative to the semiconductor body 100. According to one example, the sacrificial material includes polysilicon or an oxide. The oxide is silicon oxide ($SiO_2$), for example, and may be formed based on depositing TEOS (tetraethoxysilane). "Partially filling" the trenches 21 by the sacrificial plug 41, includes filling the trenches 21 such that the sacrificial plug 41 does not completely fill the trenches 21. That is, an upper surface 42 of the sacrificial plug 41 is spaced apart from the first surface 101 in the vertical direction z, wherein a distance between the surface 42 of the sacrificial material 41 and the first surface 101 of the semiconductor body 100 defines a thickness of the plug that closes the cavity in the finished trench structure. This is explained in the following.

Figure 16C:
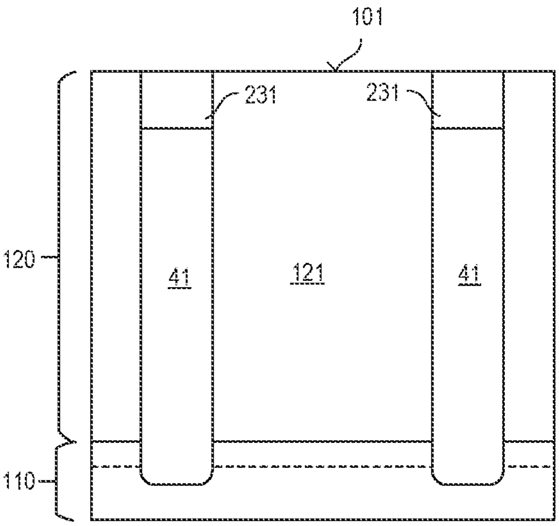

Referring to FIG. 16C, the method further includes filling a gap (residual trench) between the sacrificial plug 41 and the first surface 101 with a first plug 231. The plug 23 of the finished device is formed based on the first plug 231 according to FIG. 16C. This is explained in detail herein further below. The first plug 231 includes an oxide, such as silicon oxide ($SiO_2$), for example.

Figure 16D:
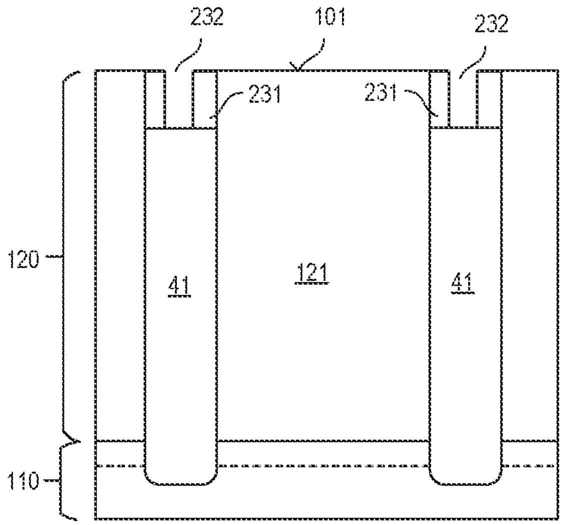

Referring to FIG. 16D, the method further includes forming an opening 232 in each first plug 231, wherein the opening 232 extends through the first plug 231 down to the sacrificial plug 41. Forming the opening 232 may include an etching process using an etch mask (not illustrated in FIG. 16D).

Figure 16E:
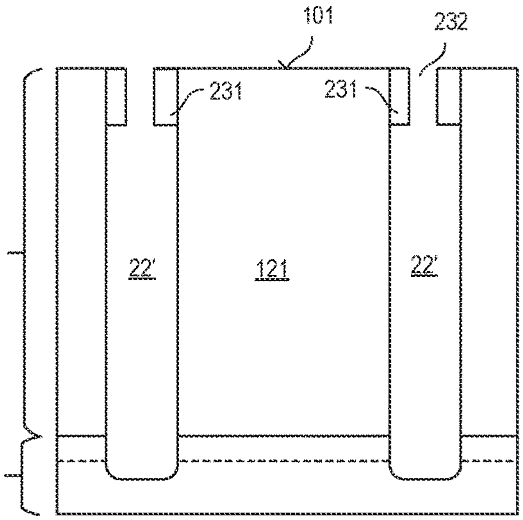

Referring to FIG. 16E, the method further includes removing the sacrificial material 41 via the openings 232 formed in the first plugs 231. Removing the sacrificial material 41 may include an isotropic etching process in which the sacrificial material 41 is removed selectively relative to the semiconductor body 100 and the plug 231, so that voids 22' are formed in the trenches 21 below the plugs 231. If, for example, the sacrificial plug 41 includes polysilicon TMAH (tetramethylammonium hydroxide) may be used to selectively remove the sacrificial plug 41.

Figure 16F:
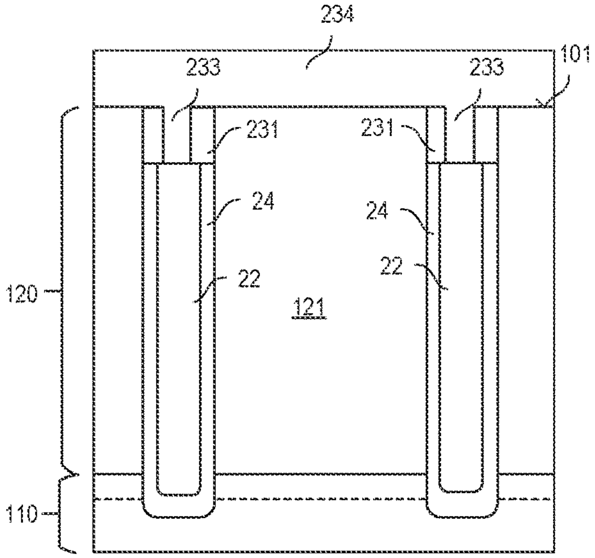
Figure 16G:
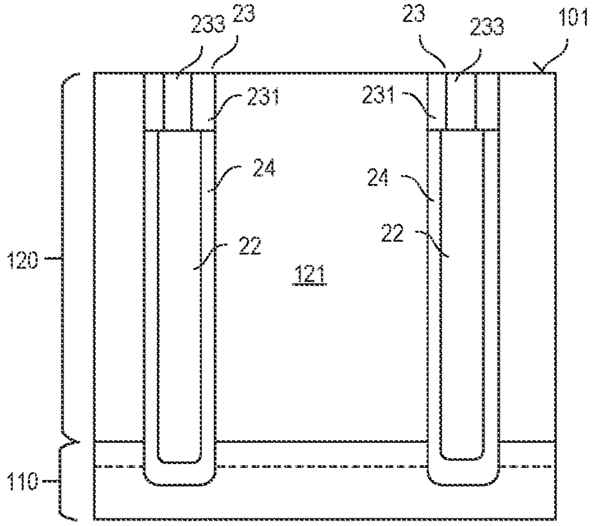

Referring to FIGS. 16F and 16G, the method further includes closing the openings 232 in the plugs 231 so as to form the plugs 23 of the finished transistor device. According to one example, closing the openings 232 of the plugs 231 takes place in a low pressure (vacuum) atmosphere, so that a pressure in the voids 22 after closing the voids 22 by the plugs 23 essentially equals the ambient pressure in the process of closing the plugs. This pressure may be significantly lower than atmospheric pressure. According to one example, closing the openings 232 in the plugs 231 includes a high density plasma process (HDP process) in which plug material 233, such as an oxide, is deposited.

Referring to FIG. 16F, the duration of this process is selected such that the openings 232 in the first plugs 231 are completely closed by a plug material 233, wherein the plug material 233 closing the openings 232 and the first plugs 231 from the plugs 23 of the finished trench structure. In the process according to FIG. 16F, plug material is deposited on each surface of the structure according to FIG. 16E, so that plug material is also deposited on sidewalls and a bottom of the trenches 21 before the openings 232 are closed. The plug material deposited in the trenches 21 forms the optional dielectric layer 24 explained herein before. Due to the nature of the process, the dielectric layer 24 may be thicker at the bottom of each trench 21 than along the sidewalls.

According to one example, an oxide layer (not shown) is formed on the sidewalls and the bottom of the trenches 21 before initiating the process of closing the openings 232, such as an HDP process. Forming the oxide layer may include a thermal oxidation process. The oxide layer may help to reduce surface charges at the interface between the trenches 21 and the adjoining semiconductor material of the semiconductor body 100.

As illustrated in FIG. 16F, the plug material may also be deposited on the first surface 101 of the semiconductor body 100. This plug material 234 deposited on the first surface 101 may be removed in a planarizing process, wherein the result of this process is illustrated in FIG. 16G. The planarizing process includes a chemical and/or mechanical polishing process, for example.

Figure 17A:
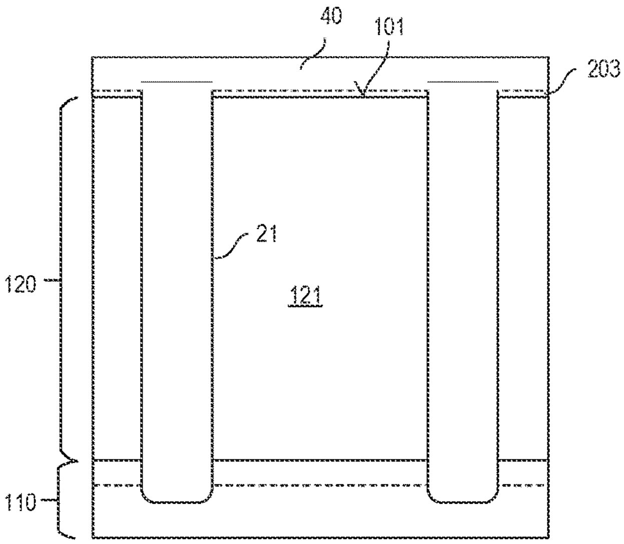
FIGS. 17A-17C illustrate one example of a method for forming a sacrificial plug in the method according to FIGS. 16A-16G.
Figure 17B:
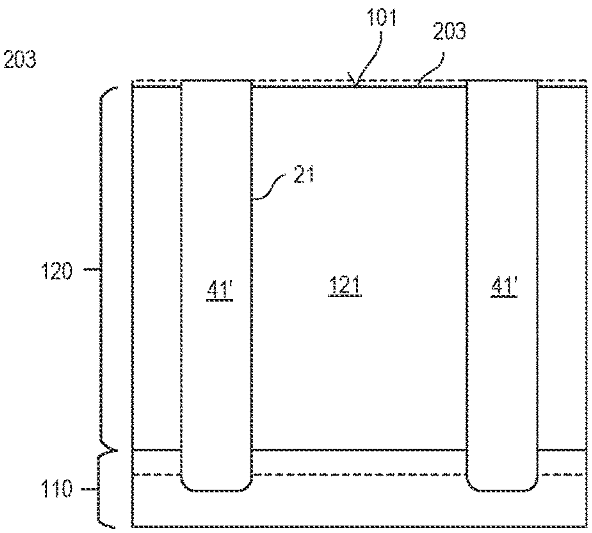
Figure 17C:
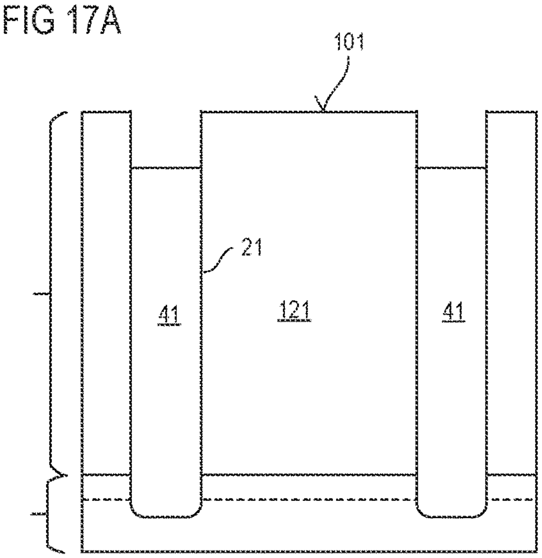

FIGS. 17A-17C illustrate one example of a method for forming the sacrificial plug 41 in each trench 21. Referring to FIG. 17A, this method includes completely filling the trenches 21 and covering the first surface 101 of the semiconductor body 100 by a sacrificial material 40. Referring to FIG. 17B, the method furthermore includes removing the sacrificial material 40 down to the first surface 101 in a first removal process. This removal process includes a chemical and/or mechanical polishing process, for example. At the end of the first removal process, the trenches 21 are completely filled by preliminary sacrificial plugs 41'.

Optionally, the method includes forming a stop layer 203 (illustrated in dashed lines) on top of the mesa regions 121 and removing the sacrificial material 40 down to the stop layer 203 in the removal process. The stop layer may be deposited on the first surface 101 before forming the etch mask (201 in FIG. 16A) and may be etched in the same process in which the trenches 21 are formed so that the stop layer 203 remains on top of the mesa regions 121. The stop layer 203 is a nitride layer, for example.

Referring to FIG. 17C, the method further includes partially removing the preliminary sacrificial plugs 41' to form the sacrificial plugs 41. Partially removing the preliminary sacrificial plugs 41' may include an etching process that selectively etches the sacrificial material relative to the semiconductor body 100. The optional stop layer 203 may be removed before or after forming the sacrificial plugs 41 based on the preliminary sacrificial plugs 41'.

Figure 18A:
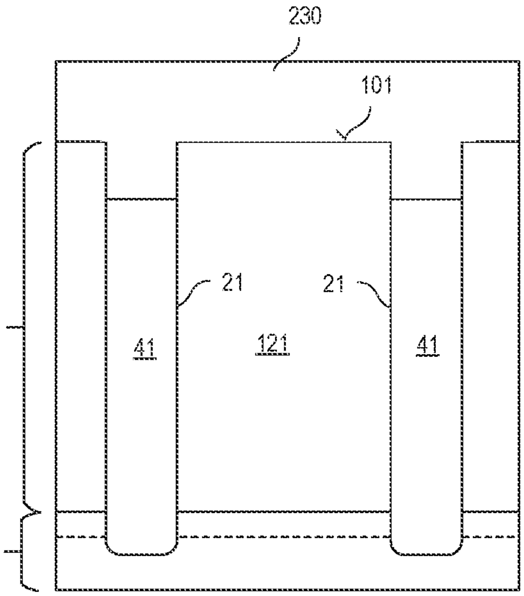
FIGS. 18A-18B illustrate one example of a method for forming a plug on top of the sacrificial plug in the method according to FIGS. 16A-16G.
Figure 18B:
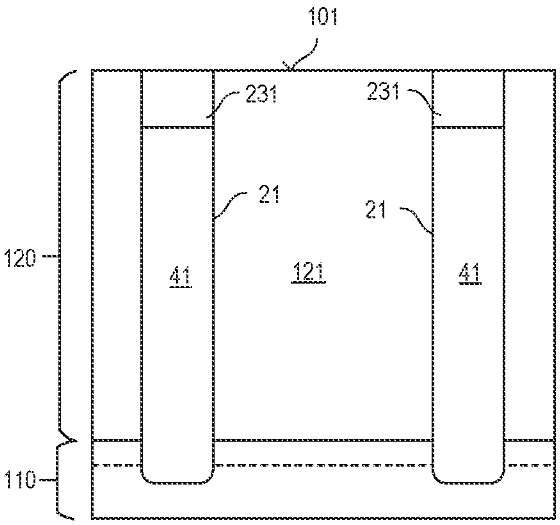

FIGS. 18A-18B illustrate one example of a method for forming the first plugs 231 on top of the sacrificial material 41 shown in FIG. 16C. Referring to FIG. 18A, this method includes depositing a plug material layer 230 such that the plug material layer fills the gaps (the residual trenches) on top of the sacrificial material 41 and covers the first surface 101 of the semiconductor body 100. Forming the plug material layer 230 may include a deposition process.

Referring to FIG. 18B, forming the plugs 231 further includes planarizing the plug material layer 230, so that the first surface 101 is uncovered and plug material remains in the trenches 21 on top the sacrificial material 41. The plug material remaining on top of the sacrificial material 41 forms the plugs 231.

Referring to the example illustrated in FIGS. 7A-7C, the gate electrodes 14 and gate dielectrics 15 can be formed in the trenches 21 of the trench structure 2 on top of the plugs 23 that close the cavities 22. FIGS. 19A-19E illustrate one example of a method for forming the gate electrodes 14 and the gate dielectrics 15 in this way. The method of forming the gate electrodes 14 and gate dielectrics 15 starts after forming the plugs 23 that close the cavities 22 inside the trenches 21.

Figure 19A:
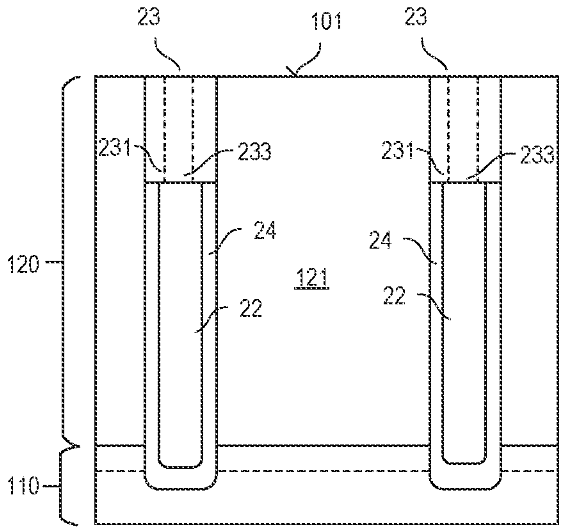
FIGS. 19A-19E illustrate one example of a method for forming gate electrodes and gate dielectrics in trenches of the trench structure.

FIG. 19A shows a vertical cross sectional view of the semiconductor body 100 after forming the plugs 23. The plugs 23 may be formed in accordance with the process according to FIGS. 16A-16G, so that the plugs 23 may include two plug sections 231, 233 that are formed in different process steps. These two plug sections 231, 233 are illustrated in dashed lines in FIG. 19A. This, however, is only an example. It is also possible to form the plugs 23 in a different way.

Figure 19B:
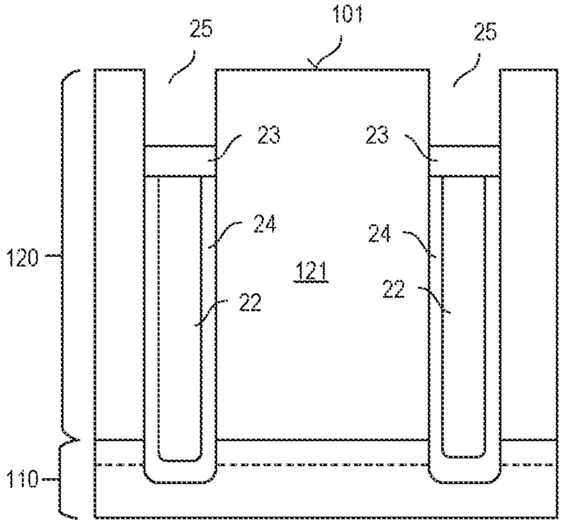

Referring to FIG. 19B, the method further includes partially removing each plug 23 to form a gap or trench 25 between the plug 23 and the first surface 101. The plug 23 remaining after the removal process still closes the respective void 23. According to one example, partially removing the plugs 23 includes a selective etching process in which the plugs 23 are etched selectively relative to the semiconductor material of the semiconductor body 100.

Figure 19C:
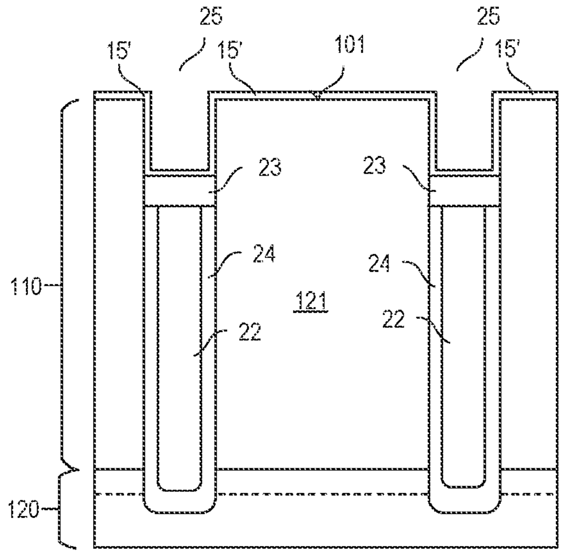
Figure 19D:
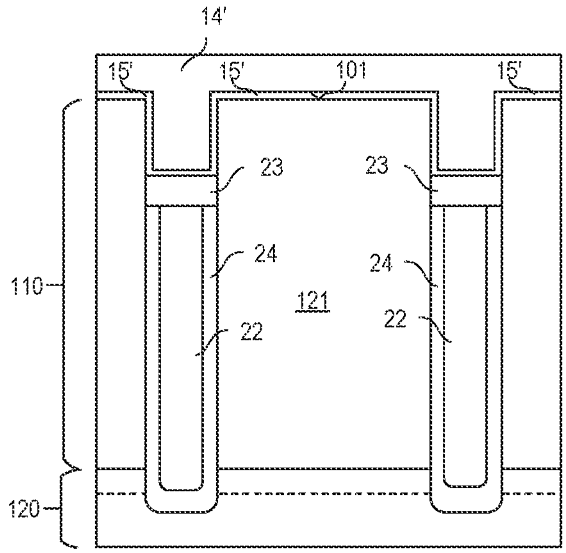
Figure 19E:
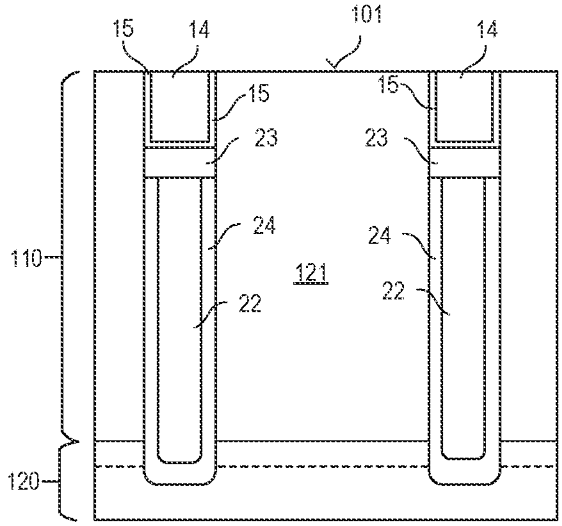

Referring to FIGS. 19C-19E, the method further includes forming the gate dielectrics 15 along sidewalls of the trenches 25 and forming the gate electrodes 14 in the trenches. The gate dielectric 15 may also cover the plugs 23 at the bottom of the trenches 25.

Referring to FIGS. 19C and 19D, forming the gate dielectrics 15 may include depositing a gate dielectric layer 15' on the first surface 101 of the semiconductor body 100, and on sidewalls and bottoms of the trenches 25, and forming the gate electrodes 14 in the trenches 25 may include depositing a gate electrode layer 14' such that the trenches 25 are completely filled and the gate dielectric layer 15' on top of the first surface 101 of the semiconductor body 100 is covered by the gate electrode layer 14'.

Referring to FIG. 19E, forming the gate electrodes 14 further includes removing the gate electrode layer 14' from the gate dielectric layer 15' on top of the first surface 101. Forming the gate dielectrics 15 may further include removing the gate dielectric layer 15' from the first surface 101. Removing the gate dielectric layer 15' from the first surface 101, however, is optional. Removing the gate electrode layer 14' from the gate dielectric layer 15' on top of the first surface 101 may include a planarizing process such as a chemical and/or mechanical polishing process, wherein the gate dielectric layer 15' on top of the first surface 101 may act as a stop layer. Removing the gate electrode layer 14' in a CMP process using the gate dielectric layer 15' as a stop layer may have the effect that the gate electrodes 14, after the CMP process, slightly extend beyond the first surface 101. According to one example, sections of the gate electrodes 14 that extend beyond the first surface 101 are removed in an etching process, wherein this etching process may be performed before or after removing the gate dielectric layer 15' from the first surface 101.

Referring to FIG. 16F and the corresponding description, forming a vacuum in the cavities 22 may include closing the cavities in a process that takes place in a low pressure atmosphere such as, for example, a HDP process. This, however, is only an example. Another example for producing a vacuum in the cavities is illustrated in FIGS. 20A-20D.

Figure 20A:
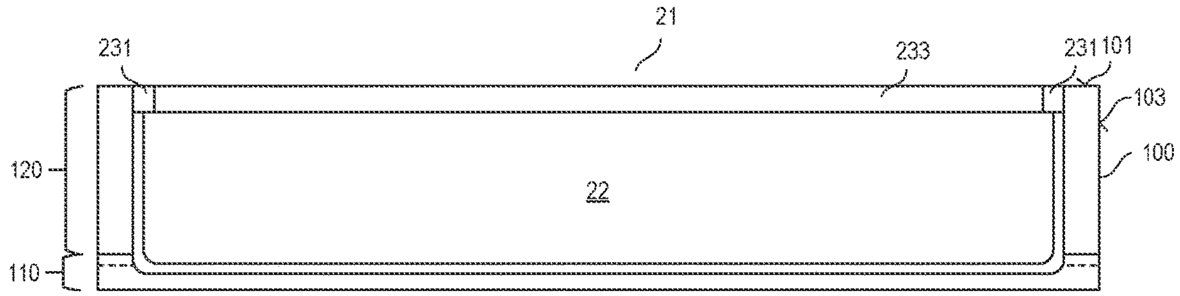
FIGS. 20A-20D illustrate one example of a method for producing a vacuum in a cavity of a trench.
Figure 20B:
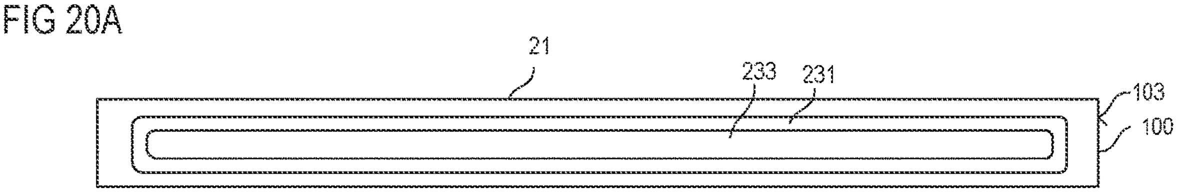

FIG. 20A shows a vertical cross sectional in a longitudinal direction and FIG. 20B shows a top view of one trench 21 after closing the cavity 22, that is after forming the plug 23. Forming the plug may include any suitable process, including the process according to FIGS. 16E-16G, wherein this process not necessarily takes place in a low pressure atmosphere. That is, when using the method according to FIGS. 16E-16G the process of forming the plug material 233 that closes the cavity not necessarily takes place in a low pressure atmosphere. Instead, a sputter process may be used, for example.

Figure 20C:
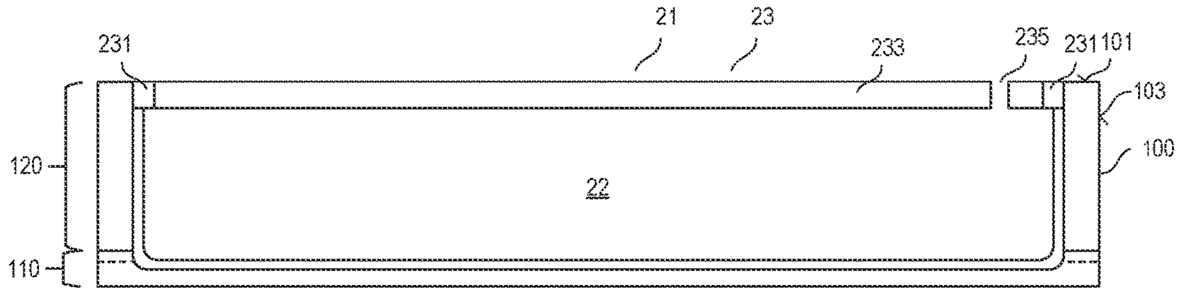

Referring to FIG. 20C, the method further includes forming an opening 235 in the plug 23. Forming the opening 235 may include an etching process using an etch mask (not shown). According to one example, the opening 235 is formed in the region of a longitudinal end of the trench 21. Referring to the above, the longitudinal end may be arranged in an edge region of the semiconductor body 100.

Figure 20D:
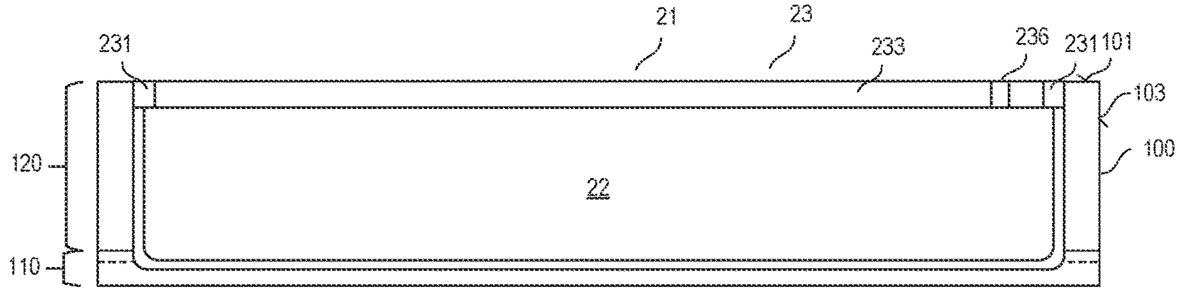

Referring to FIG. 20D, the method further includes forming a further plug 236 that fills the opening 235 and therefore closes the cavity 22. Forming the further plug 236 may take place in a low pressure atmosphere, so that a vacuum is produced in the cavity. The process of forming the further plug 236 may include an HDP process, for example.

Figure 21A:
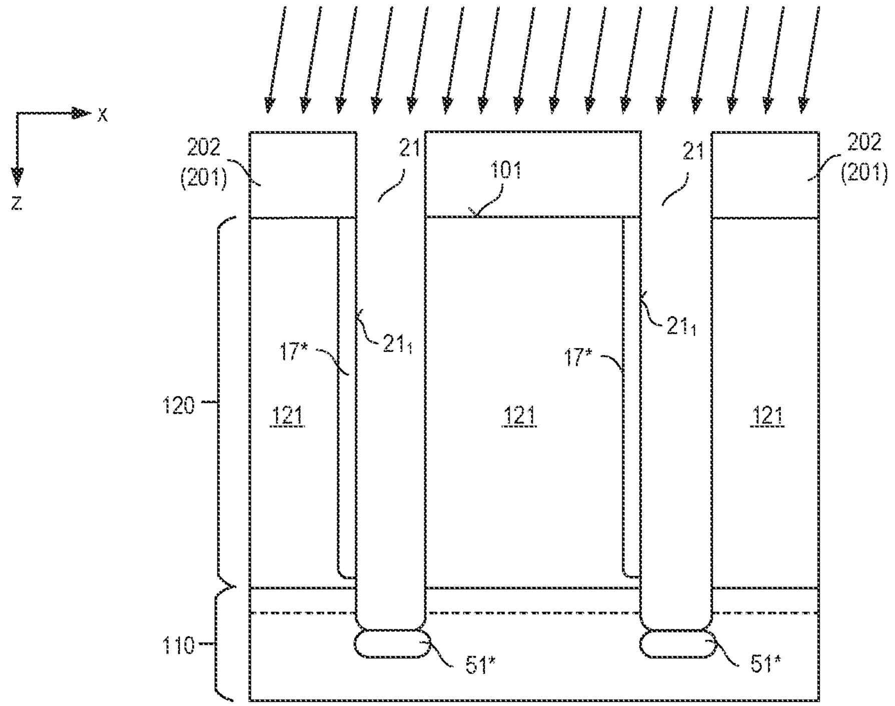
FIGS. 21A-21C illustrate one example of a method for forming compensation regions along trenches of the trench structure.
Figure 21B:
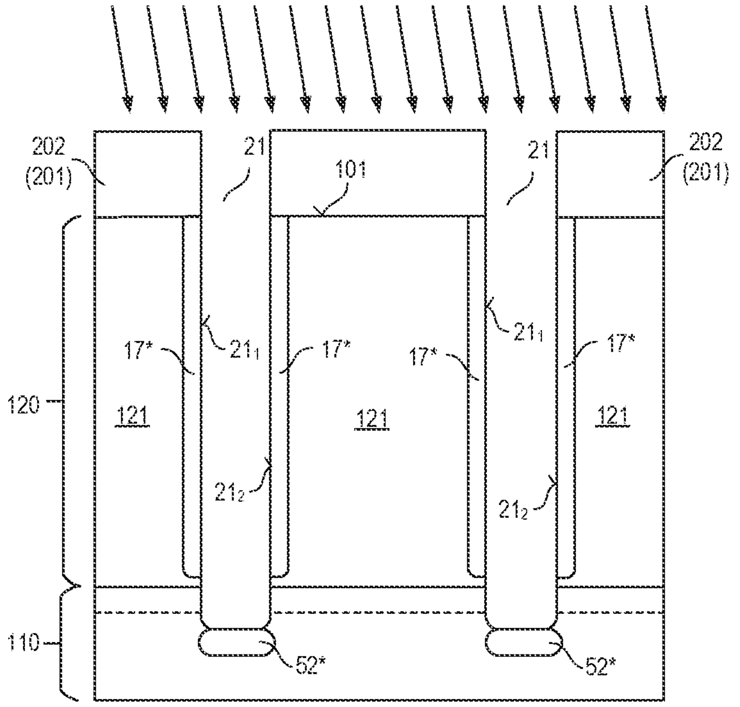
Figure 21C:
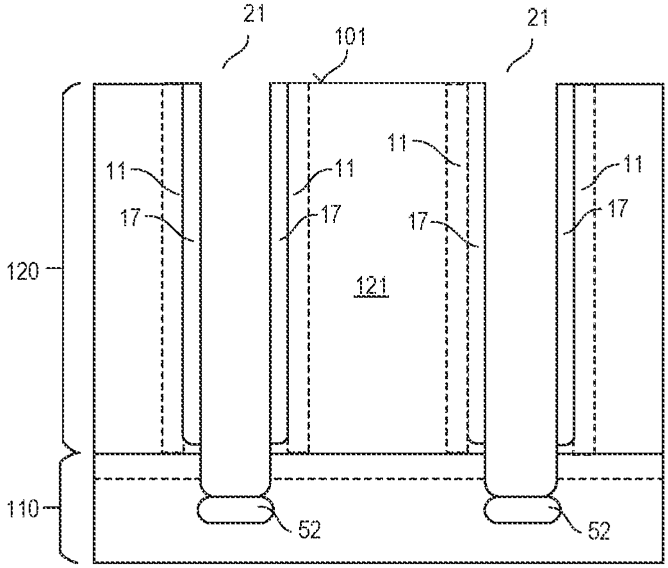

Referring to the above, the transistor cells 1 are implemented as superjunction transistor cells, wherein each of these transistor cells 1 includes at least one compensation region 17 of the second doping type. FIGS. 21A-21C illustrate one example of a method for forming compensation regions 17 along sidewalls of the trenches 21. According to this example, forming the compensation regions 17 includes implanting dopant atoms via sidewalls of the trenches 21 into the mesa regions 121 before closing the trenches 21. Each of FIGS. 21A-21C shows a vertical cross sectional view of one section of the semiconductor body 100 at different stages of the process.

Referring to FIG. 21A, the method includes at least one first implantation process in which dopant atoms of the second doping type are implanted via the first sidewalls $\mathbf{21}_1$ of the trenches 21 into the mesa regions 121 to form implanted regions 17* in the mesa regions 121 along the first sidewalls $\mathbf{21}_1$. Referring to FIG. 21A, an implantation mask 202 may be formed on top of the first surface 101 before the implantation process, wherein the implantation mask 202 is configured to prevent dopant atoms from being implanted into the first surface 101. According to one example, the implantation mask 202 is the same as the etch mask 201 (see FIG. 21A) used in the etching process for forming the trenches 21.

Referring to FIG. 21B, the method further includes at least one second implantation process in which dopant atoms of the second doping type are implanted into the mesa regions 121 via the second sidewalls $\mathbf{21}_2$ opposite the first sidewalls $\mathbf{21}_1$ of the trenches 21, so that implanted regions 17* are formed in the mesa regions 121 along the second sidewalls $\mathbf{21}_2$.

Referring to FIGS. 21A and 21B, the implanted regions 17*, in the vertical direction z, extend from the first surface 101 towards the first semiconductor layer 110. Dimensions of the implanted regions 17* in the vertical direction z are dependent on implantation angles used in the first and second implantation processes. The vertical dimensions of the implanted regions 17* can be adjusted by suitably selecting the implantation angles dependent on the widths of the trenches 21 and the thickness of the implantation mask 202. The thickness of the implantation mask 202 is the dimension of the implantation mask 202 in the vertical direction z. Basically, at a given width of the trenches 21 and a given thickness of the implantation mask 202, the smaller the implantation angle relative to the vertical direction z, the deeper the implanted regions 17* extend in the vertical direction z into the mesa regions 121. Referring to FIGS. 21A and 21B, the implantation angles may be adjusted such that the implanted regions 17* are spaced apart from the first semiconductor layer 110 in the vertical direction z. This, however, is only an example. According to another example, the implantation angles are adjusted such that the implanted regions 17* extend into the first semiconductor layer 110.

Referring to FIG. 21C, the method further includes an annealing process in which the implanted dopant atoms of the second doping type are activated, so that the compensation regions 17 are formed based on the implanted regions 17*. According to one example, the annealing process takes place at temperatures of between 1500° C. and 1800° C. This annealing process may take place directly after implanting the dopant atoms or may take place later in the manufacturing process, for example, after further implantation processes. The implantation doses in the first and second implantation process, dependent on the implantation angles, are adjusted such that the compensation regions 17 have a desired doping concentration. According to one example, doping concentrations of the compensation regions 17 are selected from between 5E16 $cm^{-3}$ and 2E18 $cm^3$.

In the first and second implantation processes according to FIGS. 21A and 21B, some of the dopant atoms may be scattered at the first and second sidewalls $\mathbf{21}_1$, $\mathbf{21}_2$, so that a portion of the dopant atoms may be scattered, wherein some of the scattered dopant atoms may end up in the first semiconductor layer 110 below the bottom of the respective trench 21. In FIG. 21A, reference number 51* denotes implanted regions that result from scattered dopant atoms in the at least one first implantation process. Reference number 52* in FIG. 21B denotes implanted regions that include scattered dopant atoms from the at least one first implantation process and scattered dopant atoms from the at least one second implantation process. In the annealing process according to FIG. 16C, regions 52 are formed in the first semiconductor layer 110 below the trench bottoms that include dopant atoms of the second doping type. These regions 52 result from scattered dopant atoms in the first and second implantation processes. According to one example, the doping concentration of the first doping type of the first semiconductor layer 110 is significantly higher than a doping concentration of dopant atoms of the second doping in regions 52. Thus the regions 52 have an effective doping concentration of the first doping type, so that the scattered dopant atoms of the second doping type do not negatively affect the functionality of the transistor device.

Figure 22A:
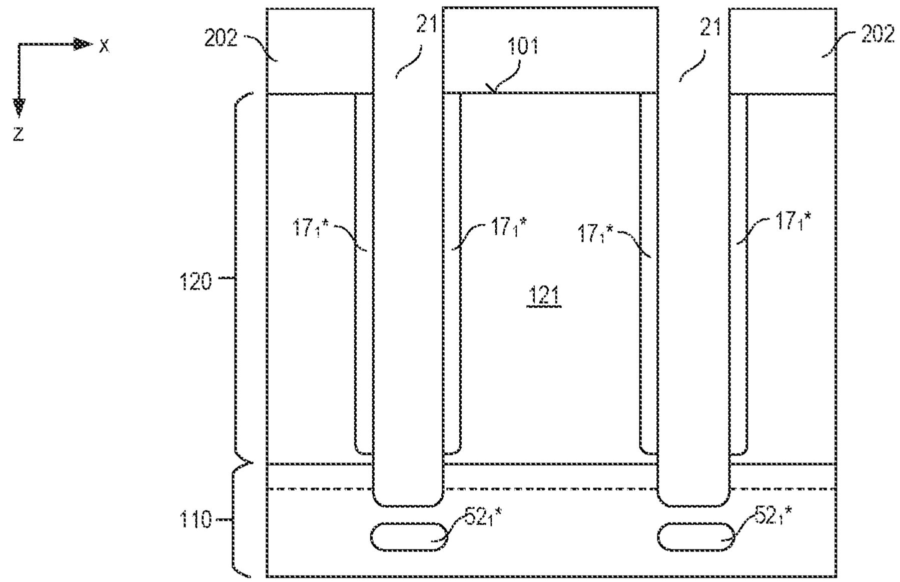
FIGS. 22A-22C illustrate a modification of the method according to FIGS. 21A-21C.
Figure 22B:
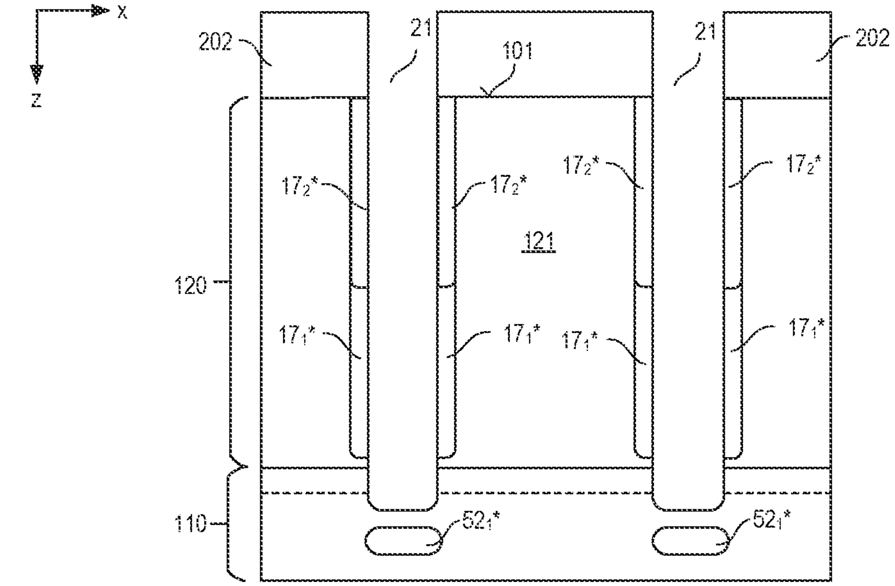
Figure 22C:
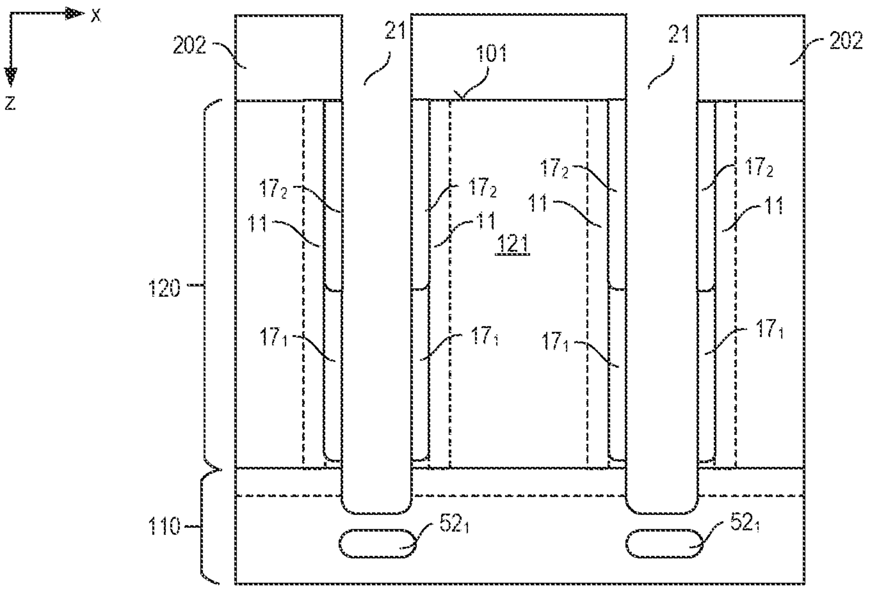

According to one example, forming the compensation regions may include forming the compensation regions 17 such that the compensation regions have different sections with different doping concentrations. According to one example, each of the compensation regions 17 have two different sections, a first section with a first doping concentration and a second section with a second doping concentration, wherein the first sections is closer to the first surface 101 and has a higher doping concentration than the second section. FIGS. 22A-22C illustrate one example of a method for forming the compensation regions 17 in this way.

Referring to FIG. 22A, the method includes forming first implanted regions $17_1$* along the first and second sidewalls $21_1$, $21_2$ of the trenches 21, wherein each of these implanted regions $17_1$* may be formed in accordance with the method explained with reference to FIGS. 21A and 21B.

Referring to FIG. 22B, the method further includes forming second implanted regions $17_2$* along each of the first and second sidewalls $21_1$, $21_2$, wherein these second implanted regions $17_2$* extend less deep in the vertical direction z than the first implanted regions $17_1$*. The second implanted regions $17_2$* include dopant atoms that are implanted in the process according to FIG. 22A and additional dopant atoms implanted in the implantation process according to FIGS. 22B, so that the second implanted regions $17_2$* include a higher dopant dose of second doping atoms than the first implanted regions $17_1$* below the second implanted regions $17_2$*.

After the annealing process illustrated in FIG. 22C, the compensation regions 17 each include two sections with different doping concentrations, first sections $17_1$ that include dopant atoms only from the implantation processes according to FIGS. 22A, and second sections $17_2$ that include dopant atoms from both, the implantation processes according to FIG. 17A and the implantation processes according to FIG. 22B. Of course, the order in which the implantation processes according to FIGS. 22A and 22B are performed can be changed, so that the implantation process according to FIG. 22B may take place before the implantation process according to FIG. 22A.

As explained with reference to FIGS. 3-6, 7A-7C, and 8A-8C, for example, the drift regions 11 of the transistor cells may be formed by sections of the second semiconductor layer 120 that have the basic doping of the second semiconductor layer 120. In this case, only second type dopant atoms are implanted into the mesa regions 121 to form the compensation regions 17, wherein the second type dopant atoms may be implanted in accordance with any of the methods according to FIGS. 21A-21C and 22A-22C.

According to other examples, illustrated in FIGS. 9A-9C, and 10-13, for example, the drift regions 11 of the transistor cells are doped regions formed in the second semiconductor layer 120. For forming drift regions 11 of this type, dopant atoms of the first doping type may be implemented via the trench sidewalls into the mesa region 121. The same type of process used for implanting the second type dopant atoms forming the compensation regions 17 may be used to implant the first type dopant atoms forming the drift regions 11. That is, any of the processes according to FIGS. 21A-21C and 22A-22C may be used to implant the first type dopant atoms for forming the drift regions 11. The first type dopant atoms forming the drift regions 11 may be implanted before or after implanting the second type dopant atoms forming the compensation regions 17. That is, in order to form transistor devices of the type shown in FIGS. 9A-9C, and 10-13 the methods according to FIGS. 21A-21C and 22A-22C can easily be adapted so that, in addition to implanting the second type dopant atoms for forming the compensation regions 17, first type dopant atoms for forming the drift regions 11 are implanted into the first and second sidewalls of the trenches 21. Drift regions 11 formed in this way are illustrated in dashed lines in FIGS. 21C and 22C.

In the examples shown in FIGS. 21C and 22C, each compensation region 17 is arranged between a respective trench 21 and a respective drift region 11. This, however, is only an example. According to another example (not shown) the drift regions 11 are formed such that each drift region 11 is arranged between a respective trench 21 and a respective compensation region 17.

Furthermore, in the examples shown in FIGS. 21C and 22C, each mesa region 121 includes two drift regions 11 that are spaced apart from each other in the first lateral direction x. This, however, is only an example. The width of the mesa region 121, in the first lateral direction x, may be small enough for the drift regions 11 to overlap so that there is one contiguous drift region 11 between two compensation regions 17. In the same way, one compensation region 17 between two drift regions 11 can be formed in each mesa region 121.

In addition to or alternatively to the second sections $17_2$ of the compensation regions 17 shown in FIG. 22C, gate regions 14J of JFET cells (see, FIGS. 12 and 13) may be formed by implanting second type dopant atoms via the first and second trench sidewalls into the mesa region 121.

The source and body regions 12, 13 of FET cells 1 may be formed by implanting dopant atoms via the first surface 101 into the mesa regions 121. These source regions 12 and the body regions 13 may be formed before or after forming the trench structure. Gate electrodes 14 and gate dielectrics 15 that are not arranged in the trenches of the trench structure 2, as illustrated in FIGS. 3-6, for example, may be formed by forming trenches in the mesa regions 121, forming the gate dielectrics 15 along bottoms and sidewalls of these trenches and filling the trenches with a gate electrode material in order to form the gate electrodes 14. A process of this type is commonly known, so that no further explanation is required in this regard.

According to one example, the gate electrodes 14 and gate dielectrics 15 according to FIGS. 3-6 are formed after implantation processes in which the source and body regions 12, 13 are formed. Equivalently, the optional JFET-regions 16 may be formed by implanting dopant atoms via the first surface 101 into the semiconductor body. Equivalently, the current spreading regions 19 according to FIGS. 7A-7C may be formed by implanting dopant atoms via the first surface 101 into the semiconductor body, wherein forming these current spreading regions 19 may include a masked implantation process, that is, an implantation process in which portions of the first surface 101 are covered so that the dopant atoms are only implanted into those regions in which the current spreading regions 19 are to be formed.

Referring to the processes illustrated in FIGS. 21A-21C and 22A-22C, the compensation regions 17 may be formed such that, they extend to the first surface 101. Forming transistor devices of the types shown in FIGS. 7A-7C and 9A-9C, for example, may include adjusting doping concentrations of the source and body regions 12, 13 such that they overcompensate sections of the compensation regions 17 in regions close to the first surface 101. In this case, the source and body regions 12, 13, in regions along the trenches 21 and, therefore, in regions along the gate dielectric 14 include dopant atoms that result from the respective implantation process for forming the source and body regions 12, 13 and that result from the implantation process for forming the compensation regions 17.

FIGS. 23A-23D illustrate one example of a method forming a superjunction device in which forming the compensation regions 17 does not affect the doping concentration of the source and body regions 12, 13, so that the doping of the source and body regions 12, 13 is only dependent on implantation processes for forming the source and body regions 12, 13. This method is based on the process explained with reference to FIGS. 18A-18E in which the gate electrode 14 and the gate dielectric 15 are formed in a gate trench 25 above the cavity 22 and is different from the method according to FIGS. 19A-19E in that forming the gate trenches 25 includes removing doped sections that include dopant atoms of the second type, wherein this dopant atoms of the second doping type result from implanting dopant atoms of the second doping type via the trench sidewalls into the mesa regions 121 in order to form the compensation regions. The method according to FIGS. 23A-23D results in gate trenches according to FIGS. 12A-12C that are wider than those trench sections accommodating the cavities.

Figure 23A:
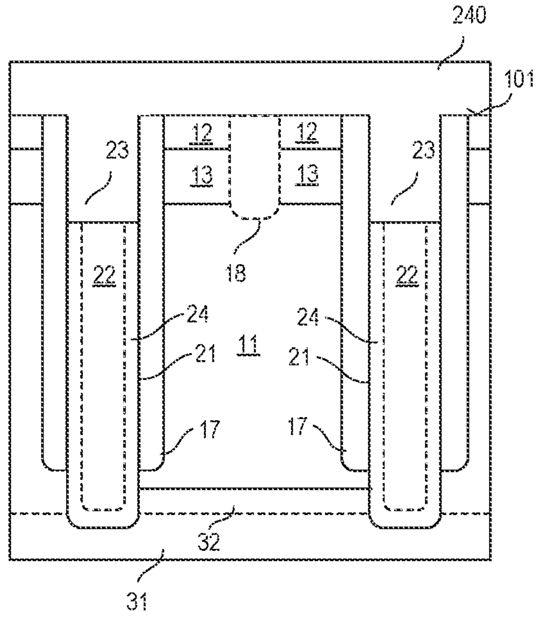
FIGS. 23A-23D illustrate one example of a method for forming gate electrodes and gate dielectrics in trenches of transistor cells according to FIGS. 12A-12C.

FIG. 23A shows a vertical cross sectional view of the semiconductor body 100 after forming the compensation regions 17 along sidewalls of the trenches and after forming the cavities 22 inside the trenches but before forming the gate electrodes 14 and gate dielectrics 15. Just for the purpose of illustration it is assumed that the source and body regions 12, 13 and the optional breakthrough regions 18 have been formed before forming the gate electrodes 14 and gate dielectrics. These regions 12, 13, 18 may be formed by implantation processes (a) before forming the compensation regions 17 and even before forming the trenches 21, (b) after forming the compensation regions 17 and before forming the gate electrodes 14 and gate dielectrics 15, or (c) after forming the gate electrodes 14 and gate dielectrics 15. As outlined above, forming any one of the doped regions may include a respective implantation process and an annealing process for activating the implanted dopant atoms. At least one annealing process is used, that is different annealing processes or a common annealing process may be used to activate the dopant atoms resulting from the different implantation processes. The at least one annealing process may take place before or after the process steps explained with reference to FIGS. 23A-23D.

In connection with FIGS. 23A-23D "compensation region 17" denotes any region that includes dopant atoms of the second doping type introduced into the semiconductor body 100 in a sidewall implantation process in accordance with any of the processes according to FIGS. 21A-21C or 22A-22C. Thus, a compensation region 17 as used in connection with FIGS. 23A-23D may include further dopant atoms, such as dopant atoms resulting from implantation process for forming the source and body regions 12, 13. Furthermore, at the time of processing the device in accordance with the method according to FIGS. 23A-23D, the compensation region 17 as used in connection with FIGS. 23A-23D may already have been annealed or may be annealed at a later stage.

In FIG. 23A, reference number 240 denotes a plug layer that forms the plugs 23 closing the cavities inside the trenches and that covers the first surface 101. This plug layer may correspond to the combination of layers 231 and 234 explained with reference to FIG. 16F.

Figure 23B:
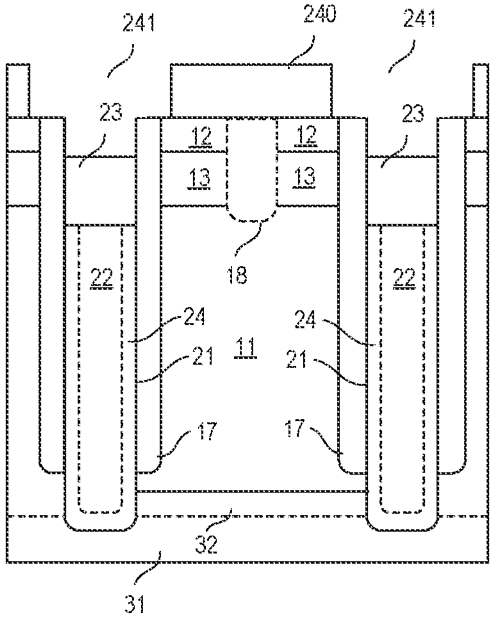
Figure 23C:
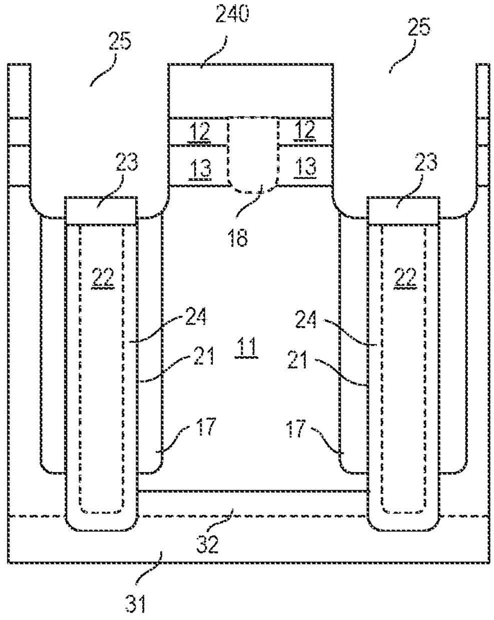

Referring to FIGS. 23B and 23C, the method includes forming the gate trenches 25 such that the gate trenches 25 are wider than the trenches 21 of the trench structure 2. Furthermore, forming the gate trenches 25 includes removing the compensation regions 17 in those regions in which the gate trenches 25 are formed, so that, in the finished device, sidewalls of the gate trenches adjoin the source and body regions 12, 13 (which may already have been formed at the time of forming the gate trenches 25 or which may be formed later).

Referring to FIG. 23B, forming the gate trenches 25 may include forming openings 241 in the plug layer 240 above the trenches 21 such that the openings uncover those sections of the first surface 101 below which the compensation regions 17 have been formed. Forming the openings 241 may also include partially removing plug material from the trenches 21, wherein sections of the plug material that form the plugs 23 in the finished device remain. Forming the openings may include forming an etch mask (not shown) on top of the plug layer and etching the plug layer 240 using the etch mask.

Referring to FIG. 23C, forming the gate trenches 25 further includes an anisotropic etching process that etches those sections of the semiconductor body 100 that are not covered by the plug layer 240, so that the compensation regions 17 are removed along the gate trenches. This etching process may also partially remove the plugs 23, so that the plugs 23 may have a reduced thickness after the etching process, but still close the cavities 22.

Figure 23D:
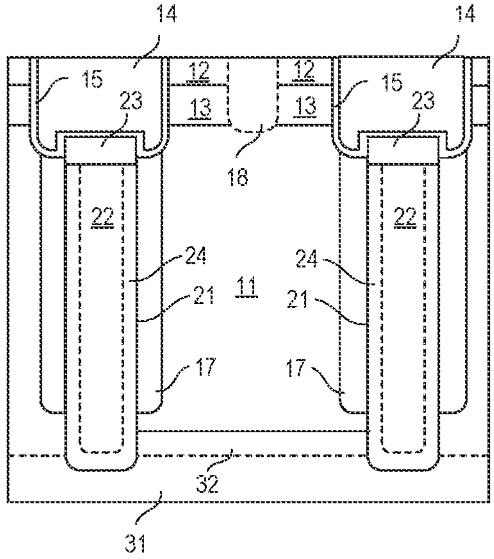

Referring to FIG. 23D, the method further includes forming the gate dielectrics 15 and the gate electrodes 14 in the gate trenches 25. The gate dielectrics 15 and the gate electrodes 14 may be formed in accordance with the method steps explained with reference to FIGS. 18C-19E.

Referring to FIG. 23D, the body regions 13 are formed such that sections of the drift region 11 adjoin the gate trenches between the body regions 13 and the compensation regions 17. Thus, the body regions 13, which are connected to the source node S (not shown in FIG. 23D, are spaced apart from the compensation regions 17, so that the compensation regions 17 are not connected to the source node S via the body regions 13.

In transistor cells of the type shown in FIGS. 8A-8D that include several compensation regions 17 that are spaced apart from each other in the second lateral direction y, the compensation regions 17 can be formed by a process that is based on any one of the processes illustrated in FIGS. 21A-21C and 22A-22C, wherein the implantation mask 202 is formed such that it partially covers the trenches 21, so that in the implantation process dopant atoms of the second doping type are implanted only into sidewalls of those sections that are not covered by the implantation mask 202. A top view of an implantation mask 202 of this type is illustrated in FIG. 24.

Figure 24:
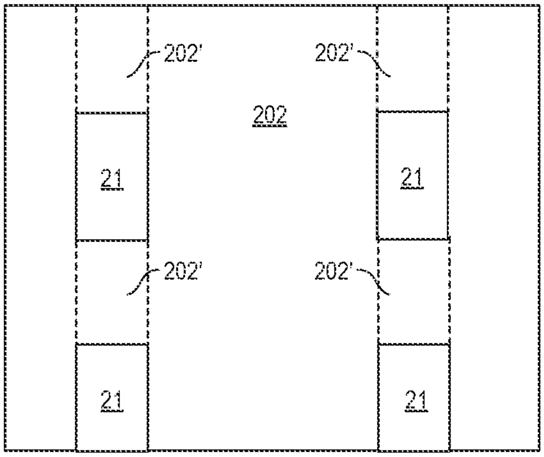
FIG. 24 shows a top view of an implantation mask that may be used in a process of forming compensation regions of transistor cells according to FIGS. 8A-8D.

In FIG. 24, reference numbers 202' denote those sections of the implantation mask that cover sections of the trench 21. The dashed lines illustrate the position of the trenches below the implantation mask 202.

Referring to the above, the transistor device can be operated in an on-state and an off-state. In the off-state, the transistor device is driven such that a conducting current path between the source node S and the drain node D is interrupted. A MOSFET can be operated in the off-state by driving the gate electrodes 14 such that conducting channels in the body regions 13 are interrupted and by applying a voltage between the drain node D and the source node S that reverse biases pn junctions between the body regions 13 and the drift regions 11 (applying a voltage between the drain node D and the source node S that forward biases the pn junctions between the body regions 13 and the drift regions

11 would cause the MOSFET to conduct independent of a voltage applied to the gate node G). A JFET can be operated in the off-state by driving the gate regions 14J such that channel regions 11' of the drift regions 11 are pinched off.

In a MOSFET and a JFET, in the off-state, when a voltage is applied between the drain node D and the source node S depletion regions (space charge regions) expand in the drift and compensation regions 11, 17. Such depletion regions are associated with an electric field. An Avalanche breakdown may occur when the voltage applied between the drain node D and the source node S is such that a magnitude of the electric field reaches a critical value. This critical value, inter alia, is dependent on the type of semiconductor material of the semiconductor body 100 and doping concentrations of the drift and compensation regions 11, 17.

According to one example, the superjunction transistor device is designed such that a voltage blocking capability in the inner region 130 is lower than in the edge region 140 so that an Avalanche breakdown, if there is one, occurs in the inner region 130, which has a greater area (and volume) than the edge region 140. According to one example, this is achieved by implementing the transistor device such that (a) an area specific dopant dose of first type dopant atoms in the drift and compensation regions 11, 17 is lower in the edge region 140 than in the inner region 130; and (b) an area specific dopant dose of second type dopant atoms in the drift and compensation regions 11, 17 is lower in the edge region 140 than in the inner region 130. The "area specific dopant dose", is given by the overall amount of dopant atoms in a certain section (a certain volume) of the transistor device divided by the area in the horizontal plane of the certain section. This is explained in detail, herein further below.

The drift regions 11 have an effective doping concentration of the first doping type, and the compensation regions 17 have an effective doping concentration of the second doping type. Nevertheless, the drift regions 11 may also include second type dopant atoms, and the compensation regions 17 may also include first type dopant atoms, so that for obtaining the respective area specific dopant dose first type dopant atoms in the drift and compensation regions 11, 17 and second type dopant atoms in the drift and compensation regions 11, 17 are considered. The ratio (balancing) between the amount of first type dopant atoms and second type dopant atoms in the drift and concentration regions 11, 17 has a significant effect on the voltage blocking capability. According to one example, the amount of first type dopant atoms in the drift and compensation regions 11, 17 is between 90% and 110% of the amount of second type dopant atoms in the drift and compensation regions 11, 17.

One example for implementing the drift regions 11 in the edge region 140 with a lower area specific dopant dose than in the inner region 130 is explained with reference to FIG. 25.

Figure 25:
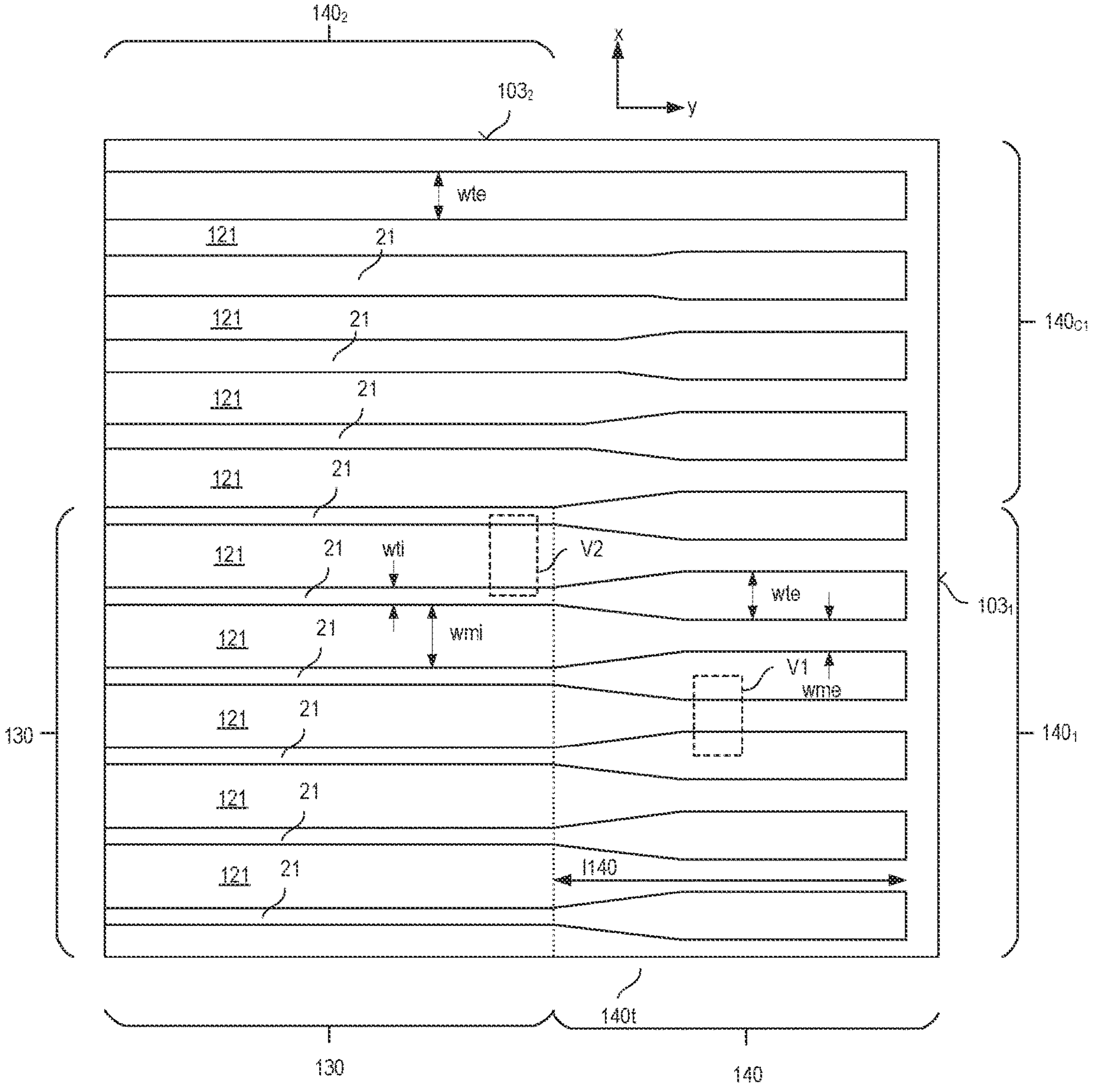
FIG. 25 illustrates one example of a trench structure in which trenches of trench sections in an edge region are wider than in an inner region, so that mesa regions are narrower in the edge region than in the inner region.

FIG. 25 shows a top view of one section of the semiconductor body 100. FIG. 25 shows a section of the inner region 130, a first edge region section 140$_1$ arranged, in the second lateral direction y, between the inner region 130 and a first section 103$_1$ of the edge surface 103; a second edge region section 140$_2$ arranged, in the first lateral direction x, between the inner region 130 and a second section 103$_2$ of the edge surface 103; and a first corner section 140$_{C1}$ arranged in the edge region between the first and second edge region sections 140$_1$, 140$_2$. In addition to the first and second edge region sections 140$_1$, 140$_2$ and the first corner section 140$_{C1}$, the transistor device further includes: a third edge region section arranged, in the second lateral direction y, between the inner region 130 and a third section of the edge surface 103 opposite the first section 103$_1$; a fourth edge region section arranged, in the first lateral direction x, between the inner region 130 and a fourth section of the edge surface 103 opposite the second section 103$_1$; a second corner section arranged between the second edge region section 140$_2$ and the third edge region section; a third corner section arranged between the third edge region section and the fourth edge region section; and a fourth corner section arranged between the fourth edge region section and the first edge region section 140$_1$. These further edge region sections and corner sections, however, are out of view in FIG. 25. Everything explained with regard to the first edge region section 140$_1$ applies to the third edge region section accordingly, everything explained with regard to the second edge region section 140$_2$ applies to the fourth edge region section accordingly, and everything explained with regard to the first corner section 140$_{C1}$ applies to the second, third, and fourth corner sections accordingly.

It should be noted that the processes explained before, such as processes for forming the trench structure, implanting dopant atoms, forming gate structure, or the like, may take place on a wafer level. That is, a plurality of semiconductor bodies 100 can be processed at once by being part of a wafer that includes a plurality of semiconductor bodies 100. The wafer is divided at a later stage of the manufacturing process in order to form a plurality of semiconductor bodies 100. Edge surfaces 103 of the individual semiconductor bodies 100 are formed by dividing the wafer into the individual semiconductor bodies 100. Thus, at the manufacturing stage illustrated in FIG. 25, the edge surface 103 may not have been formed, yet. In the following, "edge surface" either includes an edge surface that has already been formed or that will be formed at a later stage.

FIG. 25 shows a section of the semiconductor body 100 after forming the trench structure with the trenches 21. In this example, the mesa regions 121 have a doping concentration that corresponds to the basic doping concentration of the second semiconductor layer 120. In the finished device, sections of the mesa regions 121 that have the basic doping concentration of the second semiconductor layer 120 form the drift regions 11.

Referring to FIG. 25, the area specific dopant dose of the first type dopant atoms can be reduced by implementing the trenches 21 such that the trench width increases in the edge region 140 towards the edge surface 103. This may include that in the first edge region section 140$_1$ the trenches 21 widen towards the first edge region section 103$_1$. Furthermore, this may include that in the second edge region section 140$_2$ the trenches widen towards the second edge surface section 103$_2$. In the first corner section 140$_{C1}$ the trenches may widen both towards the first edge region section 103$_1$ and the second edge region section 103$_2$.

In the example shown in FIG. 25, in the edge region 140, the trench width of the trenches 21 increase from a first value wti, which corresponds to the trench width in the inner region 130, to a second value wte, which is the maximum trench width in the edge region. According to one example, in the second lateral direction y, there is a transition region 140*t* in which the trench width continuously increases, wherein the trenches have the second width wte between the transition region 140*t* and the edge surface 103. According to one example, a length of the transition region is between 10% and 100%, in particular between 10% and 30%, of a length 1140 of those sections of the trenches that are located in the edge region 140.

In the second lateral direction x, in which the trenches are spaced apart from each other, the trench width, in the edge region 140, may increase in discrete steps. At least an outermost trench 21 may have the second width wte. The "outermost trench" is that one of the trenches 21 that is located closest to the edge surface 103.

In the same way as the width of the trenches 21 increases, the width of the mesa regions 121 decreases in the edge region 140. The width of the mesa regions 121 has a first value wmi in the inner region 130. In the edge region 140, the mesa width increases from the first value wmi to a second value wme. According to one example, the increase of the trench width in the edge region is such that the second value wme of the width of the mesa regions 121 is between 30% and 90% of the first value wmi, so that a maximum width of the mesa regions 121 in the edge region 140 is between 30% and 90% of the width of the mesa regions 121 in the inner region 130.

Figure 26:
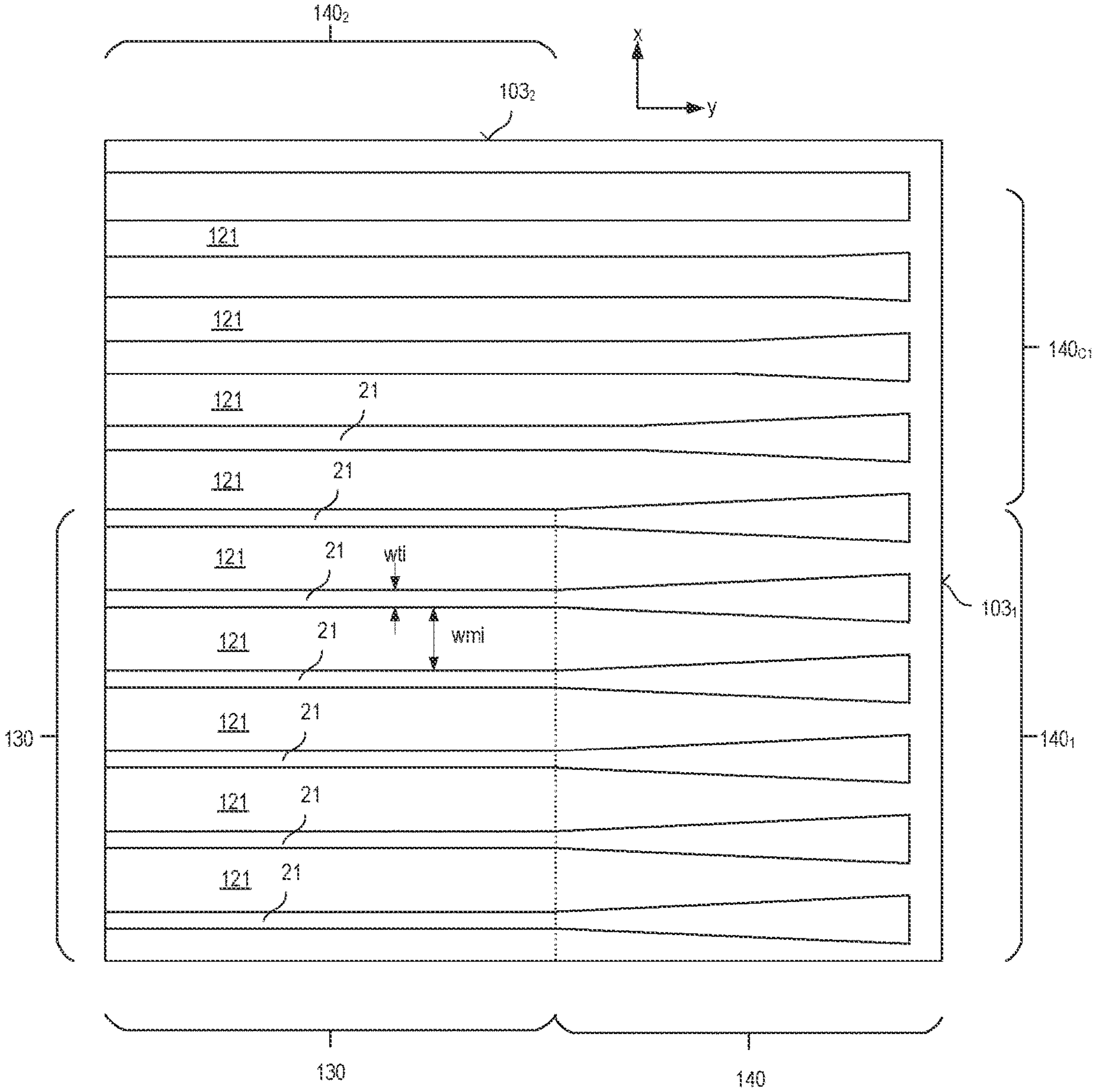
FIG. 26 illustrates a modification of the example shown in FIG. 25.

FIG. 26 illustrates a modification of the example shown in FIG. 25. The example shown in FIG. 26 is different from the example shown in FIG. 25 in that the transition region 140*t*, in the second lateral direction y, extends from the inner region 130 to longitudinal ends of the trenches 21. In this example, the trench width has the second value wte only at the longitudinal end. Thus, the trench width of each trench 21 extending from the inner region 130 into the edge region 140 continuously increases throughout the edge region 140 to reach the second value wte at the longitudinal end. Consequently, the width of each mesa region 121 extending from the inner region 130 into the edge region 140 continuously increases throughout the edge region 140 to reach the second value wme between longitudinal ends of neighboring trenches 21.

The dopant atoms that form the basic doping of the mesa regions 121 form the first type dopant atoms in the drift regions 11 and in the compensation regions 17 of the finished device, wherein the first type dopant atoms in the compensation regions 17 are overcompensated by implanted second type dopant atoms at a later stage of the manufacturing process. In the inner region 130, sections of the mesa regions 121 that are located close to the first surface 101 are doped using additional first type dopants or second type dopants to form source regions 12, body regions 13, optional JFET regions 16, or gate regions 14J. A volume of these regions 12, 13, 16, is very small as compared to the volume of the mesa regions 121 in the inner region 130.

By decreasing the mesa width in the edge region 140 as compared to the inner region 130 the area specific dopant dose of first type dopant atoms in the mesa regions 121 is lower in the edge region 140 than in the inner region 130. Thus, the area specific dopant dose of first type dopant atoms in the drift and compensation regions 11, 17 of the finished device is lower in the edge region 140 than in the inner region 130. The "area specific dopant dose" is the overall amount of dopant atoms in a certain volume divided by the area of the volume in the horizontal plane (the plane defined by the first and second lateral directions x, y).

According to one example, the area specific dopant dose of first type dopant atoms in the inner region 130 is given by the overall amount of first type dopant atoms resulting from the basic doping of the mesa regions 121 (the second layer 120) in the inner region 130 divided by the area of the inner region 130, and the area specific dopant dose of first type dopant atoms in the edge region 140 is given by the overall amount of first type dopant atoms resulting from the basic doping of the mesa regions 121 (the second layer 120) in the edge region 140 divided by the area of the edge region 140. It can be assumed that the doping concentration of the second semiconductor layer 120 is essentially the same in the inner region 130 and the edge region 140 and that the thickness of the second semiconductor layer 120 is essentially the same in the inner region 130 and the edge region 140. Furthermore, the volume of the source and body regions 12, 13 or gate regions 14J is very low as compared to the volume of the mesa region 121. It can therefore be assumed that the vast majority of the first type dopant atoms resulting from the basic doping of the mesa regions 121 is included in the drift and compensation regions 11, 17. Thus, it can be assumed that the overall amount of first type dopant atoms in the drift and compensation regions 11, 17 is proportional to the overall area of the mesa regions 121 in the horizontal plane. The area specific dopant dose of first type dopant atoms in the inner region 130 is proportional to an overall area A121*i* of the mesa regions 121 in the inner region 130 divided by an area A130 of the inner region 130. Equivalently, the area specific dopant dose in the edge region 140 is proportional to an overall area A121*e* of the mesa regions 121 in the edge region 140 divided by an area A140 of the inner region 130. Due to the wider trenches, in the edge region 140 the area specific dopant dose of first type dopant atoms is lower in the edge region 140 than in the inner region 130.

Calculating the area specific dopant dose of the edge region 140 based on the overall amount of first type dopant atoms in the edge region 140 and the area (size) of the edge region 140 results in a global area specific dopant dose which does not consider local variations.

According to another example, the area specific dopant dose in the edge region 140 is given by the overall amount of first type dopant atoms resulting from the basic doping of the second layer 120 in a first volume divided by the area (size) of the first volume in the horizontal plane, and the area specific dopant dose in the inner region 130 is given by the overall amount of first type dopant atoms resulting from the basic doping of the second layer 120 in a second volume divided by the area (size) of the second volume in the horizontal plane. The first volume is located in the edge region 140, the second volume is located in the inner region 130. Furthermore, the first and second volumes have the same area in the horizontal plane and are located at comparable positions. According to one example, the first and second volumes are selected such that, in the first lateral direction x, they extend, from the middle of one trench 21 across a mesa region 121 to the middle of a neighboring trench 21, and, in the second lateral direction y, the first and second volumes have the same dimension. Examples of first and second volumes V1, V2 selected in this way are illustrated in dashed lines.

Obtaining the area specific dopant dose in the edge region 140 based on the first volume V1 may have the effect, that the area specific dopant dose of first type dopant atoms locally varies dependent on where the first volume V1 is located. In each case, due to the wider trenches in the edge region 140, the area specific dopant dose of first type dopant atoms in the edge region 140 is lower than in the inner region 130. If, for example, the minimum mesa width in the edge region 140 is 30% of the mesa width in the inner region 130, the area specific dopant dose in the edge region 140 varies between 30% and slightly less than 100% of the area specific dopant dose in the inner region 130.

Referring to FIG. 16A, forming the trenches 21 may include forming an etch mask on top of the first surface 101, wherein this etch mask 201 may be used as an implantation mask in the process of implanting the second type dopant atoms for forming the compensation regions. Thus, after forming the trenches 21 the etch mask may remain in place until after the implantation process. Just for the ease of illustration, the etch mask 201 is not shown in FIGS. 25 and 26.

Referring to the above, forming the compensation regions 17 includes implanting second type dopant atoms via sidewalls of the trenches 21 into the mesa regions 121. In some of the examples explained above, such as the examples illustrated in FIGS. 3-6, 7A-7C, or 9A-9C the compensation regions 17 are contiguous regions. That is, in the inner region 130, each compensation region 17, in the second lateral direction y, extends along an entire trench sidewall. In this example, a lower area specific dopant dose of the second type dopant atoms in the edge region 140 can be achieved by forming a further implantation mask 301 on top of the implantation mask 202 (see, e.g., FIGS. 21A and 21B) covering the mesa regions 121.

According to one example, the area specific dopant dose of second type dopant atoms in the inner region 130 is given by the overall amount of second type dopant atoms implanted via the trench sidewalls into the mesa regions 121 for forming the compensation regions 17 divided by the area of the inner region 130. Equivalently, the area specific dopant dose of second type dopant atoms in the edge region 140 is given by the overall amount of second type dopant atoms implanted via the trench sidewalls into the mesa regions 121 for forming the compensation regions 17 divided by the area of the edge region 140.

Calculating the area specific dopant dose of the edge region 140 based on the overall amount of second type dopant atoms in the edge region 140 and the area (size) of the edge region 140 results in a global area specific dopant dose which does not consider local variations.

According to another example, the area specific dopant dose in the edge region 140 is given by the overall amount of second type dopant atoms implanted into a first volume divided by the area (size) of the first volume in the horizontal plane, and the area specific dopant dose in the inner region 130 is given by the overall amount of second type dopant atoms implanted into a second volume divided by the area (size) of the second volume in the horizontal plane. The first volume is located in the edge region 140, the second volume is located in the inner region 130. Furthermore, the first and second volumes have the same area in the horizontal plane and are located at comparable positions. According to one example, the first and second volumes are selected such that, in the first lateral direction x, they extend, from the middle of one trench 21 across a mesa region 121 to the middle of a neighboring trench 21, and, in the second lateral direction y, the first and second volumes have the same dimension. Examples of first and second volumes V1, V2 selected in this way are illustrated in dashed lines.

Obtaining the area specific dopant dose of second type dopant atoms in the edge region 140 based on the first volume V1 may have the effect, that the area specific dopant dose locally varies dependent on where the first volume V1 is located. In each case, due to the wider trenches in the edge region 140, the area specific dopant dose in the edge region 140 is lower than in the inner region 130. If, for example, the minimum mesa width in the edge region 140 is 30% of the mesa width in the inner region 130, the area specific dopant dose of second type dopant atoms in the edge region 140 varies between 30% and slightly less than 100% of the area specific dopant dose in the inner region 130.

Figure 27:
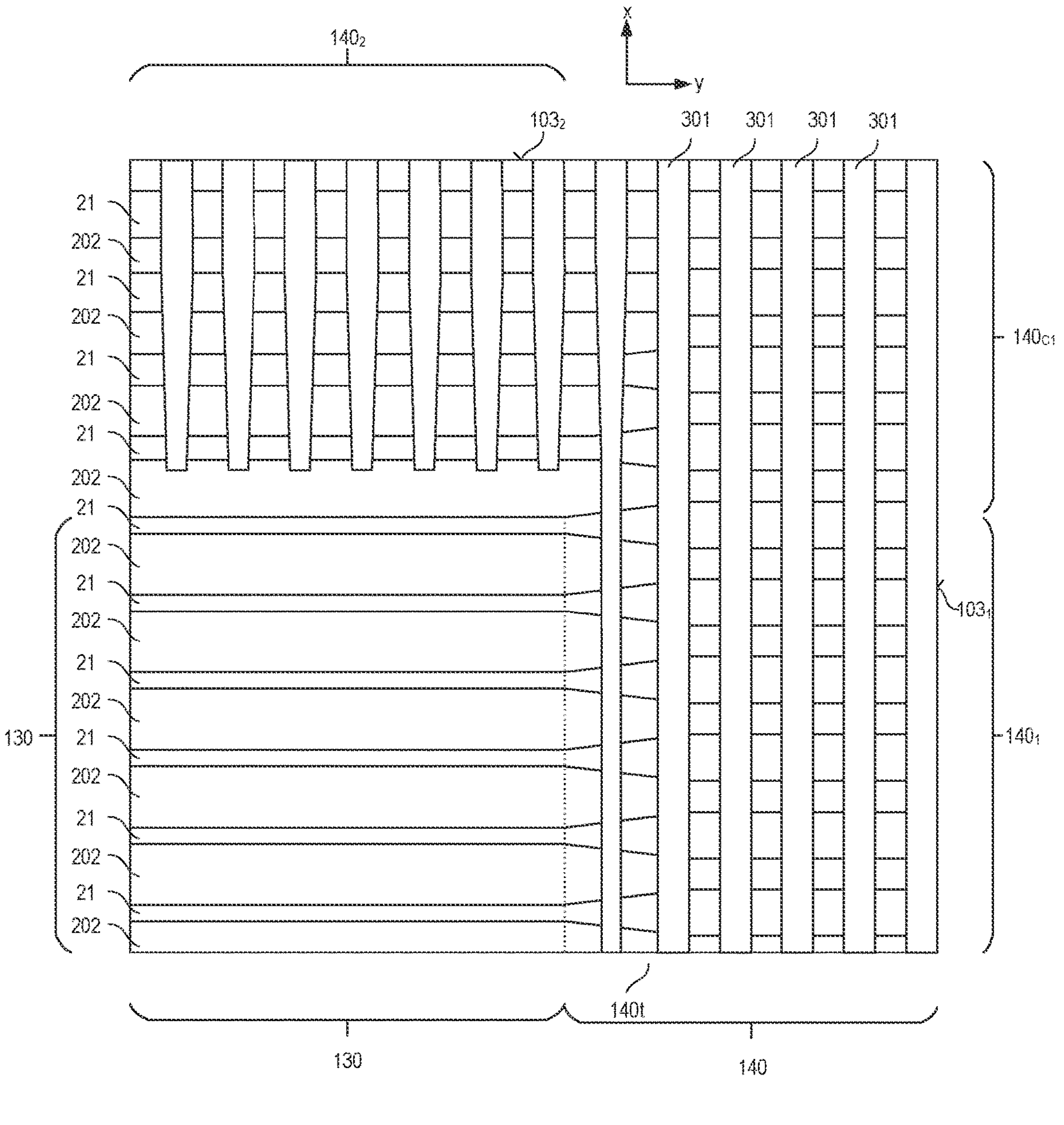
FIG. 27 illustrates one example of an implantation mask that covers trench sections in the edge region.

FIG. 27 shows a top view of the semiconductor body after forming the further implantation mask 301 on top of the implantation mask 202 covering the mesa regions 121. Referring to the above, the implantation mask 202 covering the mesa regions 121 may be the same as the etch mask 201 used for forming the trenches 21.

As can be seen from FIG. 27, the further implantation mask 301 includes a plurality of elongated mask sections, which are referred to as stripes in the following. The stripes 301 are spaced apart from each other in the second lateral direction y. According to one example, the stripes 301 are essentially perpendicular to the trenches 21 and mesa regions 121. Each of the stripes 301 has a width, which is a dimension of the respective stripe in the second lateral direction y, and a length, which is a dimension of the respective stripe in the first lateral direction x. According to one example, center distances of the stripes 301 and their widths are adapted to the widths of the mesa regions 121. This is explained in the following.

According to one example, the mesa width at a certain position in the edge region 140 is p times the mesa width in the inner region 130, where $0<p<1$. In this case, the center distances of the stripes 301 and their respective widths are adapted to one another such that, at the certain position in the edge region 140, a ratio q between trench sections not covered by the stripes 301 and trench sections covered by the stripes is dependent on p. According to one example, q is between 0.9 times and 1.1 times p ($0.9p \leq q \leq 1.1p$). Thus, if the mesa width at a certain position in the edge region 140 is 60% of the mesa width in the inner region 130, the stripes 301, at the certain position, do not cover between 54% ($=0.9 \cdot 60\%$) and 66% (($=1.1 \cdot 60\%$)) of the trenches 21, or cover between 46% and 34% of the trenches 21. In this way, a desired ratio between the amount of first type dopant atoms and the amount of second type dopant atoms can be achieved.

Referring to FIG. 27, adapting the center distances and the width of the stripes 301 to the mesa widths may include using a fixed center distance and increasing the widths of the stripes 301 towards the edge surface 103.

In the example shown in FIG. 27, the further implantation mask 301 is only arranged in the edge region. This, however, is only an example. According to another example illustrated in FIG. 28 the further implantation mask 301 is also arranged on top of the inner region 130, in order to form a transistor device of the type shown in FIGS. 8A-8C, in which the compensation regions 17 include several segments that are spaced apart from each other in the second lateral direction y. The widths of the stripes 301 are smaller in the inner region 130 than in the edge region 140. Thus, an overall portion of the inner region 130 covered by the further implantation mask 301 is lower than an overall portion of the edge region 140 covered by the further implantation mask 301, and the area specific dopant dose of second type dopant atoms in the inner region 130 is higher than the area specific dopant dose of second type dopant atoms in the edge region 140.

Figure 29A:
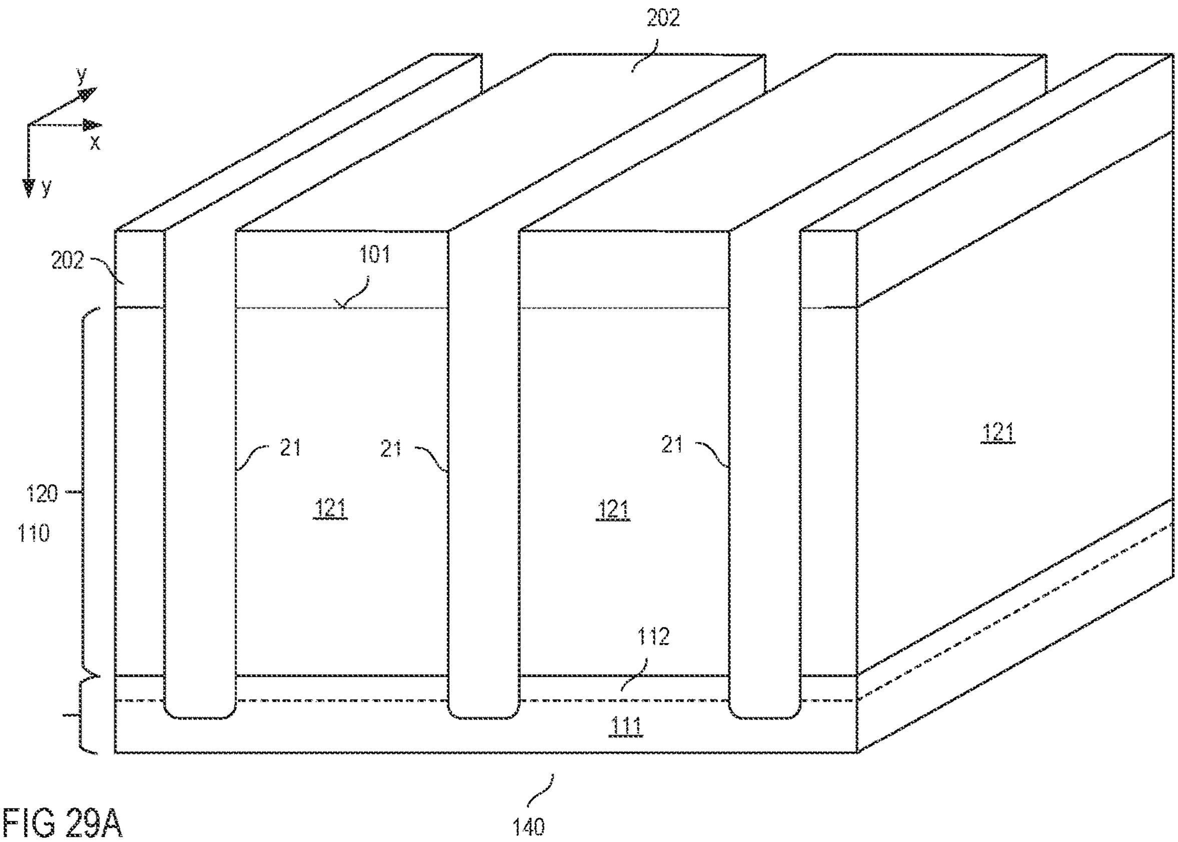
FIGS. 29A-29D illustrate one example of a method for forming an implantation mask of the type shown in FIG. 27 or 26.

FIGS. 29A-29D illustrate one example of a method for forming the further implantation mask 301, wherein each of FIGS. 29A-29D show a perspective sectional view of one section of the semiconductor body 100 in the edge region 140. FIG. 29A illustrates the semiconductor body 100 after forming the trenches 21 and forming the first implantation mask 202, which may be the same as the etch mask 201 used for forming the trenches 21.

Figure 29B:
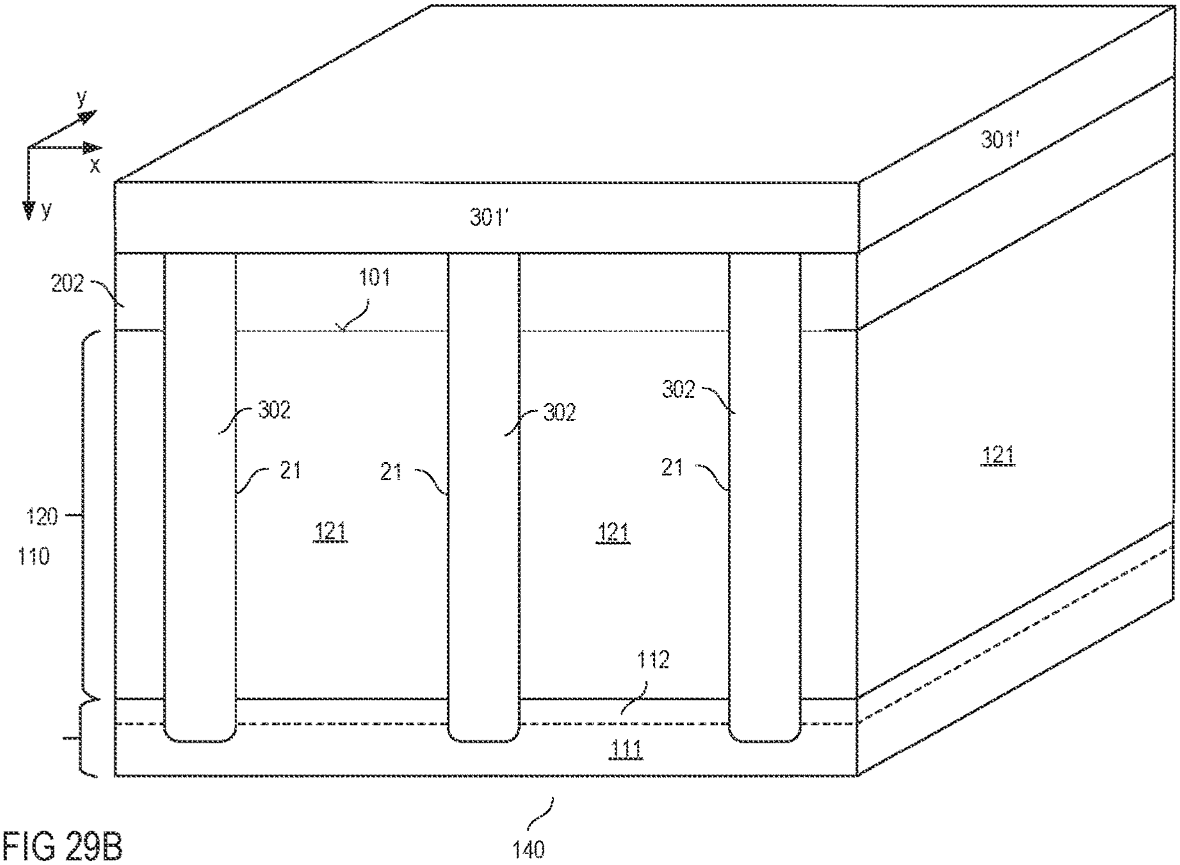

Referring to FIG. 29B, the method further includes filling trenches that extend down from an upper surface of the implantation mask 202 into the semiconductor body 100 with a sacrificial material 302, and forming an implantation mask layer 301' on top of the surface formed by the implantation mask 202 and the sacrificial material 302. The sacrificial material 302 includes polysilicon or carbon, for example. The implantation mask layer 301' may include any material suitable for forming an implantation mask such as, for example, an oxide, a nitride, polysilicon, or carbon. It is also possible that the implantation mask layer 301' includes a layer stack with two or more layers each include one of these materials.

Figure 29C:
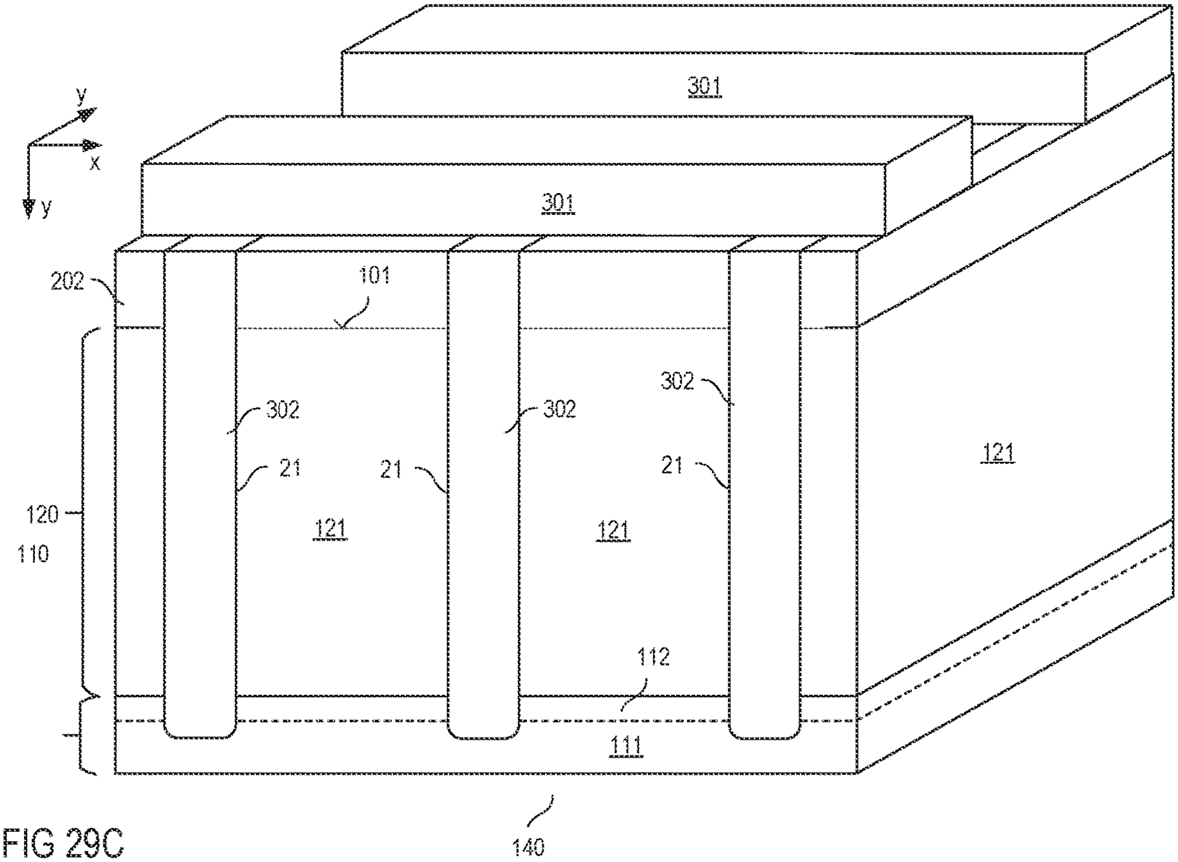

Referring to FIG. 29C, the method further includes patterning the implantation mask layer 301' to form the stripes 301. Any suitable kind of lithographic process can be used to pattern the implantation mask layer 301' and form the stripes 301.

Figure 29D:
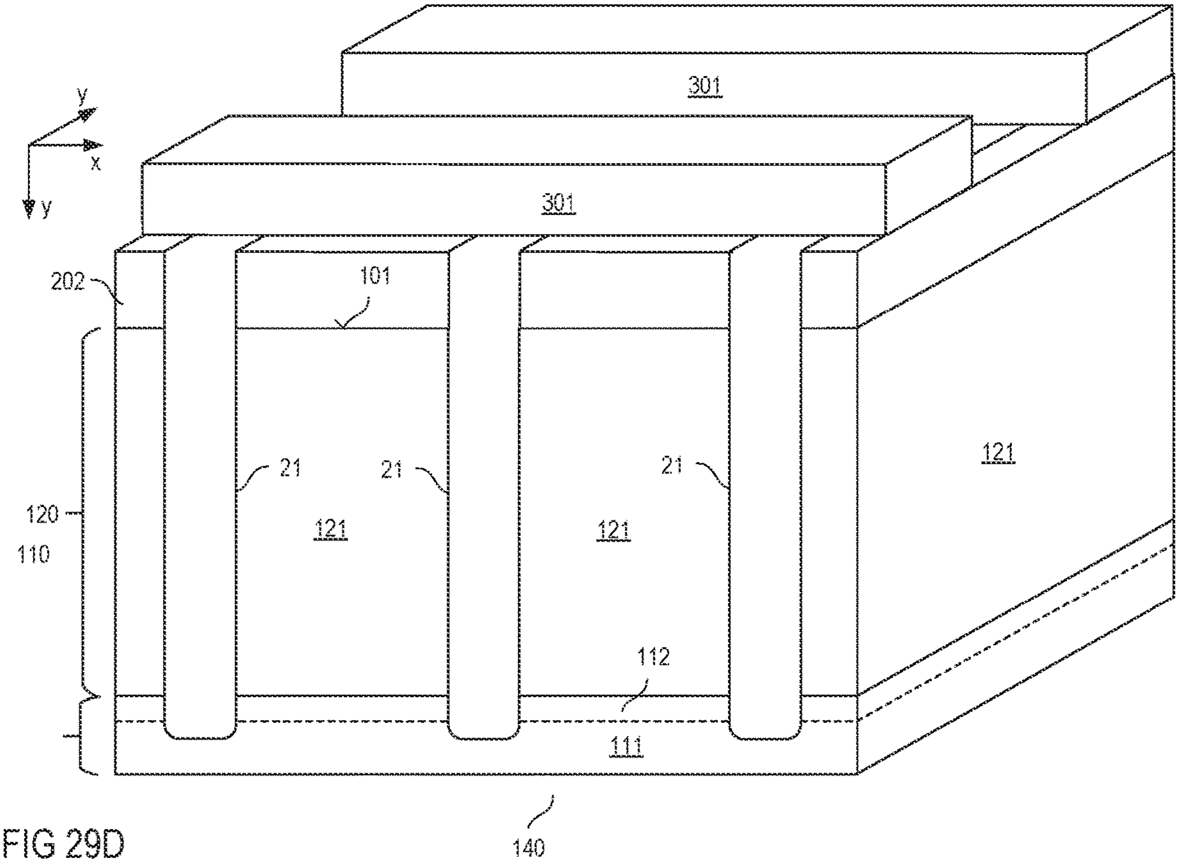

Referring to FIG. 29D, the method further includes removing the sacrificial material 302 from the trenches 21. The method used for removing the sacrificial material 302 is dependent on the sacrificial material 302'. Polysilicon as the sacrificial material 302', for example, may be removed using an isotropic etching process that etches polysilicon selectively relative to the implantation masks 202, 301 and the semiconductor body. Carbon as the sacrificial material 302', for example, may be removed by ashing using an oxygen plasma process.

Figure 30:
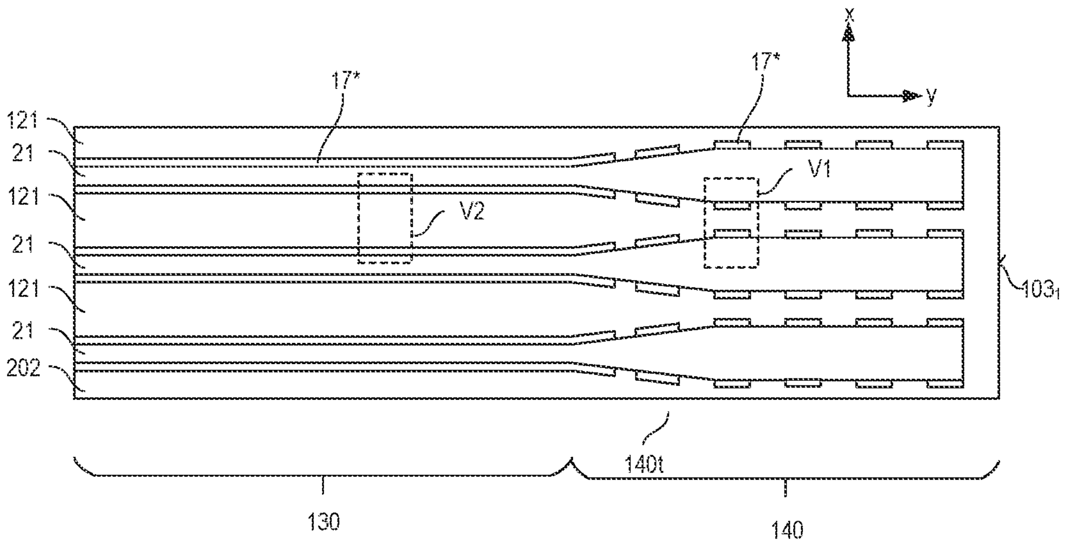
FIG. 30 shows a top view of one section of the semiconductor body after implanting dopant atoms into sidewalls of the trenches using an implantation mask of the type shown in FIG. 27 or 26.

FIG. 30 illustrates a top view of one section of the semiconductor body 100 after forming implanted region 17* in the inner region 130 and the edge region 140 using a further implantation mask 301 of the type shown in FIG. 27. As can be seen from FIG. 30, using the further implantation mask 301 has the effect that in the edge region 140 sections of the mesa regions 121 that are covered by the further implantation mask 301 during the implantation process do not include implanted regions 17*. Thus, the area specific dopant dose of second type dopant atoms in the first volume V1 in the edge region 140 is lower than the area specific dopant dose of second type dopant atoms in the second volume V2 in the inner region.

Figure 31:
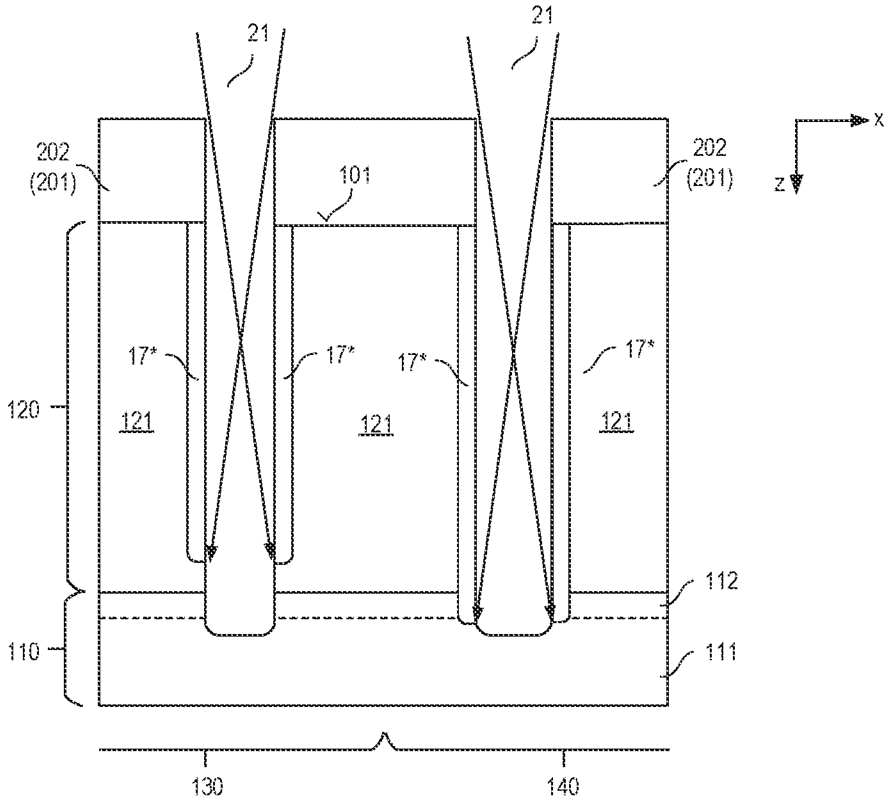
FIG. 31 illustrates a vertical cross sectional view of trenches in the inner region and the edge region during the implantation process.

FIG. 31 shows a vertical cross sectional view of one trench in the inner region 130 and one trench in the edge region 140 during the implantation process. Referring to the above, trenches or trench sections located in the edge region 140 are wider than trenches or trench sections located in the inner region 130. This has the effect that, at a given implantation angles, the implanted regions 17* in the edge region 140 may extend into the first layer 110. This may help to reduce the on resistance (and, at the same time, reduce the voltage blocking capability) in the inner region 130 and increase the voltage blocking capability in the edge region 140.

Figure 28:
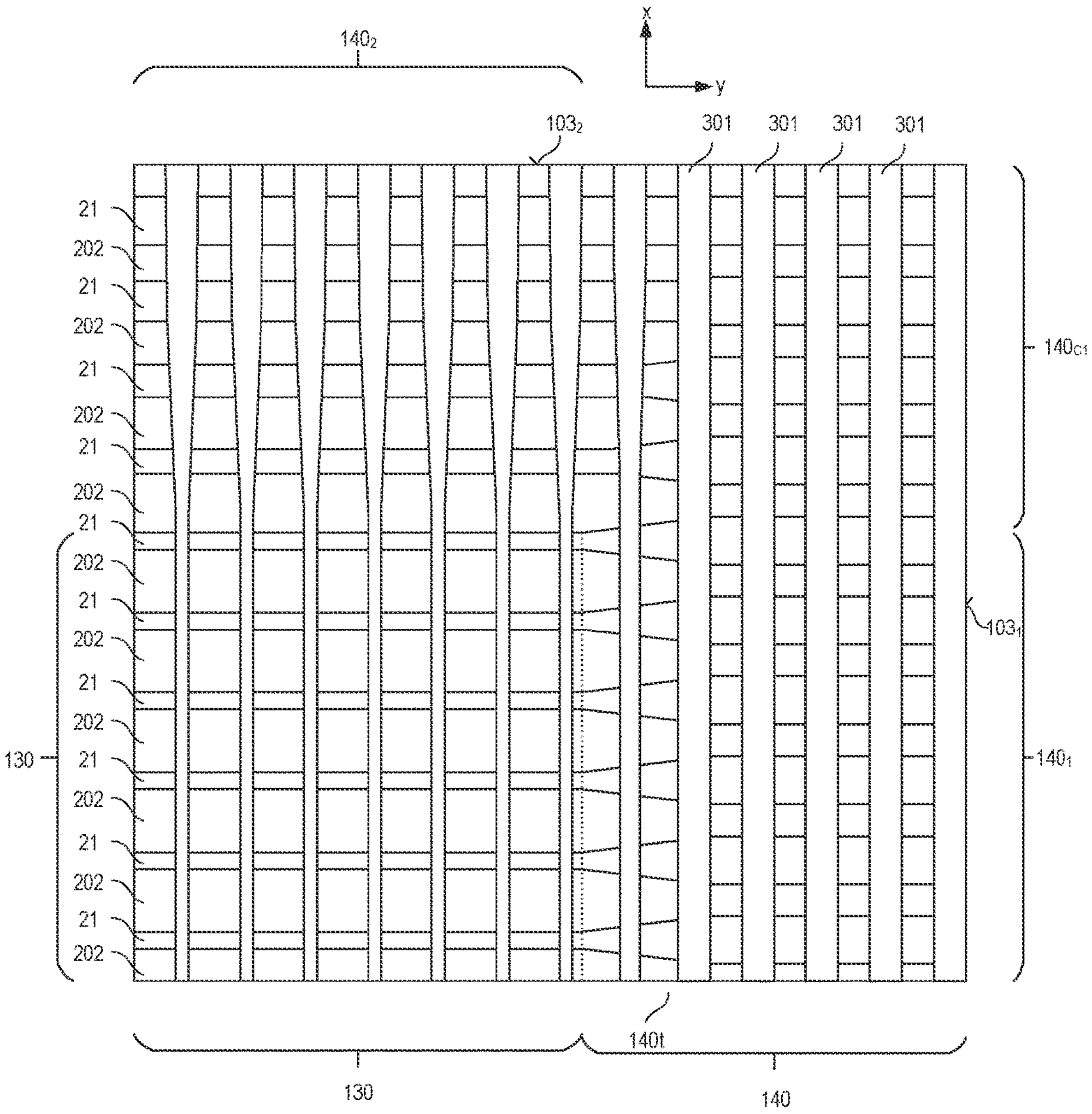
FIG. 28 illustrates a modification of the implantation mask shown in FIG. 27.
Figure 32A:
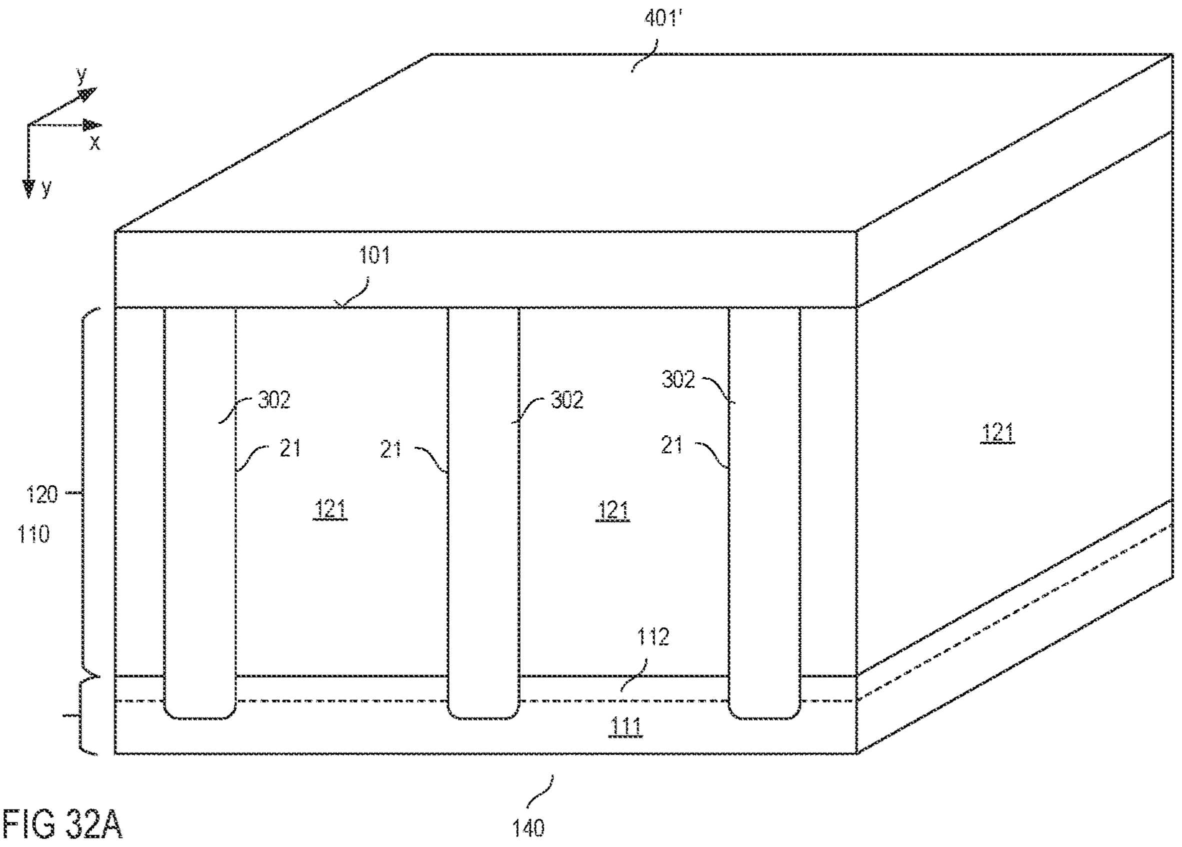
FIGS. 32A-32B illustrate a method for producing an implantation mask according to another example.
Figure 32B:
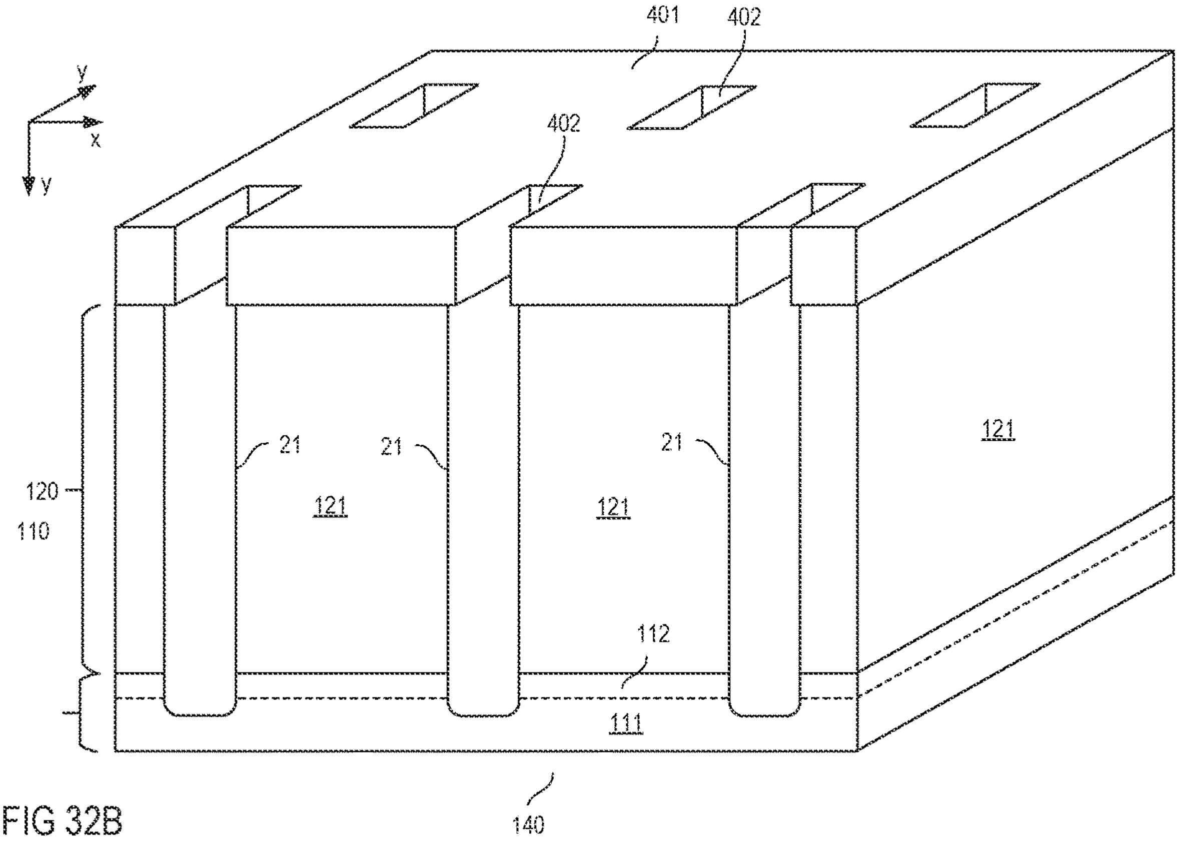

In the examples explained with reference to FIGS. 27 and 28, the implantation process uses the implantation mask 202 (or etch mask 201) on top of the mesa regions 121 and the further implantation mask 301 on top of the implantation mask 202 for covering those sections into which second type dopant atoms should not be implanted. Using two implantation masks, however, is only an example. FIGS. 32A-32B illustrate one example of a method for forming one implantation mask that covers the mesa regions 121 and trench sections.

Referring to FIG. 32A, the method includes removing the etch mask (201 in FIG. 16A), filling the trenches with the sacrificial material 302 and forming an implantation mask layer 401' on a surface formed by top surfaces of the mesa regions 121 and the sacrificial material 302. Everything explained with regard to the sacrificial material 302 shown in FIGS. 29A-29C applies to the sacrificial material according to FIG. 32A accordingly. The implantation mask layer 401' may include any one of the materials explained with regard to the implantation mask layer 401' shown in FIG. 29B. Alternatively, the implantation mask layer 401' shown in FIG. 32A may include a photoresist.

Referring to FIG. 32B, the method further includes patterning the implantation mask layer 401' to form an implantation mask 401 that covers the mesa regions 121 and sections of the trenches, and removing the sacrificial material 302. Patterning the implantation mask layer 401' may include any kind of suitable lithographic process. Removing the sacrificial layer may include any one of the processes explained herein above.

Referring to FIG. 32B, the implantation mask includes openings 402 above trench sections, wherein second type dopant atoms can be implanted via these openings 402 into the trench sidewalls to form the implanted regions 17*. It should be noted that the implantation mask 401 is not necessarily exactly aligned with the trench sidewalls, so that the implantation mask 401 may extend beyond the trench sidewalls, so that, in the first lateral direction x, the openings 402 may be narrower than the trenches 21.

In the examples explained before, the basic doping of the second semiconductor layer 120 forms the doping of the drift regions 11 in the finished device. In this case, a reduced area specific dopant dose of the first type dopant atoms in the edge region 140 may be achieved by reducing the mesa width in the edge region as compared to the mesa width in the inner region. However, referring to FIGS. 9A-9C and 10-13 it is also possible to form the drift regions 11 by implanting dopant atoms via the trench sidewalls into the mesa regions 121. In this case, the mesa regions 121 can be formed with the same width in the inner region 130 and the edge region 140. Furthermore, the same implantation mask that is used for implanting the second type dopant atoms forming the compensation regions 17 may be used for implanting the first type dopant atoms forming the drift regions 11. This implantation mask may be in accordance with any of the implantation masks explained with reference to FIGS. 27-28 and 32A-32B.

Figure 33:
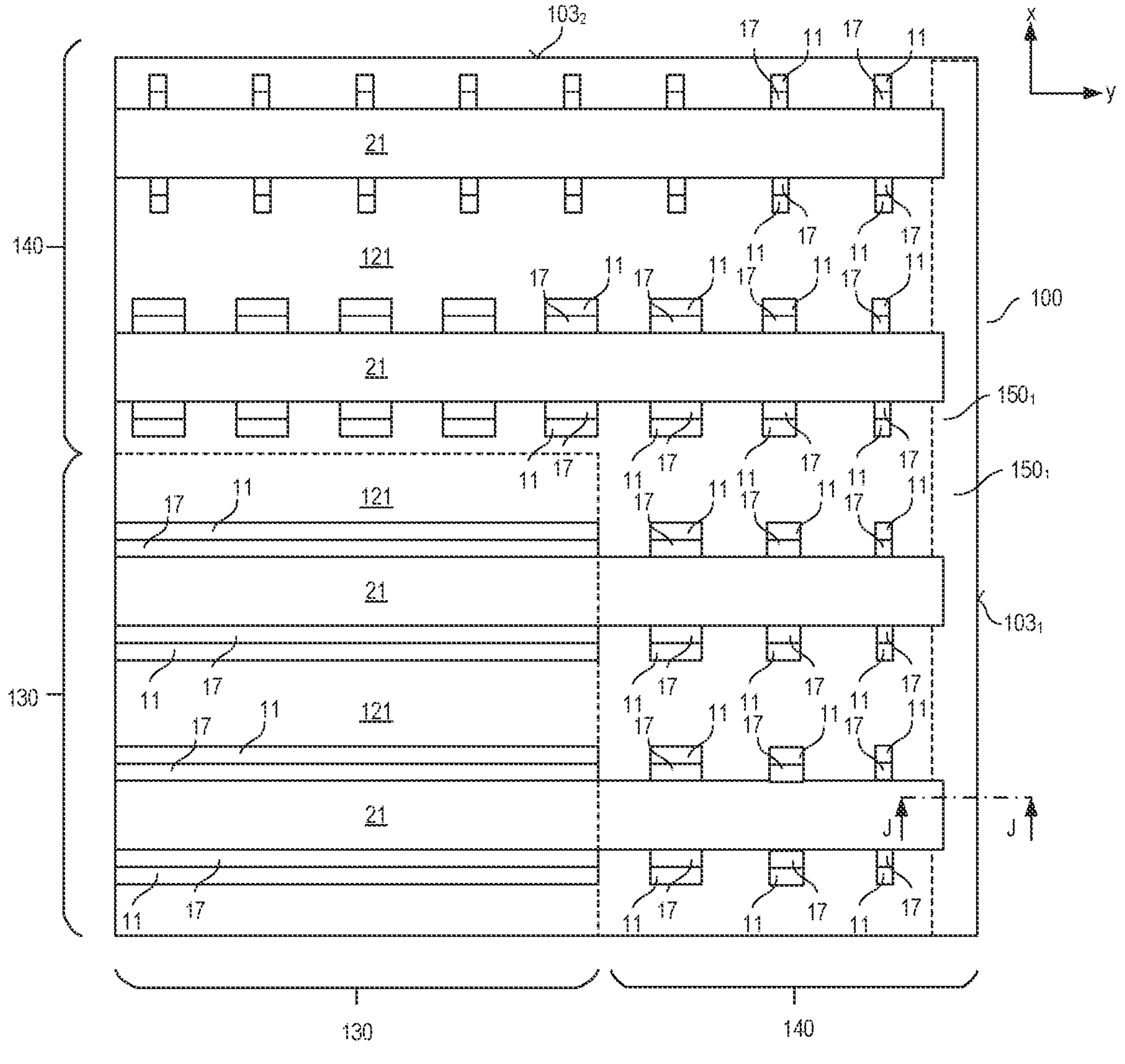
FIG. 33 shows a top view of one section of the semiconductor body after implanting dopant atoms of a first doping type and dopant atoms of a second doping type into sidewalls of the trenches.

FIG. 33 shows a top view of one section of the semiconductor body 100 after implanting the first and second type dopant atoms into the trench sidewalls and removing the implantation mask. In the example shown in FIG. 33, the drift and compensation regions 11, 17 are contiguous regions in the inner region 130 and are segmented in the edge region 140. This may be achieved by using an implantation mask of the type shown in FIG. 27 that covers sections of the trenches 21 in the edge region 140.

The implantation mask may be implemented such that the size of the trench sections covered by the implantation mask increases towards the edge surface 103. Thus, the size of the drift and compensation regions 11, 17 decreases towards the edge surface 103 and the area specific dopant dose of both the first and second type dopant atoms decreases towards the edge surface 103.

Optionally, the transistor device further includes a field-stop 150 (illustrated in dashed lines) of the first doping type that is arranged in the edge region 130 such that lateral ends of the trenches 21 are located in the field-stop. Thus, in the example shown in FIG. 33, the field-stop region 150 is an elongated region which extends perpendicular to the trenches and includes two field-stop sections, a first section $\mathbf{150}_1$ extending parallel to the first edge surface $\mathbf{103}_1$ (and illustrated in FIG. 33), and a second section extending parallel to the third edge surface (not illustrated in FIG. 31) opposite the first edge surface $\mathbf{103}_1$. In the vertical direction, the field-stop 150 may extend as deep as the trenches 21. Forming the field-stop 150 may include forming further trenches spaced apart from the lateral ends of the trenches 21 and implanting first type dopant atoms into sidewalls of the further trenches.

Referring to the above, a plurality of semiconductor bodies, which are part of a wafer, may be processed in the same way before the wafer is divided to form the individual semiconductor bodies. According to one example, the wafer is cut such that sidewalls of the further trench 160 form portions of the edge surfaces of the semiconductor body 100. This is explained with reference to FIG. 34.

Figure 34:
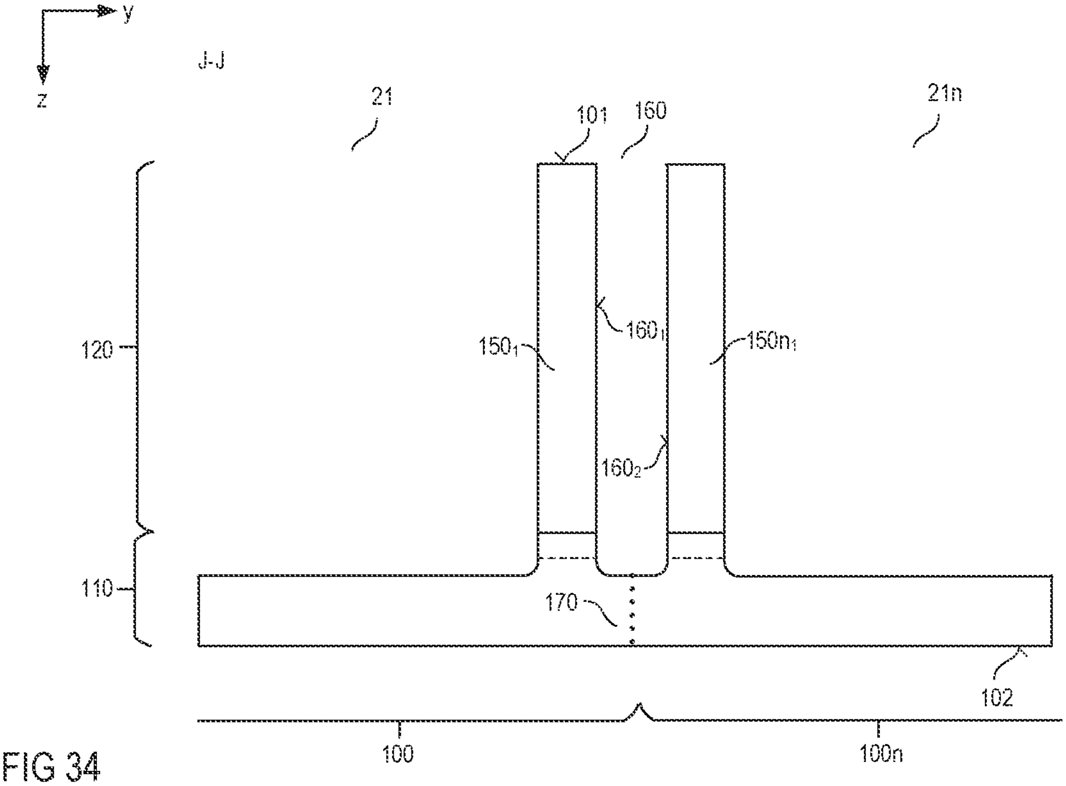
FIG. 34 shows a vertical cross sectional view of a wafer including the semiconductor body according to FIG. 33 in a section plane J-J shown in FIG. 33.

FIG. 34 shows a vertical cross sectional view of one section of the semiconductor body 100 shown in FIG. 33 in a section plane J-J illustrated in FIG. 33 and of a further semiconductor body 100*n* arranged next to the semiconductor body 100 in the wafer. (The further semiconductor body 100*n* is not illustrated in FIG. 33.) The semiconductor body 100 and the further semiconductor body 100*n* are part of a wafer. The first field stop section $\mathbf{150}_1$ of the first semiconductor body 100 may be formed by implanting first type dopant atoms into a first sidewall $\mathbf{160}_1$ of the further trench, and a corresponding field stop section $\mathbf{150}n_1$ of the further semiconductor body 100*n* may be formed by implanting first type dopant atoms into a second sidewall $\mathbf{160}_2$ opposite the first sidewall $\mathbf{160}_1$ of the further trench 160. According to one example, forming the field stop sections $\mathbf{150}_1$, $\mathbf{150}_n$ includes implanting first type dopant atoms such that a lateral doping dose in the field stop sections $\mathbf{150}_1$, $\mathbf{150}_n$ is higher than 2E13 $cm^{-2}$. The "lateral dopant dose" is the dopant dose in the lateral direction such as the second lateral direction y shown in FIG. 34.

Dividing the wafer may include cutting the wafer along a dicing line 170 (illustrated in dotted lines in FIG. 34) that extends from a bottom of the further trench 160 to the second surface 102. In this case the first trench sidewall forms portions of the first edge surface $\mathbf{103}_1$ of the semiconductor body.

The further trench 160 may be formed using the same process that forms the trenches 21. Thus, the further trench may extend as deep as the trenches 21 and may extend into the first semiconductor layer 110. The field-stop 150 may therefore extend from the first surface 101 to the first semiconductor layer 110. Due to the field-stop 150 the edge surfaces $\mathbf{103}_1$, $\mathbf{103}_2$ are free of an electric field so that leakage currents along the edge surfaces do not occur. The edge surfaces $\mathbf{103}_1$, $\mathbf{103}_2$ may result from cutting a wafer into a plurality of semiconductor bodies and may include a plurality of crystal defects. Such crystal defects, in the presence of an electric field, may result in leakage currents.

Referring to the above, the second semiconductor layer 120 may be a very lowly doped or intrinsic semiconductor layer. In this case, regions of the second semiconductor layer 120 that have the basic doping, per se, have a high voltage blocking capability, which may be higher than the voltage blocking of the combination of drift and compensation regions 11, 17 in the inner region 130. Thus, in this case, drift and compensation regions 11, 17 may entirely be omitted in the edge region 130.

Figure 35:
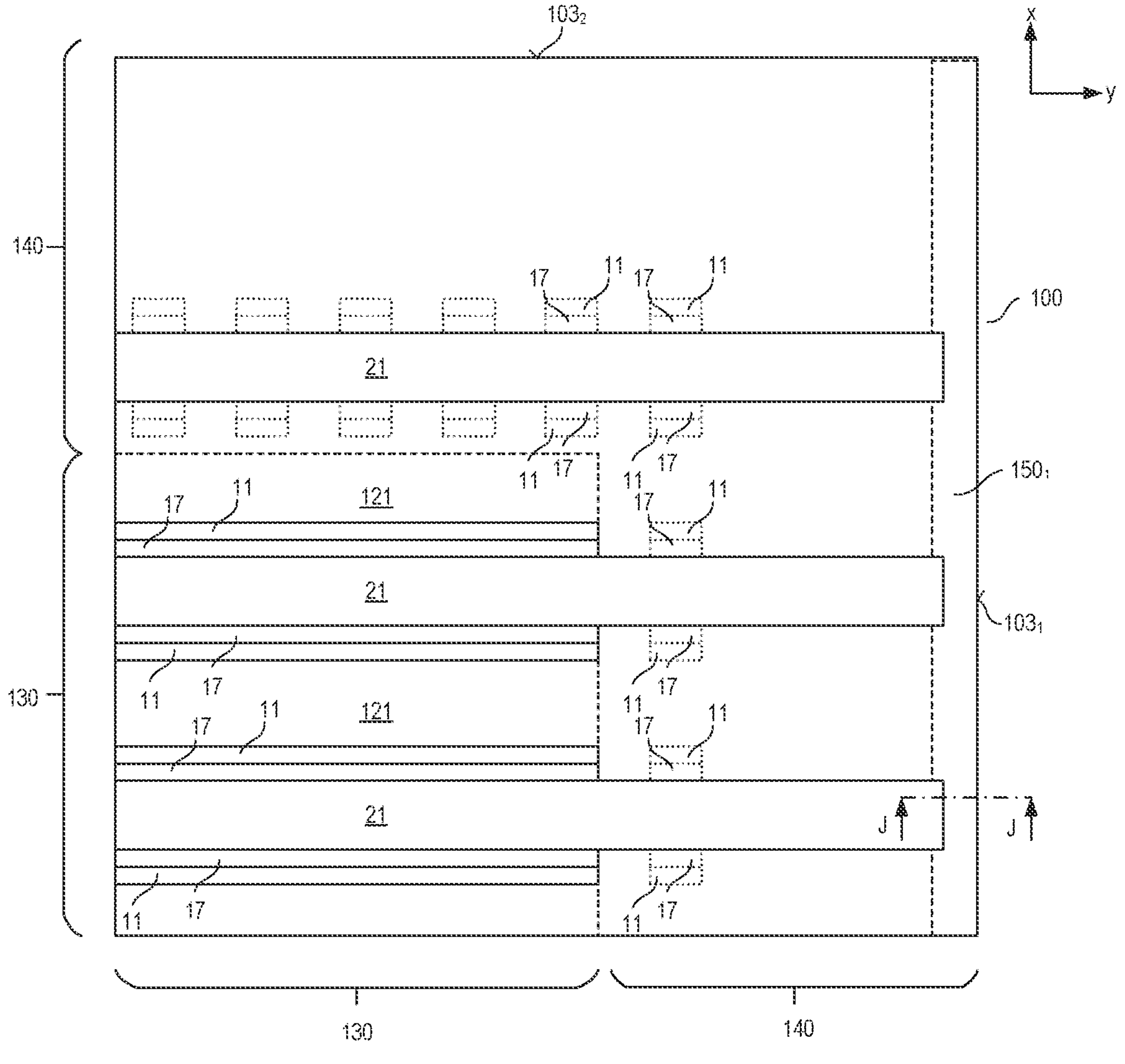
FIG. 35 shows a modification of the semiconductor body shown in FIG. 33.

FIG. 35 shows a modification of the example shown in FIG. 33, wherein drift and compensation regions 11, 17 have been omitted in the edge region. This may be achieved by covering the edge region 150 in the implantation processes that form the drift and compensation regions 11, 17 in the inner region 130.

Optionally (illustrated in dotted lines in FIG. 35) drift and compensation regions 11, 17 are formed in the edge region 140 in a section close to the inner region 130. The drift and compensation regions 11, 17 in the edge region may be spaced apart from the drift and compensation regions 11, 17 in the inner region 130 and may be spaced apart from each other.

Referring to FIG. 8D, the drift and compensation regions 11, 17 may be formed such that, in the second lateral direction y, the drift regions 11 and the compensation regions 17 are arranged alternatingly along the trench sidewalls. In the example shown in FIG. 8D, the second semiconductor layer 120 has a basic doping, wherein regions of the mesa regions that have the basic doping form the drift regions 11.

Figure 36:
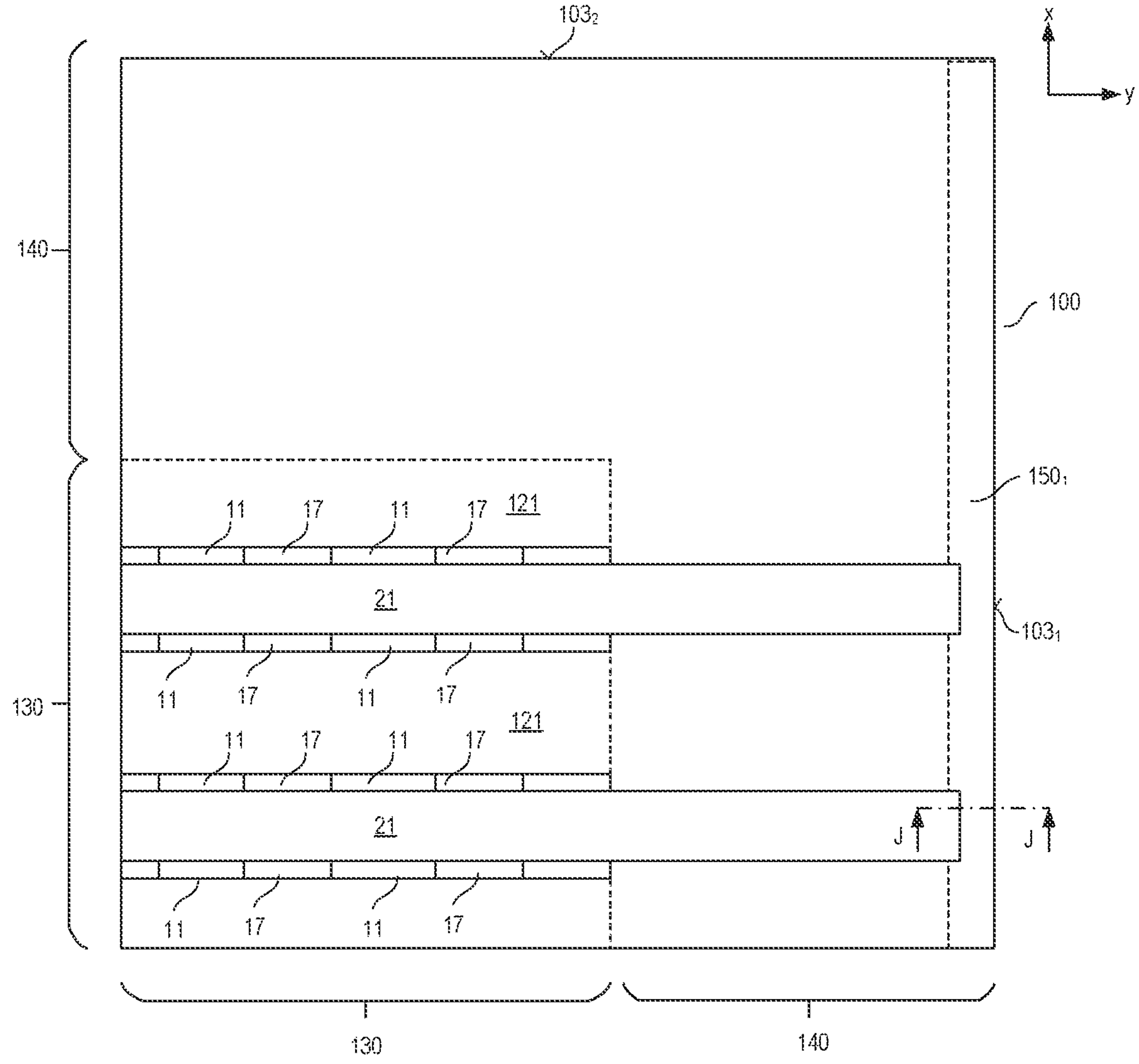
FIG. 36 shows a further modification of the semiconductor body shown in FIG. 33.

FIG. 36 shows a modification of the example shown in FIG. 8D. In the example shown in FIG. 36, both the drift regions 11 and the compensation regions 17 have been formed using an implantation process. According to one example, the compensation regions 17 are formed in a first implantation process using a first implantation mask of the type shown in FIG. 32B, and the drift regions 11 are formed in a second implantation process using a second implantation mask of the type shown in FIG. 32B.

Some of the aspects explained above are summarized in the following by way of numbered examples.

Example A1. A method, comprising: forming a trench structure with a plurality of trenches in an inner region and an edge region of a SiC semiconductor body such that the trench structure extends from a first surface of the semiconductor body through a second semiconductor layer into a first semiconductor layer and such that the trench structure, in the second semiconductor layer, into forms a plurality of mesa regions; and forming at least one transistor cell at least partially in each of the mesa regions in the inner region, wherein forming each transistor cell comprises forming at least one compensation region, wherein forming the at least one compensation region comprises implanting dopant atoms of a second doping type via sidewalls of the trenches into the mesa regions in the inner region, and wherein forming the at least one compensation region in each of the mesa regions in the inner region comprises at least partially covering the edge region with an implantation mask.

Example A2. The method according to example A1, wherein at least partially covering the edge region with an implantation mask comprises completely covering the edge region with the implantation mask.

Example A3. The method of example A1, wherein the implantation mask comprises a plurality of elongated mask sections that laterally extend in a first direction and that are spaced apart from each other in a second lateral direction, and wherein the trenches laterally extend in the second lateral direction.

Example A4. The method of example A3, wherein a width of the elongated mask sections increases towards an edge surface of the semiconductor body.

Example A5. The method of any one of examples A1 to A4, further comprising: forming a field-stop region of a first doping type complementary to the second doping type in the edge region, and forming the trenches such that lateral ends of the trenches are located in the field-stop region.

Example A6. The method of any one of examples A1 to A5, wherein forming each transistor cell further comprises: forming a drift region of a first doping type complementary to the second doping type adjacent to the compensation region.

Example A7. The method of example A6, wherein forming the drift region comprises implanting dopant atoms of the first doping type via the sidewall of a respective trench into a respective mesa region.

Example A8. The method of example A7, wherein the compensation region and the drift region of each transistor cell are formed such that they are adjacent in a direction that is perpendicular to the sidewall.

Example A9. The method of example A8, wherein the compensation region and the drift region of each transistor cell are formed such that they are adjacent in a direction corresponding to a longitudinal direction of the respective trench.

Example A10. The method of example A6, wherein the second semiconductor layer has a basic doping of the first doping type, so that the mesa regions have a basic doping of the first doping type, and wherein the drift region is formed by a basic doped section of a respective mesa region.

Example A11. The method of example A10, wherein a width of the mesa regions is narrower in the edge region than in the inner region.

Example A12. The method of example A11, wherein the width of the mesa region sections located in the edge region is between 30% and 100% of the width of the mesa sections located in the inner region.

Example A13. A semiconductor device, comprising: a SiC semiconductor body that includes a first semiconductor layer, a second semiconductor layer formed on top of the first semiconductor layer, an inner region, and an edge region surrounding the inner region; a trench structure extending from a first surface of the semiconductor body through the second semiconductor layer into the first semiconductor layer, being arranged in the inner region and the edge region, and subdividing the second semiconductor layer into a plurality of mesa regions; in the mesa regions, a plurality of drift regions having an effective doping concentration of a first doping type and a plurality of compensation regions having an effective doping concentration of a second doping type complementary to the first doping type, wherein an area specific dopant dose of first type dopant atoms in sections of the drift and compensation regions located in the edge region is lower than an area specific dopant dose of first type dopant atoms in sections of the drift and compensation regions located in the inner region, and wherein an area specific dopant dose of second type dopant atoms in sections of the drift and compensation regions located in the edge region is lower than an area specific dopant dose of second type dopant atoms in sections of the drift and compensation regions located in the inner region.

Example A14. The semiconductor device of example A13, wherein the second semiconductor layer has a basic doping of the first doping type, wherein the first type dopant atoms in the drift and compensation regions result from the basic doping of the second semiconductor layer, wherein each of the mesa regions has a width in a first lateral direction of the semiconductor body and is elongated in a second lateral direction, and wherein mesa region sections in the edge region have a smaller width than mesa region sections located in the inner region.

Example A15. The semiconductor device of example A14, wherein the width of the mesa region sections located in the edge region is between 30% and 100% of the width of the mesa sections located in the inner region.

Example A16. The semiconductor device of example A14 or A15, wherein the width of the mesa region sections located in the edge region decreases towards an edge surface of the semiconductor body.

Example A17. The semiconductor device of example A13, wherein each of the mesa regions has a width in a first lateral direction of the semiconductor body and is elongated in a second lateral direction, wherein the drift regions include implanted dopant atoms of the first doping type, wherein the drift regions are arranged in the mesa regions and are elongated in the second lateral direction, and wherein each mesa region, in the edge region, includes a plurality of drift regions that are spaced apart from each other in the second lateral direction.

Example A18. The semiconductor device of any one of examples A13 to A17, wherein the compensation regions include implanted dopant atoms of the second doping type, wherein the compensation regions are arranged in the mesa regions and are elongated in the second lateral direction, and wherein each mesa region, in the edge region, includes a plurality of compensation regions that are spaced apart from each other in the second lateral direction.

Example A19. The semiconductor device of any one of examples A13 to A18, further comprising: a drain region arranged in the first semiconductor layer; and a plurality of transistor cells arranged in the inner region, each coupled between the drain region and a source node, and each comprising at least one of the drift regions and at least one of the compensation regions.

Example A20. The semiconductor device of any one of examples A13 to A19, wherein the trench structure comprises at least one cavity.

Example B1—A transistor device, comprising: a SiC semiconductor body that includes a first semiconductor layer and a second semiconductor layer formed on top of the first semiconductor layer; a trench structure extending from a first surface of the semiconductor body through the second semiconductor layer into the first semiconductor layer; a drain region arranged in the first semiconductor layer; and a plurality of transistor cells each coupled between the drain region and a source node, wherein the trench structure subdivides the second semiconductor layer into a plurality of mesa regions, wherein the trench structure comprises at least one cavity, and wherein at least one of the plurality of transistor cells is at least partially integrated in each of the mesa regions.

Example B2—The transistor device of example B1, wherein a pressure in the at least one cavity is less than 1% of atmospheric pressure.

Example B3—The transistor device according to example B1 or B2, wherein the at least one cavity, in a vertical direction of the semiconductor body extends into the first semiconductor layer.

Example B4—The transistor device of any one of examples B1 to B33, wherein the trench structure further comprises a dielectric layer arranged between the at least one cavity and the semiconductor body.

Example B5—The transistor device of any one of examples B1 to B4, wherein the trench structure comprises a plurality of parallel first trenches, wherein each of the mesa regions is arranged between a respective pair of neighboring ones of the parallel trenches.

Example B6—The transistor device of example B5, wherein the trench structure further comprises at least one second trench crossing the first trenches.

Example B7—The transistor device of any one of examples B1 to B6, wherein each of the transistor cells comprises: a drift region and a source region of a first doping type; a body region of a second doping type arranged between the drift region and the source region; and a gate electrode arranged adjacent to the body region and dielectrically insulated from the body region by a gate dielectric.

Example B8—The transistor device of any one of examples 1 to 7, wherein each of the transistor cells further comprises: at least one compensation region of the second doping type arranged adjacent to the drift region.

Example B9—The transistor device of example 8, wherein each of the transistor cells comprises a plurality of compensation regions that each adjoin a respective one of the trenches and are spaced apart from each other in a longitudinal direction of the respective one of the trenches.

Example B10—The transistor device of example 8 or 9, wherein the at least one compensation region is an implanted semiconductor region.

Example B11—The transistor device of any one of examples 7 to 10, wherein the second semiconductor layer has a basic doping concentration, and wherein the drift region is formed by a section of the mesa region that has the basic doping concentration.

Example B12—The transistor device of any one of examples 7 to 10, wherein the drift region is an implanted semiconductor region.

Example B13—The transistor device of any one of examples 7 to 12, wherein the gate electrode is arranged in a trench that is spaced apart from the trench structure.

Example B14—The transistor device of any one of examples 7 to 12, wherein the gate electrode is arranged in a gate trench, and wherein the gate trench is formed by a section of a trench of the trench structure and is arranged above a plug that closes the cavity.

Example B15—The transistor device of any one of examples 7 to 11, wherein the gate electrode is arranged in a gate trench, wherein the gate trench adjoins a trench of the trench structure and is wider than the trench of the trench structure.

Example B16—A method, comprising: forming a trench structure in a SiC semiconductor body such that that the trench structure extends from a first surface of the semiconductor body through a second semiconductor layer into a first semiconductor layer and such that the trench structure subdivides the second semiconductor layer into a plurality of mesa regions; and forming at least one transistor cell at least partially in each of the mesa regions, wherein the trench structure comprises at least one cavity.

Example B17—The method of example 16, wherein a pressure in the at least one cavity is less than 1% of atmospheric pressure.

Example B18—The method of example 16 or 17, wherein forming the trench structure comprises: forming a plurality of trenches that each extend from the first surface of the semiconductor body through the second semiconductor layer into the first semiconductor layer; forming a cavity and a plug closing the cavity in each of the trenches.

Example B19—The method of example 18, wherein forming the cavity and the plug comprises, in each of the trenches: forming a sacrificial plug that partially fills the respective trench; forming a first plug on top of the sacrificial plug; forming an opening in the first plug; removing the sacrificial plug in an etching process via the opening to form the cavity; and closing the opening in the first plug to form the plug closing the cavity.

Example B20—The method of example 19, wherein closing the opening includes a deposition process in an atmosphere in which the pressure is less than 1% of atmospheric pressure.

Example B21—The method of example 20, wherein the process is an HDP process.

Example B22—The method of example 19, further comprising: forming an opening in the plug, and closing the opening using a deposition process in an atmosphere in which the pressure is less than 1% of atmospheric pressure.

Example B23—The method of any one of examples B16 to B22, wherein forming each of the transistor cells comprises: forming a source region of a first doping type; forming a body region of a second doping type; and forming a gate electrode arranged adjacent to the body region and dielectrically insulated from the body region by a gate dielectric.

Example B24—The method of example B23, wherein forming the gate electrode comprises forming the gate electrode in a gate trench that is spaced apart from the trench structure.

Example B25—The method of example B23, wherein forming the gate electrode comprises forming the gate electrode in a gate trench that is formed by a section of a trench of the trench structure and is arranged above the plug that closes the cavity.

Example B26—The method of example B23, wherein forming the gate electrode comprises forming the gate electrode in a gate trench, wherein the gate trench adjoins a trench of the trench structure and is wider than the trench of the trench structure.

Example B27—The method of any one of examples B16 to B26, wherein forming each transistor cell comprises forming at least one compensation region, and wherein forming the at least one compensation region comprises implanting dopant atoms via sidewalls of the trenches into the mesa regions.

Example B28—The method of examples B26 and B27, wherein forming the gate trench comprises partially removing the at least one compensation region.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:

forming a trench structure with a plurality of trenches in an inner region and an edge region of a SiC semiconductor body such that the trench structure extends from a first surface of the SiC semiconductor body through a second semiconductor layer into a first semiconductor layer and such that the trench structure, in the second semiconductor layer, forms a plurality of mesa regions; and forming at least one transistor cell at least partially in each of the plurality of mesa regions in the inner region, wherein forming each transistor cell comprises forming at least one compensation region, wherein forming the at least one compensation region comprises implanting dopant atoms of a doping type via sidewalls of the plurality of trenches into each of the plurality of mesa regions in the inner region, wherein forming the at least one compensation region in each of the plurality of mesa regions in the inner region comprises at least partially covering the edge region with an implantation mask, wherein the implantation mask comprises a plurality of elongated mask sections that laterally extend in a first lateral direction and that are spaced apart from each other in a second lateral direction, and wherein the plurality of trenches laterally extend in the second lateral direction.

2. The method of claim 1, wherein at least partially covering the edge region with the implantation mask comprises completely covering the edge region with the implantation mask.

3. The method of claim 1, wherein a width of each of the plurality of elongated mask sections increases towards an edge surface of the SiC semiconductor body.

4. The method of claim 1, wherein the doping type is a second doping type, and wherein the method further comprises:

forming a field-stop region of a first doping type complementary to the second doping type in the edge region; and forming the plurality of trenches such that lateral ends of the plurality of trenches are located in the field-stop region.

5. The method of claim 1, wherein the doping type is a second doping type, and wherein forming each transistor cell further comprises:

forming a drift region of a first doping type complementary to the second doping type adjacent to the compensation region.

6. The method of claim 5, wherein forming the drift region comprises:

implanting dopant atoms of the first doping type via the sidewall of a respective trench into a respective mesa region.

7. The method of claim 6, wherein the compensation region and the drift region of each transistor cell are formed such that they are adjacent in a direction that is perpendicular to the sidewall.

8. The method of claim 5, wherein the second semiconductor layer has a basic doping of the first doping type so that the plurality of mesa regions have a basic doping of the first doping type, and wherein the drift region is formed by a basic doped section of a respective mesa region.

9. The method of claim 8, wherein a width of each of the plurality mesa regions is narrower in the edge region than in the inner region.

10. A method, comprising:

forming a trench structure with a plurality of trenches in an inner region and an edge region of a SiC semiconductor body such that the trench structure extends from a first surface of the SiC semiconductor body through a second semiconductor layer into a first semiconductor layer and such that the trench structure, in the second semiconductor layer, forms a plurality of mesa regions; and forming at least one transistor cell at least partially in each of the plurality of mesa regions in the inner region, wherein forming each transistor cell comprises forming at least one compensation region, wherein forming the at least one compensation region comprises implanting dopant atoms of a second doping type via sidewalls of the plurality of trenches into each of the plurality of mesa regions in the inner region, wherein forming the at least one compensation region in each of the plurality of mesa regions in the inner region comprises at least partially covering the edge region with an implantation mask, and wherein the method further comprises:

forming a field-stop region of a first doping type complementary to the second doping type in the edge region; and forming the plurality of trenches such that lateral ends of the plurality of trenches are located in the field-stop region.

11. The method of claim 10, wherein at least partially covering the edge region with the implantation mask comprises completely covering the edge region with the implantation mask.

12. The method of claim 10, wherein the implantation mask comprises a plurality of elongated mask sections that laterally extend in a first lateral direction and that are spaced apart from each other in a second lateral direction, and wherein the plurality of trenches laterally extend in the second lateral direction.

13. The method of claim 12, wherein a width of each of the plurality of elongated mask sections increases towards an edge surface of the SiC semiconductor body.

14. The method of claim 10, wherein the doping type is a second doping type, and wherein forming each transistor cell further comprises:

forming a drift region of a first doping type complementary to the second doping type adjacent to the compensation region.

15. The method of claim 14, wherein forming the drift region comprises:

implanting dopant atoms of the first doping type via the sidewall of a respective trench into a respective mesa region.

16. The method of claim 15, wherein the compensation region and the drift region of each transistor cell are formed such that they are adjacent in a direction that is perpendicular to the sidewall.

17. The method of claim 14, wherein the second semiconductor layer has a basic doping of the first doping type so that the plurality of mesa regions have a basic doping of the first doping type, and wherein the drift region is formed by a basic doped section of a respective mesa region.

18. A method, comprising:

forming a trench structure with a plurality of trenches in an inner region and an edge region of a SiC semiconductor body such that the trench structure extends from a first surface of the SiC semiconductor body through a second semiconductor layer into a first semiconductor layer and such that the trench structure, in the second semiconductor layer, forms a plurality of mesa regions; and forming at least one transistor cell at least partially in each of the plurality of mesa regions in the inner region, wherein forming each transistor cell comprises forming at least one compensation region, wherein forming the at least one compensation region comprises implanting dopant atoms of a second doping type via sidewalls of the plurality of trenches into each of the plurality of mesa regions in the inner region, wherein forming the at least one compensation region in each of the plurality of mesa regions in the inner region comprises at least partially covering the edge region with an implantation mask, wherein forming each transistor cell further comprises forming a drift region of a first doping type complementary to the second doping type adjacent to the compensation region, wherein the second semiconductor layer has a basic doping of the first doping type so that the plurality of mesa regions have a basic doping of the first doping type, wherein the drift region is formed by a basic doped section of a respective mesa region, and wherein a width of each of the plurality mesa regions is narrower in the edge region than in the inner region.

19. The method of claim 18, wherein forming the drift region comprises:

implanting dopant atoms of the first doping type via the sidewall of a respective trench into a respective mesa region.

20. The method of claim 19, wherein the compensation region and the drift region of each transistor cell are formed such that they are adjacent in a direction that is perpendicular to the sidewall.

* * * * *